US012787252B2

(12) United States Patent
Kim et al.

(10) Patent No.: US 12,787,252 B2
(45) Date of Patent: Nov. 3, 2026

(54) SEMICONDUCTOR MEMORY DEVICE AND METHOD FOR MANUFACTURING THE SAME

(71) Applicant: Samsung Electronics Co., Ltd., Suwon-si (KR)

(72) Inventors: Jooncheol Kim, Suwon-si (KR); Kang-Uk Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 418 days.

(21) Appl. No.: 18/483,693

(22) Filed: Oct. 10, 2023

(65) Prior Publication Data

US 2024/0224501 A1 Jul. 4, 2024

(30) Foreign Application Priority Data

Dec. 30, 2022 (KR) ........................ 10-2022-0190483

(51) Int. Cl.
*H10B 12/00* (2023.01)

(52) U.S. Cl.
CPC ......... *H10B 12/315* (2023.02); *H10B 12/482* (2023.02)

(58) Field of Classification Search
CPC .. H10B 12/315; H10B 12/482; H10B 12/053; H10B 12/09; H10B 12/34; H10B 12/312; H10B 12/03; H10B 12/485; H10B 12/05; H10B 12/50
See application file for complete search history.

(56) References Cited

U.S. PATENT DOCUMENTS

| | | | | |
|---|---|---|---|---|
| 6,335,248 | B1 | 1/2002 | Mandelman et al. | |
| 7,375,392 | B1 | 5/2008 | Chen et al. | |
| 10,355,075 | B2 | 7/2019 | Sasaki | |
| 10,714,478 | B2 * | 7/2020 | Ryu | H10B 12/053 |
| 10,879,248 | B2 | 12/2020 | Choi et al. | |
| 11,245,019 | B2 | 2/2022 | Ahn et al. | |
| 2022/0077152 | A1 | 3/2022 | Lim et al. | |

(Continued)

FOREIGN PATENT DOCUMENTS

| | | | |
|---|---|---|---|
| KR | 20140062601 | A | 5/2014 |
| KR | 20160049870 | A | 5/2016 |
| TW | 200511482 | A | 3/2005 |

(Continued)

*Primary Examiner* — Karen Kusumakar
(74) *Attorney, Agent, or Firm* — Harness, Dickey & Pierce, P.L.C.

(57) ABSTRACT

A semiconductor memory device including a substrate including a cell area and a peripheral area around the cell area, a cell area isolation film in the substrate and defining the cell area, a bit-line structure in the cell area, a peripheral gate structure in the peripheral area of the substrate, the peripheral gate structure including a peripheral gate conductive film, a peripheral spacer on a sidewall of the peripheral gate structure, an etch stop film on the peripheral spacer and spaced apart from the peripheral gate structure, a first peripheral insulating film around the peripheral gate structure on the substrate, and a peripheral interlayer insulating film covering the peripheral gate structure, the first peripheral insulating film, and the peripheral spacer, the peripheral interlayer insulating film including a material different from a material of the first peripheral insulating film, may be provided.

15 Claims, 44 Drawing Sheets

(56) References Cited

U.S. PATENT DOCUMENTS

| | | | | |
|---|---|---|---|---|
| 2022/0093610 | A1 | 3/2022 | Kim et al. | |
| 2022/0139927 | A1* | 5/2022 | Chang .................. | H10B 12/315 257/296 |

FOREIGN PATENT DOCUMENTS

| | | | |
|---|---|---|---|
| TW | 200744160 | A | 12/2007 |
| TW | 202234630 | A | 9/2022 |

* cited by examiner

SEMICONDUCTOR MEMORY DEVICE AND METHOD FOR MANUFACTURING THE SAME

CROSS-REFERENCE TO RELATED APPLICATION

This application claims priority from Korean Patent Application No. 10-2022-0190483 filed on Dec. 30, 2022 in the Korean Intellectual Property Office, and all the benefits accruing therefrom under 35 U.S.C. 119, the contents of which in its entirety are herein incorporated by reference.

BACKGROUND

Field

The present disclosure relates to semiconductor memory devices and methods for manufacturing the same.

Description of Related Art

As a semiconductor device becomes increasingly highly integrated, individual circuit patterns are becoming smaller in order to implement a larger number of semiconductor devices in the same area. That is, as integration of the semiconductor device increases, a design rule on each of components of the semiconductor device decreases.

In a highly scaled semiconductor device, a process of forming a plurality of wiring lines and a plurality of buried contacts (BC) interposed therebetween is becoming increasingly complicated and sophisticated.

SUMMARY

Some example embodiments of the present disclosure provides semiconductor memory devices having improved reliability and performance.

Some example embodiments of the present disclosure provides methods for manufacturing a semiconductor memory device having improved reliability and performance.

Purposes according to the present disclosure are not limited to the above-mentioned purposes. Other purposes and advantages according to the present disclosure that are not mentioned may be understood based on following descriptions, and may be more clearly understood based on the disclosed example embodiments according to the present disclosure. Further, it will be easily understood that the purposes and advantages according to the present disclosure may be realized using means shown in the claims or combinations thereof.

According to an example embodiment of the present disclosure, a semiconductor memory device includes a substrate including a cell area and a peripheral area around the cell area, a cell area isolation film in the substrate and defining the cell area, a bit-line structure in the cell area, a peripheral gate structure and in the peripheral area of the substrate, the peripheral gate structure including a peripheral gate conductive film, a peripheral spacer on a sidewall of the peripheral gate structure, an etch stop film on the peripheral spacer and spaced apart from the peripheral gate structure, a first peripheral insulating film around the peripheral gate structure on the substrate, and a peripheral interlayer insulating film covering the peripheral gate structure, the first peripheral insulating film, and the peripheral spacer, the peripheral interlayer insulating film including a material different from a material of the first peripheral insulating film, wherein the etch stop film does not overlap the peripheral gate structure in a direction perpendicular to an upper surface of the substrate, wherein the peripheral spacer is between the etch stop film and the peripheral gate structure, and an upper surface of the peripheral spacer is in contact with the peripheral interlayer insulating film.

According to an example embodiment of the present disclosure, a semiconductor memory device includes a substrate including a cell area and a peripheral area around the cell area, a cell area isolation film in the substrate and defining the cell area, a bit-line structure in the cell area, the bit-line structure including a cell conductive line and a cell line capping film on the cell conductive line, a cell interlayer insulating film on the bit-line structure, a peripheral gate structure in the peripheral area of the substrate and, the peripheral gate structure including a peripheral gate conductive film and a peripheral capping film on the peripheral gate conductive film, a peripheral spacer on a sidewall of the peripheral gate structure, an etch stop film on the peripheral spacer and spaced apart from the peripheral gate structure, a first peripheral insulating film on the substrate and around the peripheral gate structure and a peripheral interlayer insulating film covering the peripheral gate structure, the first peripheral insulating film, and the peripheral spacer, the peripheral interlayer insulating film including a material different from a material of the first peripheral insulating film, the etch stop film does not overlap the peripheral gate structure in a direction perpendicular to an upper surface of the substrate, wherein the peripheral spacer is between the etch stop film and the peripheral gate structure, wherein each of an upper surface of the peripheral spacer and an upper surface of the peripheral capping film is in contact with the peripheral interlayer insulating film.

According to an example embodiment of the present disclosure, a semiconductor memory device includes a substrate including a cell area and a peripheral area around the cell area, a cell area isolation film in the substrate and defining the cell area, a bit-line structure in the cell area of the substrate, the bit-line structure including a cell conductive line extending in one direction and a cell line capping film on the cell conductive line, a cell gate electrode in the cell area of the substrate and intersecting the cell conductive line, information storage in the cell area of the substrate, a peripheral gate structure in the peripheral area of the substrate, the peripheral gate structure including a peripheral gate conductive film, a peripheral spacer on a sidewall of the peripheral gate structure, an etch stop film on the peripheral spacer and spaced apart from the peripheral gate structure, a first peripheral insulating film on the substrate and around the peripheral gate structure, and a peripheral interlayer insulating covering the peripheral gate structure, the first peripheral insulating film, and the peripheral spacer, the peripheral interlayer insulating film including a material different from a material of the first peripheral insulating film, the etch stop film does not overlap the peripheral gate structure in a direction perpendicular to an upper surface of the substrate, the peripheral spacer is between the etch stop film and the peripheral gate structure, and each of an upper surface of the peripheral spacer and an upper surface of the peripheral gate structure is in contact with the peripheral interlayer insulating film.

According to an example embodiment of the present disclosure, a method for manufacturing a semiconductor memory device includes providing a substrate including a cell area and a peripheral area around the cell area, forming a cell gate electrode in the cell area of the substrate, forming a cell conductive film structure in the cell area of the substrate such that the cell conductive film structure includes a pre-cell conductive film and a pre-cell line capping film disposed on the pre-cell conductive film, forming a peripheral gate structure in the peripheral area of the substrate such that the peripheral gate structure includes a peripheral gate conductive film and a peripheral capping film on the peripheral gate conductive film, forming a peripheral spacer on a sidewall of the peripheral gate structure, forming an etch stop film on the substrate so as to extend along a profile of the cell conductive film structure, a profile of the peripheral gate structure, and a profile of the peripheral spacer, forming a first pre-peripheral insulating film to cover the etch stop film, removing the first pre-peripheral insulating film to form a first peripheral insulating film, and at a same time, removing a portion of the etch stop film and a portion of the peripheral spacer on the peripheral area to expose each of an upper surface of the etch stop film and an upper surface of the peripheral spacer on the peripheral area, forming a pre-interlayer insulating film to cover the peripheral gate structure and the pre-cell line capping film and patterning a portion of the pre-interlayer insulating film on the cell area, and the cell conductive film structure to form a bit-line structure on the substrate, wherein a height between an upper surface of the substrate and an upper surface of the peripheral spacer is equal to a height between the upper surface of the substrate and an upper surface of the peripheral capping film.

BRIEF DESCRIPTION OF DRAWINGS

The above and other aspects and features of the present disclosure will become more apparent by describing in detail some example embodiments thereof with reference to the attached drawings, in which.

DETAILED DESCRIPTION

While the term “same,” “equal” or “identical” is used in description of example embodiments, it should be understood that some imprecisions may exist. Thus, when one element is referred to as being the same as another element, it should be understood that an element or a value is the same as another element within a desired manufacturing or operational tolerance range (e.g., +10%).

When the terms “about” or “substantially” are used in this specification in connection with a numerical value, it is intended that the associated numerical value includes a manufacturing or operational tolerance (e.g., +10%) around the stated numerical value. Moreover, when the words “about” and “substantially” are used in connection with geometric shapes, it is intended that precision of the geometric shape is not required but that latitude for the shape is within the scope of the disclosure. Further, regardless of whether numerical values or shapes are modified as “about” or “substantially,” it will be understood that these values and shapes should be construed as including a manufacturing or operational tolerance (e.g., +10%) around the stated numerical values or shapes.

As used herein, expressions such as “at least one of,” when preceding a list of elements, modify the entire list of elements and do not modify the individual elements of the list. Thus, for example, both “at least one of A, B, or C” and “at least one of A, B, and C” mean either A, B, C or any combination thereof. Likewise, A and/or B means A, B, or A and B.

Figure 1:
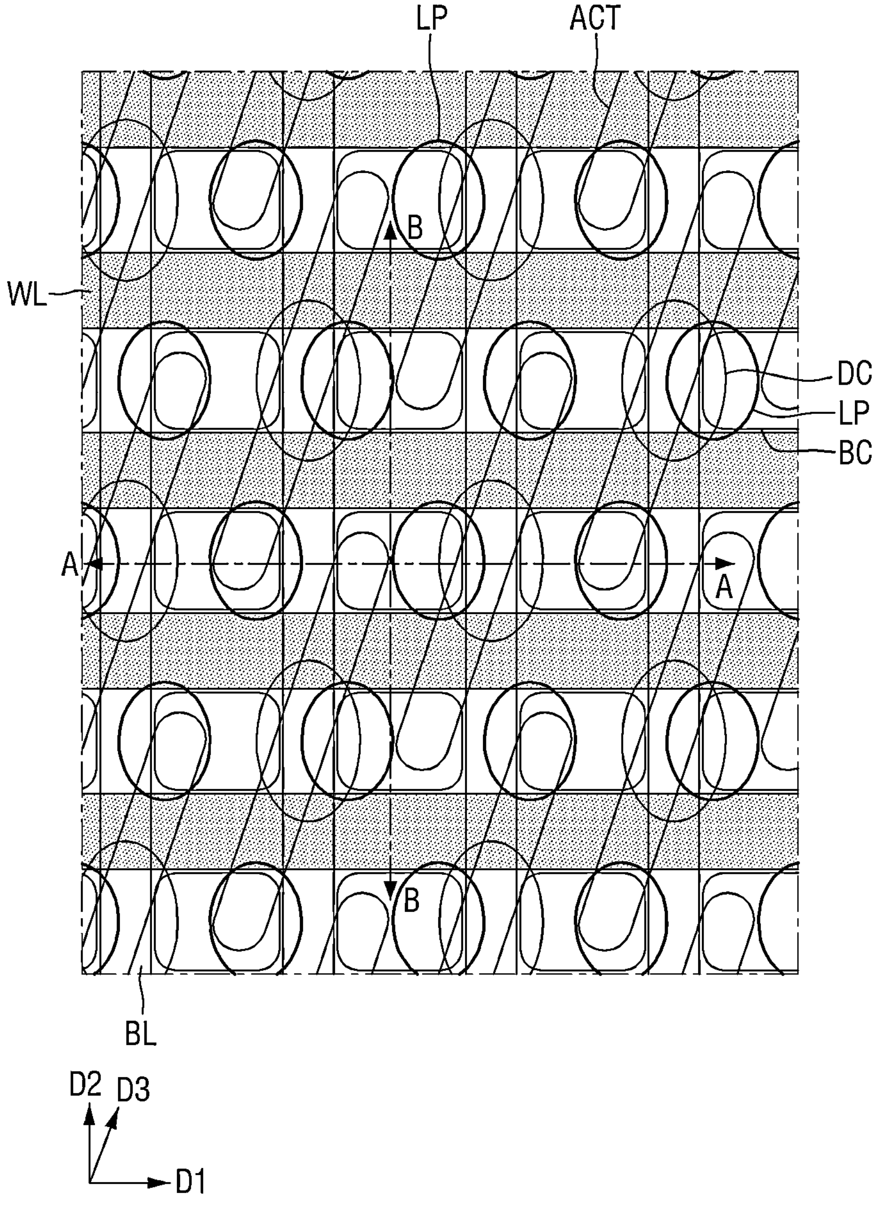
FIG. 1 is a schematic layout showing a cell area of a semiconductor memory device according to an example embodiment.
Figure 2:
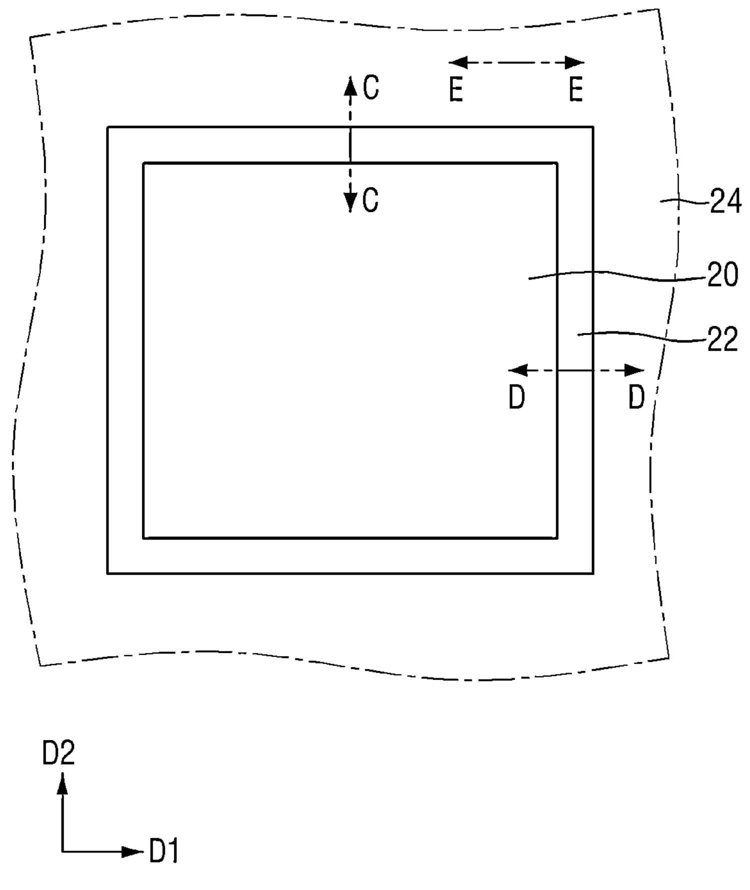
FIG. 2 is a schematic layout of a semiconductor memory device including the cell area of FIG. 1.
Figure 3:
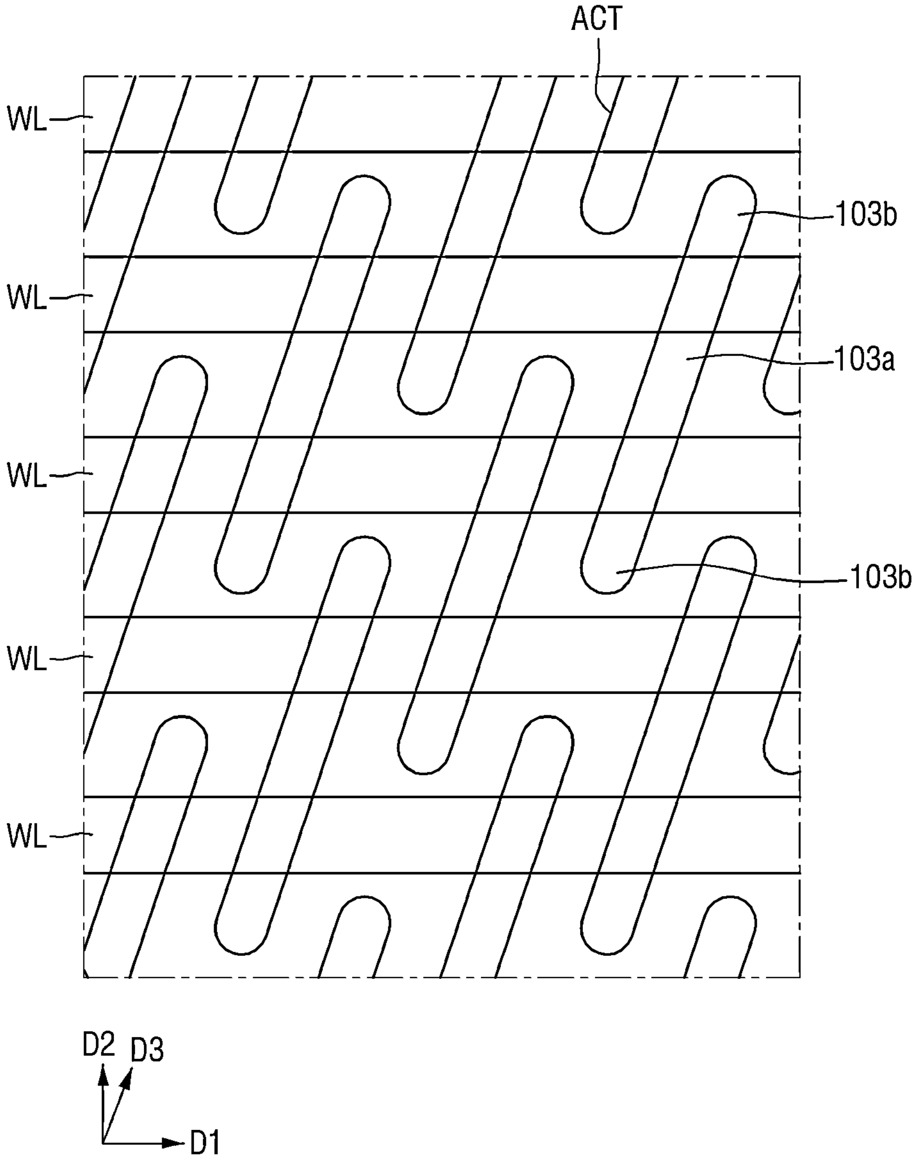
FIG. 3 is a layout showing only a word-line and an active area of FIG. 1.
Figure 4:
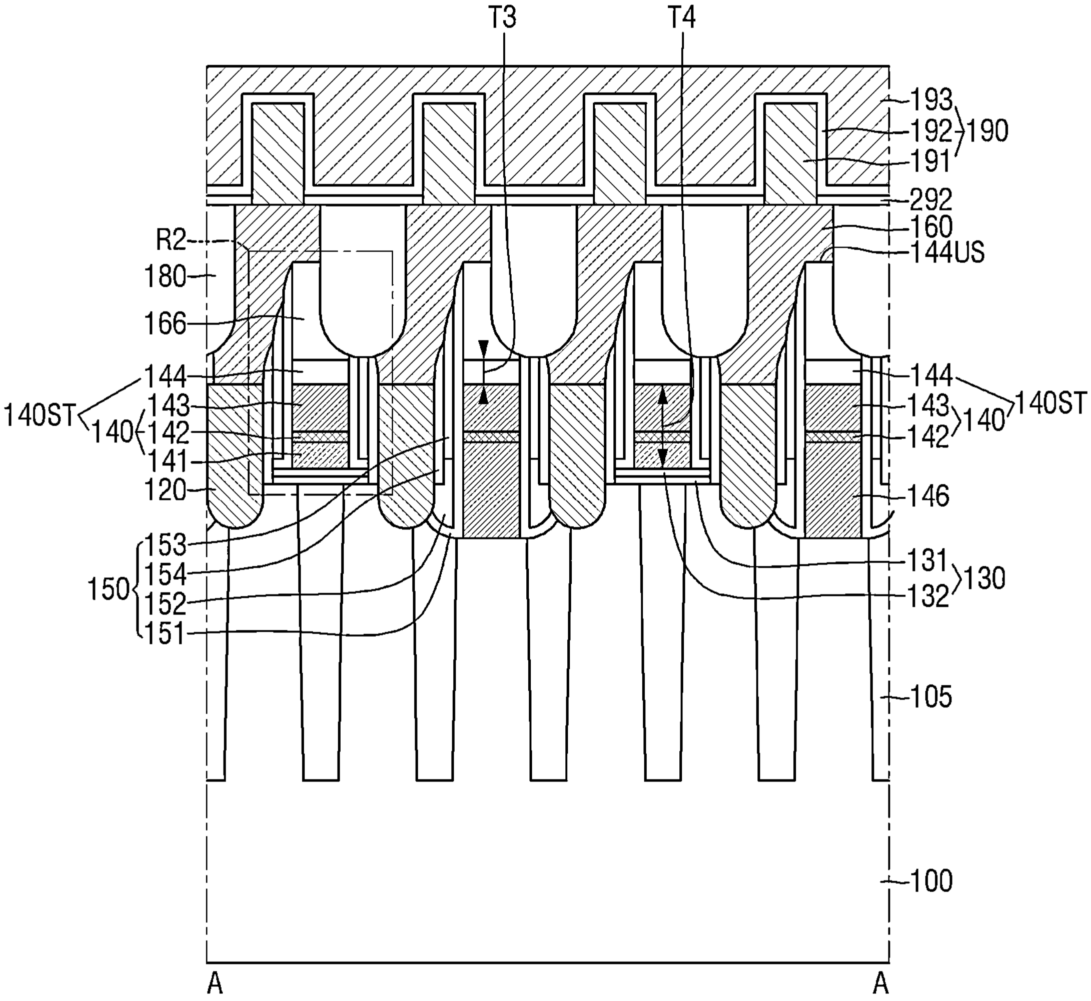
FIG. 4 and FIG. 5 are cross-sectional views taken along A-A and B-B of FIG. 1, respectively.
Figure 5:
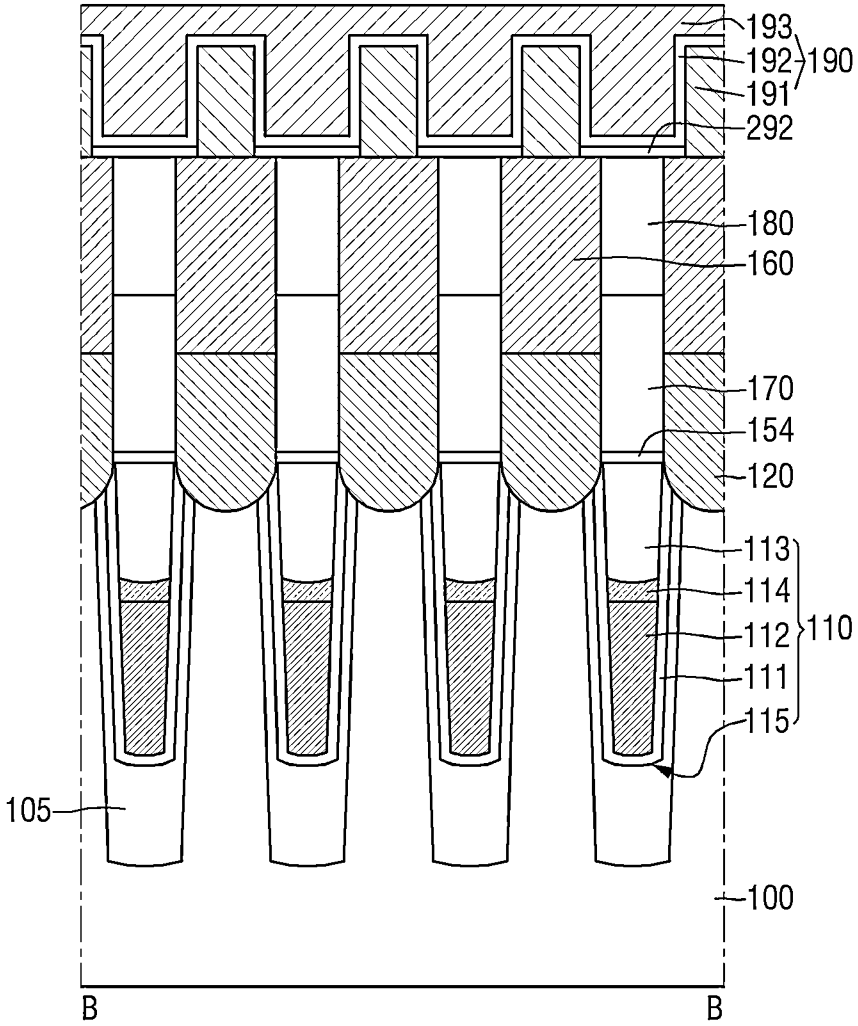
Figure 6:
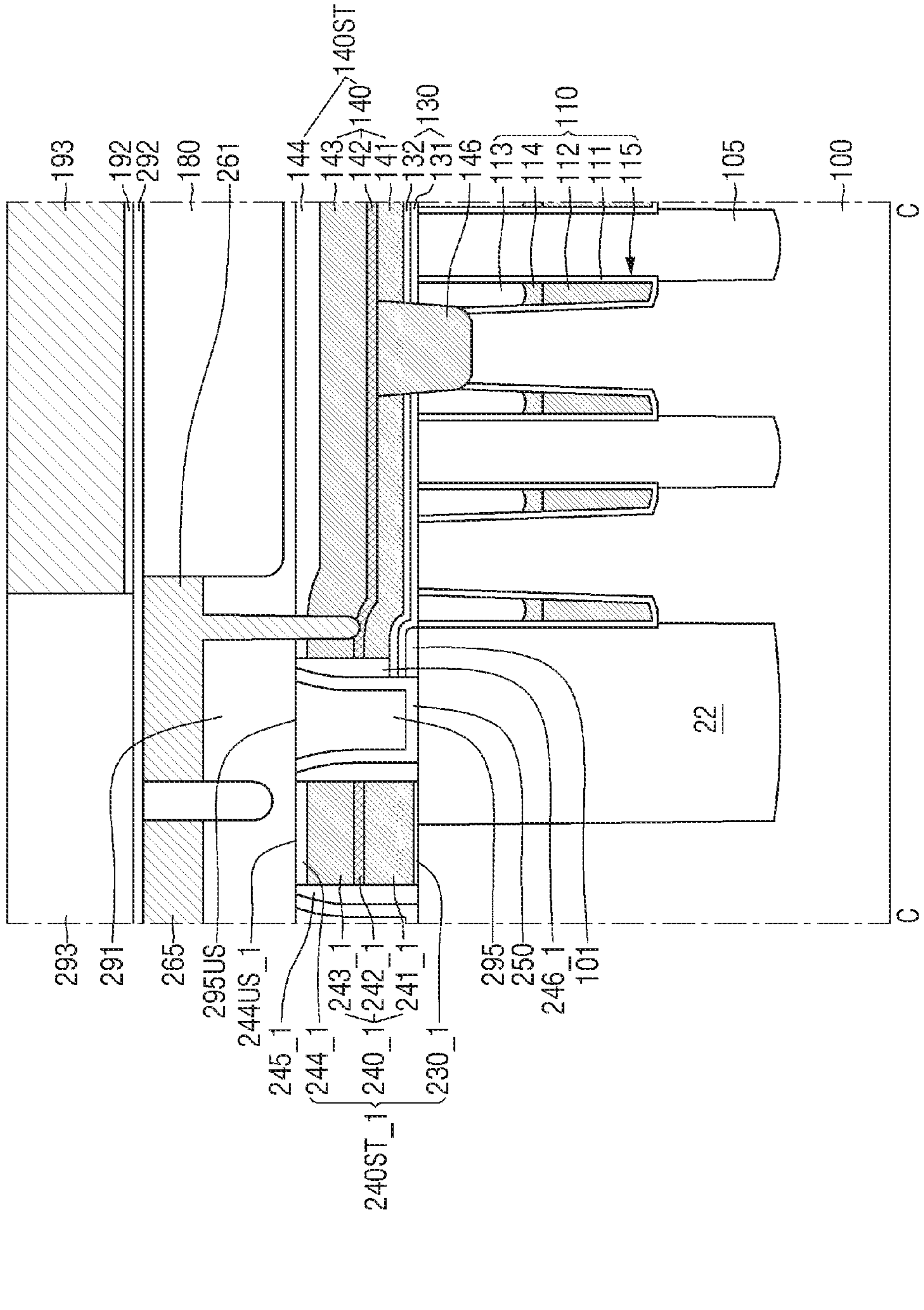
FIG. 6 and FIG. 7 are cross-sectional views taken along C-C and D-D of FIG. 2, respectively.
Figure 7:
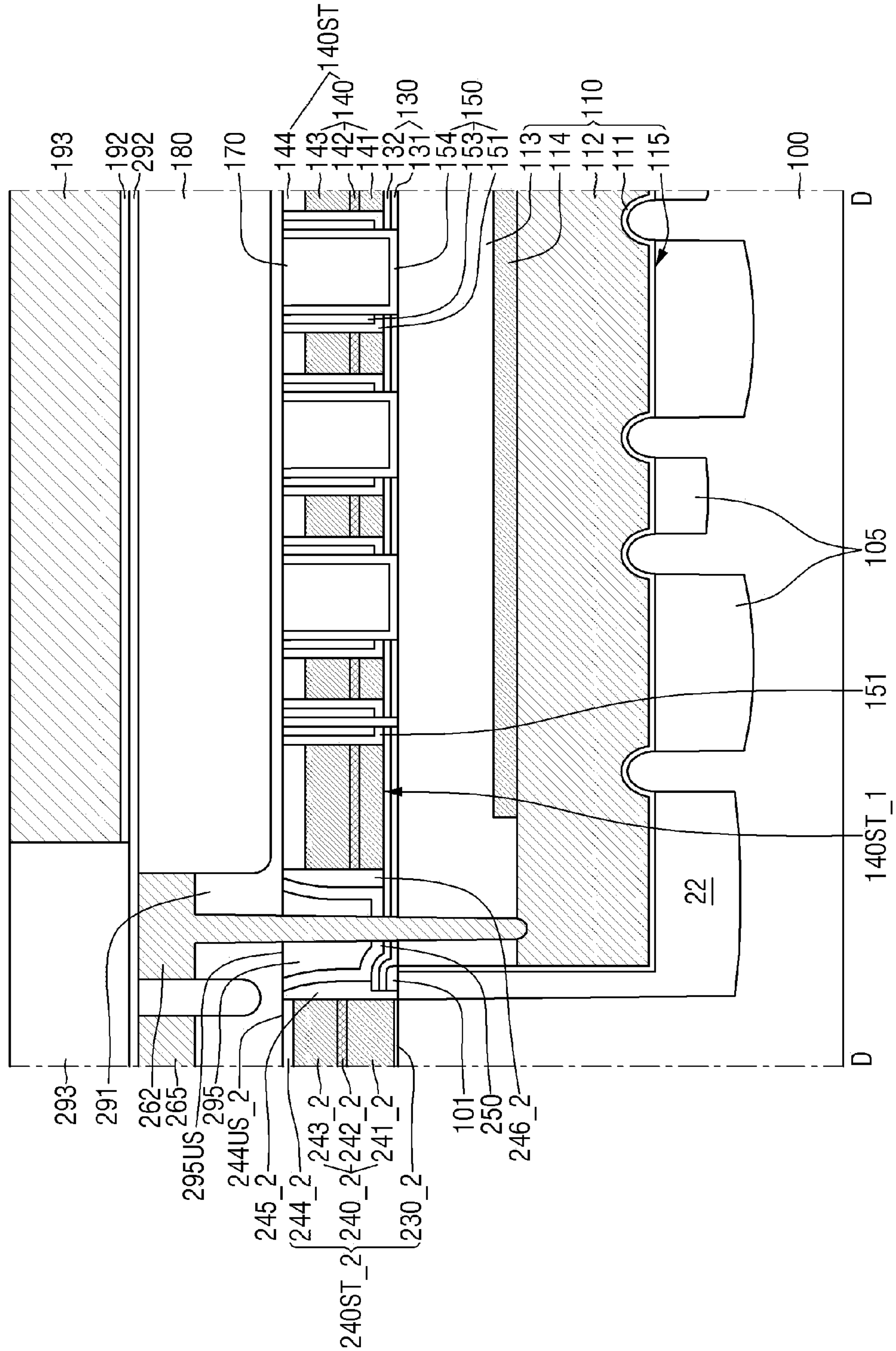
Figure 8:
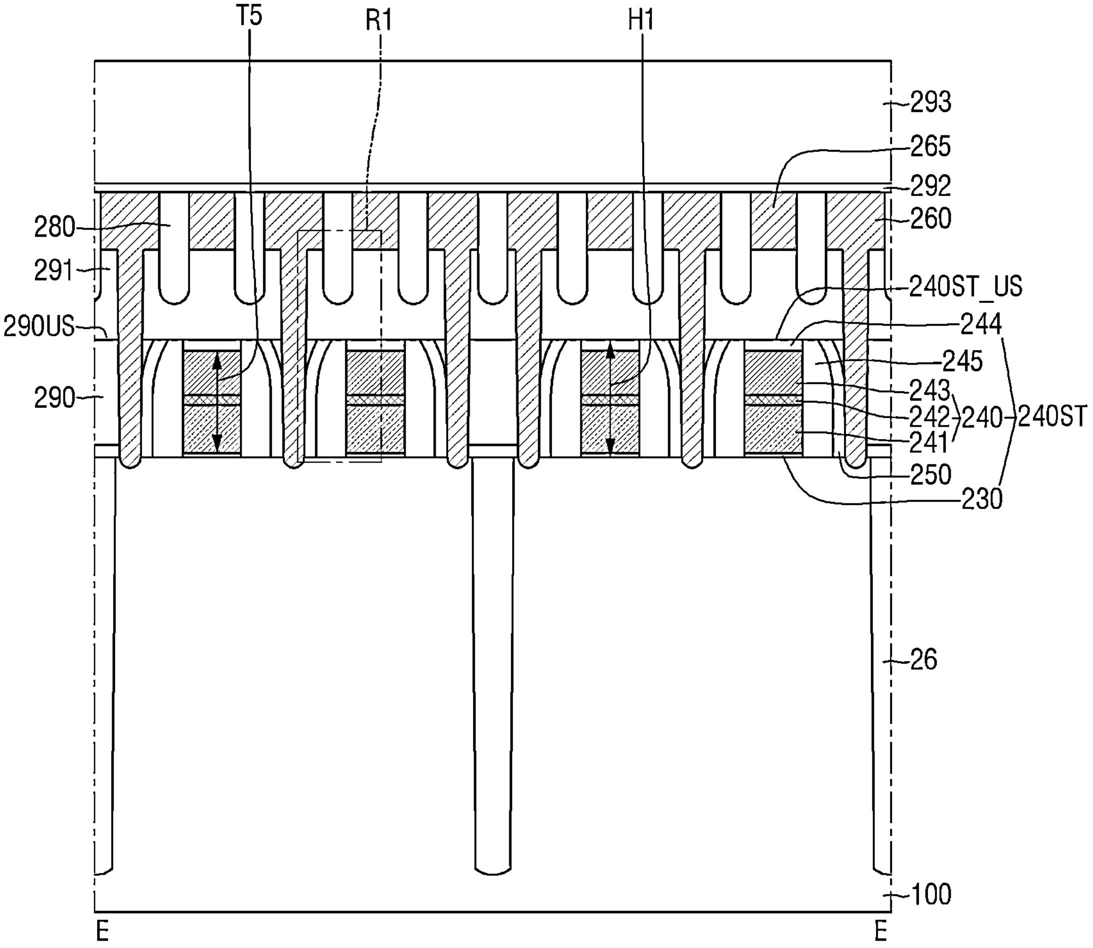
FIG. 8 is a cross-sectional view taken along E-E in FIG. 2.
Figure 9:
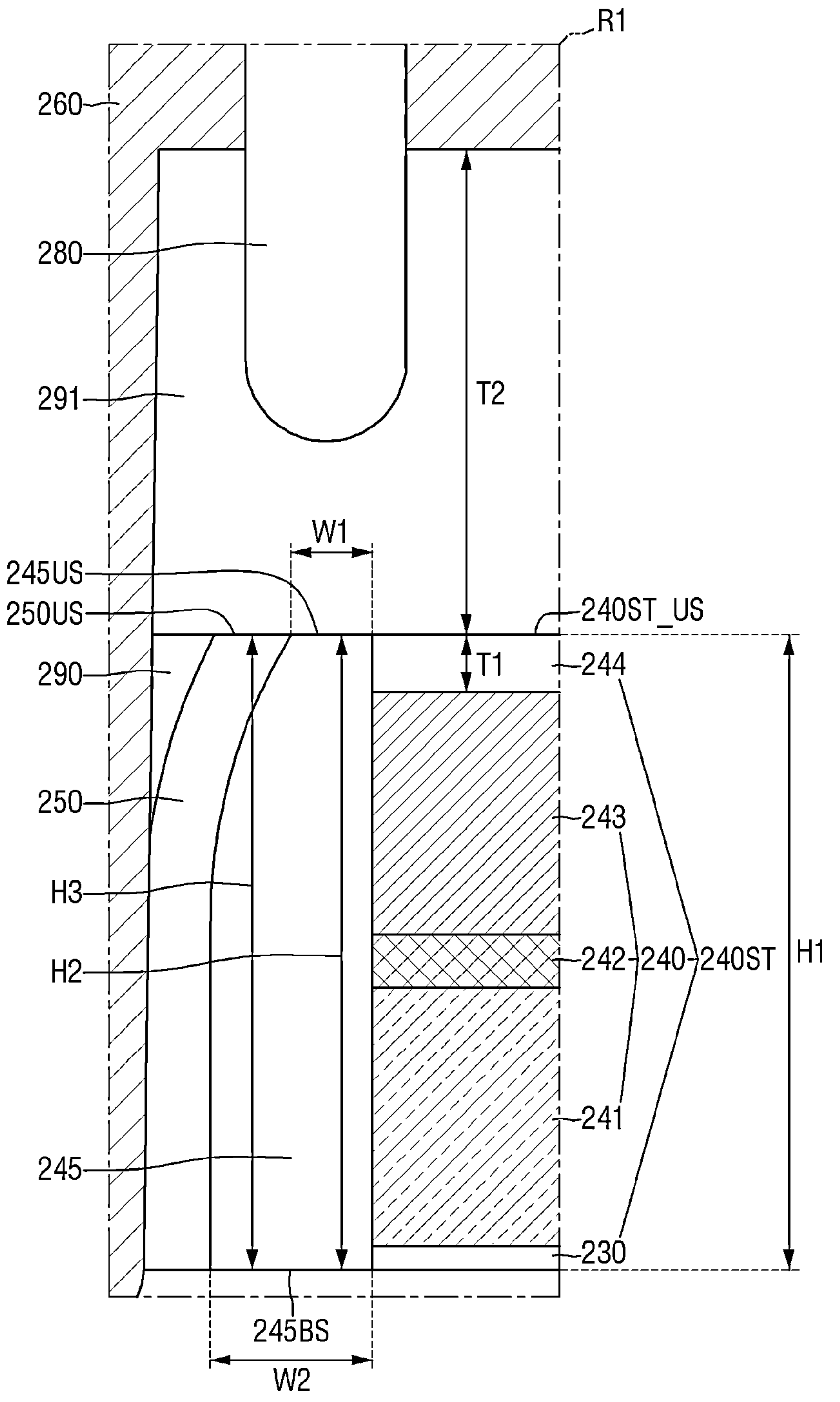
FIG. 9 is an enlarged view to illustrate a R1 area of FIG. 8

FIG. 1 is a schematic layout showing a cell area of a semiconductor memory device according to an example embodiment. FIG. 2 is a schematic layout of a semiconductor memory device including the cell area of FIG. 1. FIG. 3 is a layout showing only a word-line and an active area of FIG. 1. FIG. 4 and FIG. 5 are cross-sectional views taken along A-A and B-B of FIG. 1, respectively. FIG. 6 and FIG. 7 are cross-sectional views taken along C-C and D-D of FIG. 2, respectively. FIG. 8 is a cross-sectional view taken along E-E in FIG. 2. FIG. 9 is an enlarged view to illustrate a R1 area of FIG. 8.

For reference, FIG. 6 may be a cross-sectional view taken along a bit-line BL of FIG. 1 in a cell area isolation film 22. FIG. 7 may be a cross-sectional view taken along a word-line WL of FIG. 1 in the cell area isolation film 22. FIG. 8 may be an illustrative cross-sectional view of a transistor formation area of a peripheral area.

In the drawings, a DRAM (dynamic random access memory) is shown as an example of a semiconductor device. However, the present disclosure is not limited thereto.

Referring to FIG. 1 to FIG. 3, the semiconductor device according to an example embodiment may include a cell area 20, the cell area isolation film 22, and a peripheral area 24.

The cell area isolation film 22 may be disposed around the cell area 20. The cell area isolation film 22 may isolate the cell area 20 and the peripheral area 24 from each other. The peripheral area 24 may be defined around the cell area 20.

The cell area 20 may include a plurality of cell active areas ACT. The cell active area ACT may be defined by a cell element isolation film (105 of FIG. 4) formed in a substrate (100 of FIG. 4). As a design rule of a semiconductor device decreases, the cell active area ACT may extend in a bar shape of a diagonal line or an oblique line. For example, the cell active area ACT may extend in a third direction D3.

A plurality of gate electrodes may extend in a first direction D1 and across the cell active area ACT. The plurality of gate electrodes may extend in a parallel manner to each other. The plurality of gate electrodes may be, for example, a plurality of word-lines WL. The word-line WL may be arranged so as to be spaced from each other at an equal spacing. A width of the word-line WL or the spacing between the word-lines WL may be determined based on the design rule.

Two word-lines WL extending in the first direction D1 may divide each cell active area ACT into 3 portions. The cell active area ACT may include a storage connection area 103*b* and a bit-line connection area 103*a*. The bit-line connection area 103*a* may be located in a middle portion of the cell active area ACT, and the storage connection area 103*b* may be located at an end of the cell active area ACT.

A plurality of bit-lines BL extending in a second direction D2 and orthogonal to the word-line WL may be disposed on the word-line WL. The plurality of bit-lines BL may extend in a parallel manner to each other. The bit-lines BL may be arranged so as to be spaced from each other at an equal spacing. A width of the bit-line BL or the spacing between the bit-lines BL may be determined based on the design rule.

The semiconductor device according to some example embodiments may include various contact arrays formed on the cell active area ACT. The various contact arrangements may include, for example, a direct contact (DC), a buried contact (BC), and a landing pad (LP).

The direct contact DC may mean a contact electrically connecting the cell active area ACT to the bit-line BL. The buried contact BC may mean a contact that connects the cell active area ACT to a lower electrode (191 of FIG. 4) of a capacitor. Due to a layout structure, a contact area between the buried contact BC and the cell active area ACT may be small. Accordingly, in order to increase the contact area between the buried contact BC and the cell active area ACT and a contact area between the buried contact BC and the lower electrode (191 of FIG. 4) of the capacitor, a conductive landing pad LP may be introduced.

The landing pad LP may be disposed between the cell active area ACT and the buried contact BC, or may be disposed between the buried contact BC and the lower electrode (191 of FIG. 4) of the capacitor. In the semiconductor device according to some example embodiments, the landing pad LP may be disposed between the buried contact BC and the lower electrode of the capacitor. The contact area may increase due to the introduction of the landing pad LP, such that a contact resistance between the cell active area ACT and the lower electrode of the capacitor may be reduced.

The direct contact DC may be connected to the bit-line connection area 103*a*. The buried contact BC may be connected to the storage connection area 103*b*. As the buried contact BC is disposed at each of both opposing ends of the cell active area ACT, the landing pad LP may be disposed adjacent to each of both opposing ends of the cell active area ACT so as to partially overlap the buried contact BC. In other words, the buried contact BC may overlap a portion of each of the cell active area ACT and the cell element isolation film (105 of FIG. 4) disposed between adjacent word-lines WL and between adjacent bit-lines BL.

The word-line WL may be formed as a structure buried in the substrate 100. The word-line WL may extend across a portion of the cell active area ACT disposed between the direct contacts DC or the buried contacts BC. As shown, two word-lines WL may intersect one cell active area ACT. As the cell active area ACT extends along the third direction D3, the word-line WL may define an angle smaller than 90 degrees relative to the cell active area ACT.

The direct contacts DC may be arranged symmetrically. The buried contacts BC may be arranged symmetrically. Thus, the direct contacts DC may be arranged in a straight line along each of the first direction D1 and the second direction D2. The buried contacts BC may be arranged in a straight line along each of the first direction D1 and the second direction D2. In one example, unlike the direct contact DC and the buried contact BC, the landing pads LP may be arranged in a zigzag pattern along the second direction D2 in which the bit-line BL extends. Further, the landing pads LP may respectively overlap the same side faces of the bit-lines BL arranged in the first direction D1 in which the word-line WL extends. For example, the landing pads LP of a first line may overlap a left side (one side) of a corresponding bit-lines BL, while the landing pads LP of a second line may overlap a right side (the other side) of the corresponding bit-lines BL.

Referring to FIG. 1 to FIG. 9, the semiconductor device according to an example embodiment may include a plurality of cell gate structures 110, a plurality of bit-line structures 140ST, a cell interlayer insulating film 166, a plurality of storage contacts 120, information storage 190, a peripheral gate structure 240ST, a second etch stop film 250, and a first peripheral insulating film 290.

The substrate 100 may include the cell area 20, the cell area isolation film 22, and the peripheral area 24. The substrate 100 may be a silicon substrate or an SOI (silicon-on-insulator) substrate. In some example embodiments, the substrate 100 may include, but is not limited to, silicon germanium, SGOI (silicon germanium on insulator), indium antimonide, a lead telluride compound, indium arsenide, indium phosphide, gallium arsenide, or gallium antimonide.

The plurality of cell gate structures 110, the plurality of bit-line structures 140ST, the cell interlayer insulating film 166, the plurality of storage contacts 120, and the information storage 190 may be disposed in the cell area 20. The peripheral gate structure 240ST may be disposed in the peripheral area 24.

The cell element isolation film 105 may be formed in the substrate 100 and in the cell area 20. The cell element isolation film 105 may have an STI (shallow trench isolation) structure having excellent element isolation ability. The cell element isolation film 105 may define the cell active area ACT in the cell area 20. As shown in FIG. 1, the cell active area ACT defined by the cell element isolation film 105 may have an elongate island shape including a short side and a long side. The cell active area ACT may extend in the diagonal shape so as to define an angle smaller than 90 degrees with respect to the word-line WL formed in the cell element isolation film 105. Further, the cell active area ACT may extend in the diagonal shape so as to define an angle smaller than 90 degrees with respect to the bit-line BL formed on the cell element isolation film 105.

The cell area isolation film 22 may be embodied as a cell boundary isolation film having an STI structure. The cell area 20 may be defined by the cell area isolation film 22.

Each of the cell element isolation film 105 and the cell area isolation film 22 may include, for example, at least one of a silicon oxide film, a silicon nitride film, or a silicon oxynitride film. However, example embodiments of the present disclosure are not limited thereto. In FIG. 4 to FIG. 8, each of the cell element isolation film 105 and the cell area isolation film 22 is illustrated as being embodied as one insulating film. However, this is intended only for convenience of illustration, and example embodiments of the present disclosure are not limited thereto. Depending on a width of each of the cell element isolation film 105 and the cell area isolation film 22, each of the cell element isolation film 105 and the cell area isolation film 22 may be formed as one insulating film, or may be formed as a stack of a plurality of insulating films.

In FIG. 6 and FIG. 7, it is illustrated that an upper surface of the cell element isolation film 105, an upper surface of the substrate 100, and a upper surface of the cell area isolation film 22 are coplanar with each other. However, this is intended only for convenience of illustration, and example embodiments of the present disclosure are not limited thereto.

The cell gate structure 110 may be formed in the substrate 100 and the cell element isolation film 105. The cell gate structure 110 may extend across the cell element isolation film 105 and the cell active area ACT defined by the cell element isolation film 105. The cell gate structure 110 may be formed in a cell gate trench 115 formed in the substrate 100 and the cell element isolation film 105, and may include a cell gate insulating film 111, a cell gate electrode 112, a cell gate capping pattern 113, and a cell gate capping conductive film 114. In this regard, the cell gate electrode 112 may correspond to the word-line WL. Unlike what is illustrated, the cell gate structure 110 may not include the cell gate capping conductive film 113.

The cell gate insulating film 111 may extend along a sidewall and a bottom surface of the cell gate trench 115. The cell gate insulating film 111 may extend along a profile of at least a portion of the cell gate trench 115. The cell gate insulating film 111 may include, for example, at least one of silicon oxide, silicon nitride, silicon oxynitride, or a high dielectric constant material having a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof. However, example embodiments of the present disclosure are not limited thereto.

The cell gate electrode 112 may be formed on the cell gate insulating film 111. The cell gate electrode 112 may fill a portion of the cell gate trench 115. The cell gate capping conductive film 114 may extend along an upper surface of the cell gate electrode 112. In FIG. 7, it is illustrated that the cell gate capping conductive film 114 does not cover a portion of the upper surface of the cell gate electrode 112. However, example embodiments of the present disclosure are not limited thereto.

The cell gate electrode 112 may include at least one of a metal, a metal alloy, a conductive metal nitride, a conductive metal carbonitride, a conductive metal carbide, a metal silicide, a doped semiconductor material, a conductive metal oxynitride, or a conductive metal oxide. The cell gate electrode 112 may include, for example, at least one of TiN, TaC, TaN, TiSiN, TaSiN, TaTiN, TiAiN, TaAiN, WN, Ru, TiAl, TiAiC-N, TiAiC, TiC, TaCN, W, Al, Cu, Co, Ti, Ta, Ni, Pt, Ni-Pt, Nb, NbN, NbC, Mo, MON, MoC, WC, Rh, Pd, Ir, Ag, Au, Zn, V, RuTiN, TiSi, TaSi, NiSi, CoSi, $IrO_x$, $RuO_x$, or combinations thereof. However, example embodiments of the present disclosure is not limited thereto. The cell gate capping conductive film 114 may include, for example, polysilicon or polysilicon germanium. However, example embodiments of the present disclosure are not limited thereto.

The cell gate capping pattern 113 may be disposed on the cell gate electrode 112 and the cell gate capping conductive film 114. The cell gate capping pattern 113 may fill a portion of the cell gate trench 115 remaining after the cell gate electrode 112 and the cell gate capping conductive film 114 have been formed in the cell gate trench 115. Although the cell gate insulating film 111 is illustrated as extending along a sidewall of the cell gate capping pattern 113, example embodiments of the present disclosure are not limited thereto. The cell gate capping pattern 113 may include, for example, at least one of silicon nitride (SiN), silicon oxynitride (SiON), silicon oxide ($SiO_2$), silicon carbonitride (SiCN), silicon oxycarbonitride (SiOCN), or combinations thereof.

Although not shown, an impurity doped area may be formed on at least one side of the cell gate structure 110. The impurity doped area may be a source/drain area of a transistor.

The bit-line structure 140ST may include a cell conductive line 140 and a cell line capping film 144. The cell conductive line 140 may be formed on a portion of each of the substrate 100 and the cell element isolation film 105 on which the cell gate structure 110 has been formed. The cell conductive line 140 may intersect the cell element isolation film 105 and the cell active area ACT defined by the cell element isolation film 105. The cell conductive line 140 may intersect the cell gate structure 110. In this regard, the cell conductive line 140 may correspond to the bit-line BL.

The cell conductive line 140 may be embodied as a stack of multiple films. The cell conductive line 140 may include, for example, a first cell conductive film 141, a second cell conductive film 142, and a third cell conductive film 143. The first to third cell conductive films 141, 142, and 143 may be sequentially stacked on the substrate 100 and the cell element isolation film 105. Although the cell conductive line 140 is illustrated as being embodied as the stack of three films, example embodiments of the present disclosure are not limited thereto.

Each of the first to third cell conductive films 141, 142, and 143 may include at least one of, for example, a semiconductor material doped with impurities, a conductive silicide compound, a conductive metal nitride metal, or a metal alloy. For example, the first cell conductive film 141 may include a doped semiconductor material, the second cell conductive film 142 may include at least one of a conductive silicide compound or a conductive metal nitride, and the third cell conductive film 143 may include a least one of a metal or a metal alloy. However, example embodiments of the present disclosure are not limited thereto.

The bit-line contact 146 may be formed between the cell conductive line 140 and the substrate 100. That is, the cell conductive line 140 may be formed on the bit-line contact 146. For example, the bit-line contact 146 may be formed at a point where the cell conductive line 140 intersects the middle portion of the cell active area ACT having the elongate island shape. The bit-line contact 146 may be formed between the bit-line connection area 103*a* and the cell conductive line 140.

The bit-line contact 146 may electrically connect the cell conductive line 140 and the substrate 100 to each other. In this regard, the bit-line contact 146 may correspond to the direct contact DC. The bit-line contact 146 may include, for example, at least one of a semiconductor material doped with impurities, a conductive silicide compound, a conductive metal nitride, or a metal.

In FIG. 4, in an area overlapping an upper surface of the bit-line contact 146, the cell conductive line 140 may include the second cell conductive film 142 and the third cell conductive film 143. In an area that does not overlap with the upper surface of the bit-line contact 146, the cell conductive line 140 may include the first to third cell conductive films 141, 142, and 143.

The cell line capping film 144 may be disposed on the cell conductive line 140. The cell line capping film 144 may extend in the second direction D2 and along an upper surface of the cell conductive line 140. In this regard, the cell line capping film 144 may include, for example, at least one of silicon nitride, silicon oxynitride, silicon carbonitride, or silicon oxycarbonitride. In the semiconductor memory device according to some example embodiments, the cell line capping film 144 may include, for example, a silicon nitride film. Although the cell line capping film 144 is illustrated as being embodied as a single film, example embodiments of the present disclosure are not limited thereto.

The cell interlayer insulating film 166 may be disposed on the cell line capping film 144. The cell interlayer insulating film 166 may overlap the cell line capping film 144 in a direction perpendicular to the upper surface of the substrate 100. The cell interlayer insulating film 166 may extend in the second direction D2 and along an upper surface of the cell line capping film 144. The cell interlayer insulating film 166 may include, for example, at least one of silicon nitride, silicon oxynitride, silicon carbonitride, or silicon oxycarbonitride. In the semiconductor memory device according to some example embodiments, the cell interlayer insulating film 166 may include, for example, a silicon nitride film. Although the cell interlayer insulating film 166 is illustrated as being embodied as a single film, example embodiments of the present disclosure are not limited thereto.

The cell insulating film 130 may be formed on the substrate 100 and the cell element isolation film 105. For example, the cell insulating film 130 may be formed on a portion of each of the substrate 100 and the cell element isolation film 105 on which the bit-line contact 146 is not formed. The cell insulating film 130 may be formed between the substrate 100 and the cell conductive line 140 and between the cell element isolation film 105 and the cell conductive line 140.

It is illustrated that the cell insulating film 130 may be embodied as a stack of a first cell insulating film 131 and a second cell insulating film 132. However, the cell insulating film 130 may be embodied as a single film. For example, the first cell insulating film 131 may include a silicon oxide film, while the second cell insulating film 132 may include a silicon nitride film. However, example embodiments of the present disclosure are not limited thereto.

A cell buffer film 101 may be disposed between the cell insulating film 130 and the cell area isolation film 22. The cell buffer film 101 may include, for example, a silicon oxide film. However, example embodiments of the present disclosure are not limited thereto.

A cell line spacer 150 may be disposed on a sidewall of each of the cell conductive line 140, the cell line capping film 144, and the cell interlayer insulating film 166. The cell line spacer 150 may be formed on the substrate 100 and the cell element isolation film 105 in an area around an area in which the cell conductive line 140 is formed on the bit-line contact 146. The cell line spacer 150 may be disposed on a sidewall of each of the cell conductive line 140, the cell line capping film 144, the cell interlayer insulating film 166, and the bit-line contact 146.

However, in an area around an area in which the cell conductive line 140 is formed and the bit-line contact 146 is absent, the cell line spacer 150 may be disposed on the cell insulating film 130. The cell line spacer 150 may be disposed on a sidewall of each of the cell conductive line 140, the cell interlayer insulating film 166, and the cell line capping film 144.

The cell line spacer 150 is illustrated as a stack of multiple films including first to fourth cell line spacers 151, 152, 153, and 154. However, the cell line spacer 150 may be embodied as a single film. For example, each of the first to fourth cell line spacers 151, 152, 153, and 154 may include one of a silicon oxide film, a silicon nitride film, a silicon oxynitride film (SiON), a silicon oxycarbonitride film (SiOCN), air, or a combination thereof. However, example embodiments of the present disclosure are not limited thereto.

For example, the second cell line spacer 152 may not be disposed on the cell conductive film 140 but may be disposed on the sidewall of the bit-line contact 146. In FIG. 5, the fourth cell line spacer 154 is shown as being disposed on the cell gate capping pattern 113. However, example embodiments of the present disclosure are not limited thereto. For example, the fourth cell line spacer 154 of FIG. 5 may not be disposed on the cell gate capping pattern 113 according to a manufacturing process of the storage contact 120. In FIG. 7, while being disposed on an upper surface of the cell gate structure 110, the fourth cell line spacer 154 may extend along a sidewall of each of the cell conductive lines 140 adjacent to each other in the first direction D1, and along an upper surface of the cell gate capping pattern 113.

In FIG. 6, the bit-line structure 140ST may extend in an elongate manner in the second direction D2. The bit-line structure 140ST may include a short sidewall defined on the cell area isolation film 22. A first cell boundary spacer 246_1 may be disposed on the short sidewall of the bit-line structure 140ST.

That is, the cell line spacer 150 may be disposed on a long sidewall of the bit-line structure 140ST extending in an elongate manner in the second direction D2.

In FIG. 7, a dummy bit-line structure 140ST_1 may be disposed on the cell area isolation film 22. The dummy bit-line structure 140ST_1 may have the same structure as that of the bit-line structure 140ST. That is, the dummy bit-line structure 140ST_1 may include the cell conductive line 140 and the cell line capping film 144.

The first cell line spacer 151 and the third cell line spacer 153 may be formed on a first sidewall of the dummy bit-line structure 140ST_1 facing the bit-line structure 140ST. The second cell boundary spacer 246_2 may be disposed on a second sidewall opposite to the first sidewall of the dummy bit-line structure 140ST_1 in the first direction D1. A second cell boundary spacer 246_2 and a first cell boundary spacer 246_1, and a peripheral spacer 245, a first block spacer 245_1, and a second block spacer 245_2 as described later may be formed at the same level. In this regard, "being formed at the same level" means being formed in the same manufacturing process.

A fence pattern 170 may be disposed on the substrate 100 and the cell element isolation film 105. The fence pattern 170 may be formed to overlap the cell gate structure 110 formed in the substrate 100 and the cell element isolation film 105. The fence pattern 170 may be disposed between the bit-line structures 140ST extending in the second direction D2. The fence pattern 170 may include, for example, at least one of silicon oxide, silicon nitride, silicon oxynitride, or combinations thereof.

The storage contact 120 may be disposed between cell conductive lines 140 adjacent to each other in the first direction D1. The storage contact 120 may be disposed between fence patterns 170 adjacent to each other in the second direction D2. The storage contact 120 may overlap a portion of each of the substrate 100 and the cell element isolation film 105 disposed between adjacent cell conductive lines 140. The storage contact 120 may be connected to the storage connection area 103*b* of the cell active area ACT. In this regard, the storage contact 120 may correspond to the buried contact BC.

The storage contact 120 may include, for example, at least one of a semiconductor material doped with impurities, a conductive silicide compound, a conductive metal nitride, or a metal.

A storage pad 160 may be formed on the storage contact 120. The storage pad 160 may be electrically connected to the storage contact 120. In this regard, the storage pad 160 may correspond to the landing pad LP.

The storage pad 160 may overlap a portion of an upper surface of the bit-line structure 140ST. The storage pad 160 may include, for example, at least one of a semiconductor material doped with impurities, a conductive silicide compound, a conductive metal nitride, a conductive metal carbide, a metal, or a metal alloy.

A pad isolation insulating film 180 may be formed on the storage pad 160 and the bit-line structure 140ST. For example, the pad isolation insulating film 180 may be disposed on the cell line capping film 144. The pad isolation insulating film 180 may define a plurality of isolated areas between the storage pads 160. Further, the pad isolation insulating film 180 may not cover an upper surface of the storage pad 160.

The pad isolation insulating film 180 may include an insulating material so as to electrically isolate the plurality of storage pads 160 from each other. For example, the pad isolation insulating film 180 may include, for example, at least one of a silicon oxide film, a silicon nitride film, a silicon oxynitride film, a silicon oxycarbonitride film, or a silicon carbonitride film.

A first etch stop film 292 may be disposed on the pad isolation insulating film 180 and the storage pad 160. The first etch stop film 292 may extend not only to the cell area 20 but also to the peripheral area 24. The first etch stop film 292 may include at least one of a silicon nitride film, a silicon carbonitride film, a silicon boron nitride film (SiBN), a silicon oxynitride film, or a silicon oxycarbide film.

The information storage 190 may be disposed on the storage pad 160. The information storage 190 may be electrically connected to the storage pad 160. A portion of information storage 190 may be disposed in the first etch stop film 292. The information storage 190 may include, for example, a capacitor. However, example embodiments of the present disclosure are not limited thereto. The information storage 190 may include the first lower electrode 191, a first capacitor dielectric film 192, and a first upper electrode 193.

The first lower electrode 191 may be disposed on the storage pad 160. The first lower electrode 191 is shown as having a pillar shape. However, example embodiments of the present disclosure are not limited thereto. In another example, the first lower electrode 191 may have a cylindrical shape. The first capacitor dielectric film 192 is formed on the first lower electrode 191. The first capacitor dielectric film 192 may be formed along a profile of the first lower electrode 191. The first upper electrode 193 is formed on the first capacitor dielectric film 192. The first upper electrode 193 may surround an outer sidewall of the first lower electrode 191.

In one example, the first capacitor dielectric film 192 may be disposed in an area vertically overlapping the first upper electrode 193. In another example, unlike what is shown, the first capacitor dielectric film 192 may include a first portion vertically overlapping with the first upper electrode 193 and a second portion not vertically overlapping with the first upper electrode 193. That is, the second portion of the first capacitor dielectric film 192 is a portion not covered with the first upper electrode 193.

Each of the first lower electrode 191 and the first upper electrode 193 may include, for example, a doped semiconductor material, a conductive metal nitride such as titanium nitride, tantalum nitride, niobium nitride or tungsten nitride, etc., a metal such as ruthenium, iridium, titanium, or tantalum, etc., or a conductive metal oxide such as iridium oxide or niobium oxide, etc. However, example embodiments of the present disclosure are not limited thereto.

The first capacitor dielectric film 192 may include, for example, one of silicon oxide, silicon nitride, silicon oxynitride, a high dielectric constant material, or combinations thereof. However, example embodiments of the present disclosure are not limited thereto. In the semiconductor device according to some example embodiments, the first capacitor dielectric film 192 may include a multilayer structure in which a zirconium oxide layer, an aluminum oxide layer, and a zirconium oxide layer are sequentially stacked. In the semiconductor device according to some example embodiments, the first capacitor dielectric film 192 may include a dielectric film including hafnium (Hf). In the semiconductor device according to some example embodiments, the first capacitor dielectric film 192 may have a multilayer structure of a ferroelectric material layer and a paraelectric material layer.

A peripheral element isolation film 26 may be formed in the substrate 100 and in the peripheral area 24. The peripheral element isolation film 26 may define a peripheral active area in the peripheral area 24. An upper surface of the peripheral element isolation film 26 is shown to be coplanar with the upper surface of the substrate 100. However, example embodiments of the present disclosure are not limited thereto. The peripheral element isolation film 26 may include, for example, at least one of a silicon oxide film, a silicon nitride film, or a silicon oxynitride film. However, example embodiments of the present disclosure are not limited thereto.

A peripheral gate structure 240ST may be disposed on the substrate 100 and in the peripheral area 24. The peripheral gate structure 240ST may be disposed on the peripheral active area defined by the peripheral element isolation film 26.

The peripheral gate structure 240ST may include a peripheral gate insulating film 230, a peripheral gate conductive film 240, and a peripheral capping film 244 sequentially stacked on the substrate 100. A peripheral spacer 245 may be disposed on a sidewall of the peripheral gate structure 240ST.

The peripheral gate conductive film 240 may include first to third peripheral conductive films 241, 242, and 243 sequentially stacked on the peripheral gate insulating film 230. In one example, an additional conductive film may not be disposed between the peripheral gate conductive film 240 and the peripheral gate insulating film 230. In another example, unlike what is illustrated, an additional conductive film such as a work function conductive film may be disposed between the peripheral gate conductive film 240 and the peripheral gate insulating film 230.

In some example embodiments, each of at least one of the plurality of cell conductive lines 140 may have the same stack structure as that of the peripheral gate conductive film 240. For example, each of the first to third cell conductive films 141, 142, and 143 of the cell conductive line 140 may have the same stack structure as that of each of the first to third peripheral conductive films 241, 242, and 243 of the peripheral gate conductive film 240.

In some example embodiments, a thickness T5 of the peripheral gate conductive film 240 may be different from a thickness T4 of the cell conductive line 140. For example, the thickness T5 of the peripheral gate conductive film 240 may be greater than the thickness T4 of the cell conductive line 140. In other words, a sum of thicknesses of the first to third peripheral conductive films 241, 242, and 243 may be greater than a sum of thicknesses of the first to third cell conductive films 141, 142, and 143. In this regard, the thickness may be a dimension in a direction perpendicular to the upper surface of the substrate 100. However, example embodiments of the present disclosure are not limited thereto. In another example, the thickness of the peripheral gate conductive film 240 and the thickness of the cell conductive line 140 may be equal to each other.

Although it is shown that two peripheral gate structures 240ST are disposed between adjacent peripheral element isolation films 26, this is intended only for convenience of illustration, and example embodiments of the present disclosure are not limited thereto.

A first block conductive structure 240ST_1 may be disposed between the cell area 20 and the peripheral area 24. A portion of the first block conductive structure 240ST_1 is illustrated as overlapping the cell area isolation film 22. However, example embodiments of the present disclosure are not limited thereto. The first block conductive structure 240ST_1 may be a conductive structure that is closest, in the second direction D2, to the bit-line structure 140ST extending in the second direction D2.

The first block conductive structure 240ST_1 may include a first block gate insulating film 230_1, a first block conductive line 240_1, and a first block capping film 244_1 sequentially stacked on the substrate 100. The first block spacer 245_1 may be disposed on a sidewall of the first block conductive structure 240ST_1. A multilayer structure of the first block conductive line 240_1 may be the same as the multilayer structure of the peripheral gate conductive film 240.

A second block conductive structure 240ST_2 may be disposed between the cell area 20 and the peripheral area 24. A portion of the second block conductive structure 240ST_2 is illustrated as overlapping the cell area isolation film 22. However, example embodiments of the present disclosure are not limited thereto. The second block conductive structure 240ST_2 may be a conductive structure closest to the dummy bit-line structure 140ST_1 in the first direction D1. A description about the second block conductive structure 240ST_2 may be similar to that about the first block conductive structure 240ST_1.

The peripheral gate structure 240ST, the first block conductive structure 240ST_1, and the second block conductive structure 240ST_2 may be formed at the same level. Each of the peripheral gate conductive film 240, the first block conductive line 240_1, and the second block conductive line 240_2 may have the same stack structure as that of the cell conductive line 140.

The peripheral gate insulating film 230 may include, for example, silicon oxide, silicon nitride, silicon oxynitride, or a high-k material having a higher dielectric constant than that of silicon oxide. The peripheral spacer 245 may include, for example, at least one of silicon nitride, silicon oxynitride, silicon oxide, silicon carbonitride, silicon oxycarbonitride, or combinations thereof. The peripheral spacer 245 is illustrated as being embodied as a single film. However, this is intended only for convenience of illustration, and example embodiments of the present disclosure are not limited thereto.

The peripheral capping film 244 may include, for example, at least one of a silicon nitride film, silicon oxynitride, or silicon oxide.

In some example embodiments, a thickness T1 of the peripheral capping film 244 is smaller than a thickness T2 of the peripheral interlayer insulating film 291. A thickness T3 of the cell line capping film 144 is smaller than a thickness of the cell interlayer insulating film 166.

In some example embodiments, the thickness T1 of the peripheral capping film 244 may be different from the thickness T3 of the cell line capping film 144. For example, the thickness T1 of the peripheral capping film 244 may be smaller than the thickness T3 of the cell line capping film 144. However, example embodiments of the present disclosure are not limited thereto.

The second etch stop film 250 may be disposed on the substrate 100. The second etch stop film 250 may be spaced from the peripheral gate structure 240ST. The second etch stop film 250 may not contact the peripheral gate structure 240ST. The second etch stop film 250 may extend along a sidewall of the peripheral spacer 245. The second etch stop film 250 may extend along a sidewall of each of the first cell boundary spacer 246_1 and the second cell boundary spacer 246_2. The second etch stop film 250 may not overlap the peripheral gate structure 240ST and the peripheral capping film 244 in a direction perpendicular to the upper surface of the substrate 100.

The second etch stop film 250 may include, for example, at least one of a silicon nitride film, silicon oxynitride, silicon carbonitride, or silicon oxycarbonitride.

The first peripheral insulating film 290 may be disposed on the second etch stop film 250. An upper surface 290US of the first peripheral insulating film 290 may be coplanar with an upper surface of the second etch stop film 250. The upper surface 290US of the first peripheral insulating film 290 may be coplanar with an upper surface of the peripheral spacer 245. In other words, a height between the upper surface 290US of the first peripheral insulating film 290 and the upper surface of the substrate 100 may be equal to a height between a topmost level of the second etch stop film 250 and the upper surface of the substrate 100. The first peripheral insulating film 290 may be disposed around the peripheral gate structure 240ST.

A boundary insulating film 295 may be disposed on the second etch stop film 250. For example, the boundary insulating film 295 may be disposed on the cell area isolation film 22. The boundary insulating film 295 may be disposed between the first block conductive structure 240ST_1 and the bit-line structure 140ST, and between the second block conductive structure 240ST_2 and the dummy bit-line structure 140ST_1. The boundary insulating film 295 may be disposed between the cell conductive line 140 and the first block conductive line 240_1 facing each other in the second direction D2, and between the second block conductive line 240_2 and the cell conductive line of the dummy bit-line structure 140ST_1 facing each other in the first direction D1. The boundary insulating film 295 may be disposed around the bit-line structure 140ST and the dummy bit-line structure 140ST_1.

The first peripheral insulating film 290 and the boundary insulating film 295 may be formed at the same level. The first peripheral insulating film 290 and the boundary insulating film 295 may include the same material. Each of the first peripheral insulating film 290 and the boundary insulating film 295 may include, for example, an oxide-based insulating material.

For example, the peripheral gate structure 240ST may include a first peripheral gate structure and a second peripheral gate structure disposed between adjacent peripheral element isolation films 26. The first peripheral gate structure is spaced apart from the second peripheral gate structure. Further, the peripheral gate structure 240ST may include a third peripheral gate structure spaced apart from the first peripheral gate structure while the peripheral element isolation film 26 is disposed therebetween. Each of the first to third peripheral gate structures include the peripheral gate insulating film 230, the peripheral gate conductive film 240, the peripheral capping film 244, and the peripheral spacer 245.

In one example, referring to FIG. 9, the peripheral spacer 245 may include an upper surface 245US and a bottom surface 245BS opposite to each other. The upper surface 245US of the peripheral spacer 245 may contact the peripheral interlayer insulating film 291. The bottom surface 245_BS of the peripheral spacer 245 may contact the substrate 100. The peripheral gate structure 240ST and the peripheral capping film 244 may be disposed on one sidewall of the peripheral spacer 245. The second etch stop film 250 may be disposed on the other sidewall of the peripheral spacer 245. In other words, the peripheral spacer 245 may be disposed between the peripheral gate structure 240ST and the second etch stop film 250. The peripheral gate structure 240ST and the peripheral capping film 244 may be disposed on one sidewall of the peripheral spacer 245. The second etch stop film 250 may be disposed on the other sidewall of the peripheral spacer 245.

The peripheral spacer 245 may not overlap the peripheral gate structure 240ST in a direction perpendicular to the upper surface of the substrate 100.

The upper surface 245US of the peripheral spacer 245 may have a first width W1. The bottom surface 245BS of the peripheral spacer 245 may have a second width W2. Each of the first width W1 and the second width W2 may be a dimension in the first direction D1. In some example embodiments, the second width W2 may be greater than the first width W1.

In some example embodiments, a width of the peripheral spacer 245 may decrease as the peripheral spacer 245 extends toward the upper surface 245US of the peripheral spacer 245. In some example embodiments, a width of a middle portion of the peripheral spacer 245 may be equal to a width of a bottom portion of the peripheral spacer 245. In this case, the width of the peripheral spacer 245 may decrease as the peripheral spacer 245 extends from the middle portion to a top portion. In this regard, the top portion of the peripheral spacer 245 may be a portion including the upper surface 245US of the peripheral spacer 245.

A height from the upper surface of the substrate 100 to the upper surface 240ST_US of the peripheral gate structure 240ST may be a first height H1. A height from the upper surface of the substrate 100 to the upper surface 245US of the peripheral spacer 245 may be a second height H2. The first height H1 is equal to the second height H2. A height from the upper surface of the substrate 100 to the topmost level of the second etch stop film 250 may be a third height H3. A height between the topmost level of the second etch stop film 250 and the upper surface of the substrate 100 may be the height between the upper surface 250US of the second etch stop film 250 and the upper surface of the substrate 100. The third height H3 is equal to each of the first height H1 and the second height H2. That is, the first to third heights H1, H2, and H3 are equal to each other. Each of the first to third heights H1, H2, and H3 may be a dimension in a direction perpendicular to the upper surface of the substrate 100.

In some example embodiments, the upper surface 240ST_US of the peripheral gate structure 240ST may be coplanar with the upper surface 245US of the peripheral spacer 245. The upper surface 245US of the peripheral spacer 245 may be coplanar with the upper surface 250US of the second etch stop film 250. The upper surface 250US of the second etch stop film 250 may be coplanar with the upper surface 240ST_US of the peripheral gate structure 240ST. That is, the upper surface 240ST_US of the peripheral gate structure 240ST, the upper surface 245US of the peripheral spacer 245, and the upper surface 250US of the second etch stop film 250 may be coplanar with each other. The upper surface 240ST_US of the peripheral gate structure 240ST, the upper surface 245US of the peripheral spacer 245, and the upper surface 250US of the second etch stop film 250 may be formed at the same level.

The peripheral interlayer insulating film 291 is disposed on the peripheral gate structure 240ST, the first peripheral insulating film 290, and the boundary insulating film 295. The peripheral interlayer insulating film 291 may cover the peripheral gate structure 240ST, the first peripheral insulating film 290, and the boundary insulating film 295. The peripheral interlayer insulating film 291 may cover the second etch stop film 250 and the upper surface 295US of the cell interlayer insulating film.

Each of the upper surface 290US of the first peripheral insulating film and the upper surface 295US of the cell interlayer insulating film is illustrated as being flat. However, example embodiments of the present disclosure are not limited thereto. Each of the upper surface 290US of the first peripheral insulating film and the upper surface 295US of the cell interlayer insulating film may be a curved face convex toward the substrate 100. In this case, a height between each of the upper surface 290US of the first peripheral insulating film and the upper surface 295US of the cell interlayer insulating film and the upper surface of the substrate 100 may be a height between a point along each of the upper surface 290US of the first peripheral insulating film and the upper surface 295US of the cell interlayer insulating film, which is closest to the substrate 100, and the upper surface of the substrate 100.

The peripheral interlayer insulating film 291 may include a different material from that of each of the first peripheral insulating film 290 and the boundary insulating film 295. The peripheral interlayer insulating film 291 may include, for example, a nitride-based insulating material. For example, the peripheral interlayer insulating film 291 may include silicon nitride.

Thus, in an etching process included in a process of manufacturing the information storage 190, the peripheral interlayer insulating film 291 may protect the first peripheral insulating film 290. In an etching process included in a process of manufacturing the information storage 190, the peripheral interlayer insulating film 291 may mitigate or prevent a defect caused by etching the first peripheral insulating film 290.

A peripheral contact plug 260 may be disposed on each of both opposing sides of the peripheral gate structure 240ST. The peripheral contact plug 260 may extend through the peripheral interlayer insulating film 291 and the first peripheral insulating film 290 and then extend to a portion of the substrate 100 in the peripheral area 24.

A peripheral wiring line 265 may be disposed on the peripheral interlayer insulating film 291. The bit-line contact plug 261 may extend through the cell line capping film 144 so as to be connected to the cell conductive line 140. The cell gate contact plug 262 may extend through the peripheral interlayer insulating film 291, the boundary insulating film 295, and the cell gate capping pattern 113 so as to be connected to the cell gate electrode 112.

Each of the peripheral contact plug 260, the peripheral wiring line 265, the bit-line contact plug 261, and the cell gate contact plug 262 may include the same material as that of the storage pad 160.

A peripheral wiring isolation pattern 280 may isolate the peripheral wiring line 265 and the peripheral contact plug 260 from each other. The peripheral wiring isolation pattern 280 may include, for example, at least one of a silicon oxide film, a silicon nitride film, a silicon oxynitride film, a silicon oxycarbonitride film, or a silicon carbonitride film.

The first etch stop film 292 may be disposed on the peripheral contact plug 260, the peripheral wiring line 265, the bit-line contact plug 261, and the cell gate contact plug 262.

A second peripheral interlayer insulating film 293 may be disposed on the first etch stop film 292. The second peripheral interlayer insulating film 293 may cover a sidewall of the first upper electrode 193. The second peripheral interlayer insulating film 293 may include an insulating material.

Figure 10:
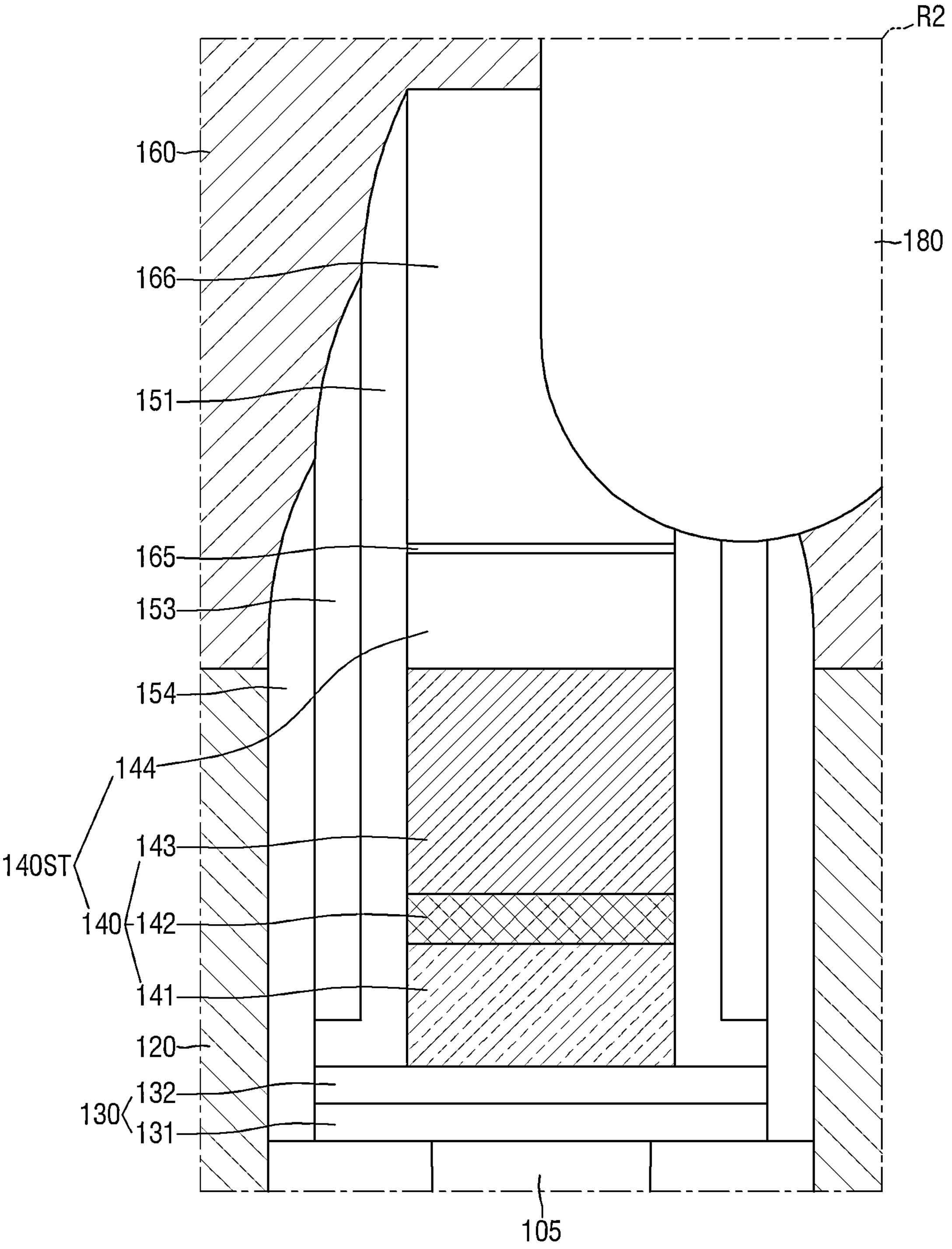
FIG. 10 is a diagram for illustrating a semiconductor memory device according to an example embodiment.
Figure 11:
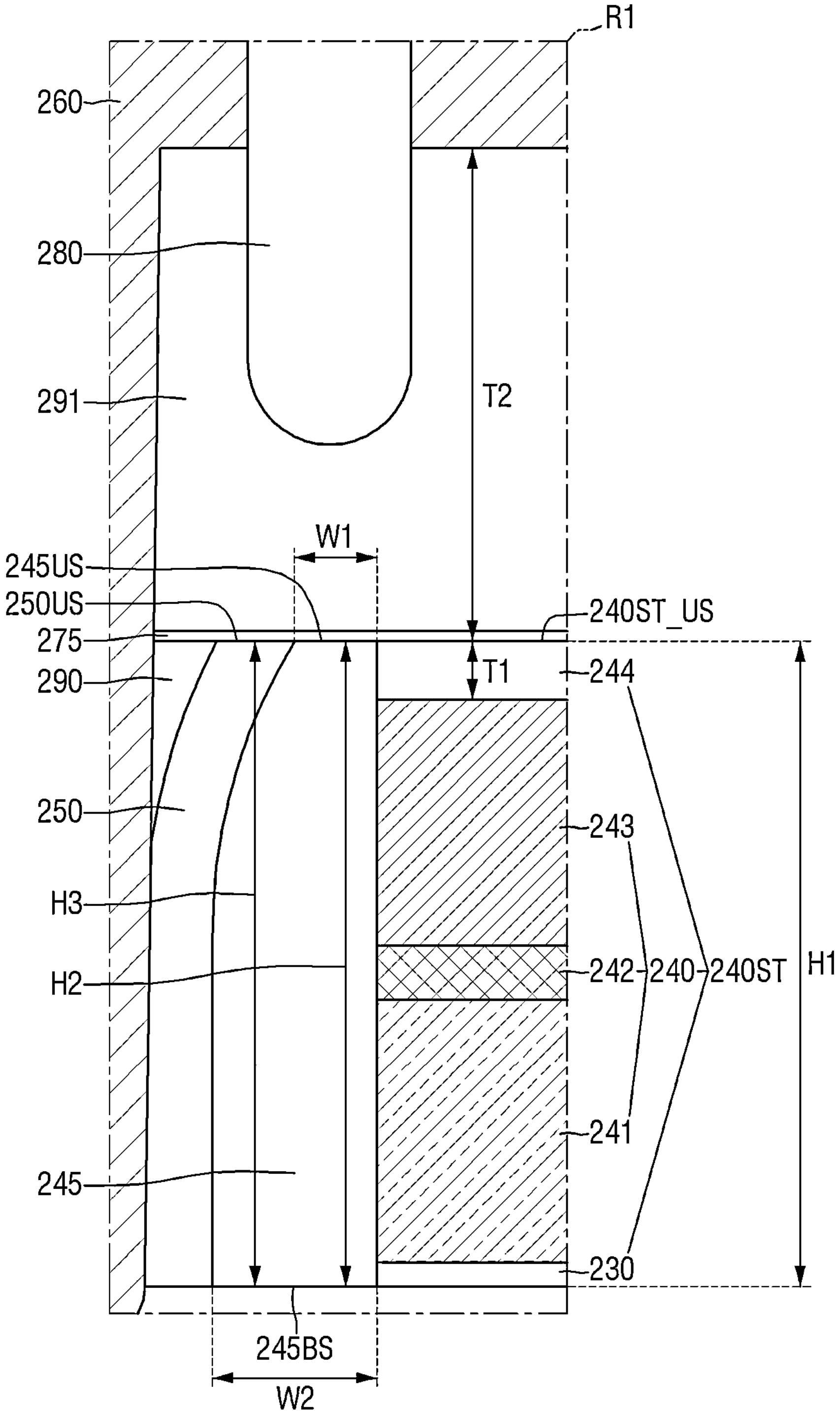
FIG. 11 is a diagram for illustrating a semiconductor memory device according to an example embodiment.

FIG. 10 is a diagram for illustrating a semiconductor memory device according to an example embodiment. FIG. 11 is a diagram for illustrating a semiconductor memory device according to an example embodiment. For the convenience of description, following descriptions are based on differences thereof from the descriptions as set forth above with reference to FIG. 1 to FIG. 8.

For reference, FIG. 10 is an enlarged view for illustrating a R2 area in FIG. 4, and FIG. 11 is an enlarged view for illustrating a R1 area in FIG. 8.

Referring to FIG. 10, the cell interlayer insulating film 166 may further include a first insulating film 165. The first insulating film 165 may be disposed between the cell interlayer insulating film 166 and the cell line capping film 144.

In one example embodiment, the first insulating film 165 may include silicon oxide.

Figure 23A:
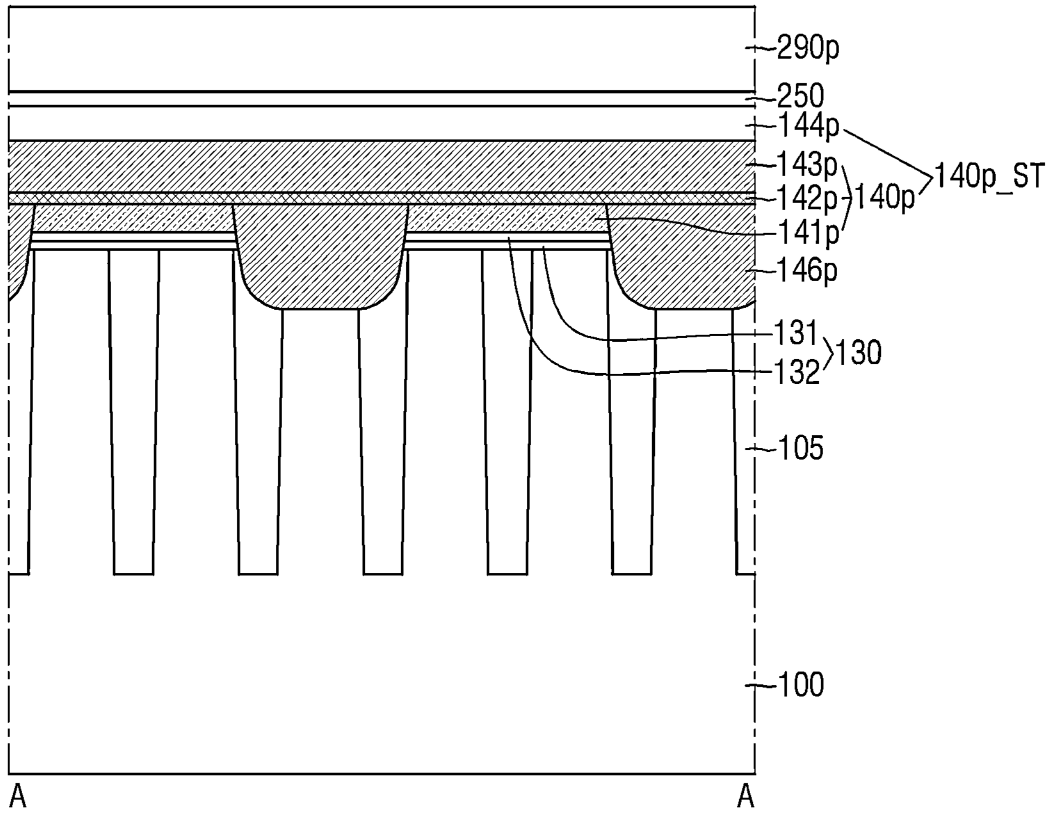
FIG. 23*a* to FIG. 27*b* are diagrams of intermediate structures corresponding to intermediate steps for illustrating a method for manufacturing a semiconductor memory device according to an example embodiment.
Figure 23B:
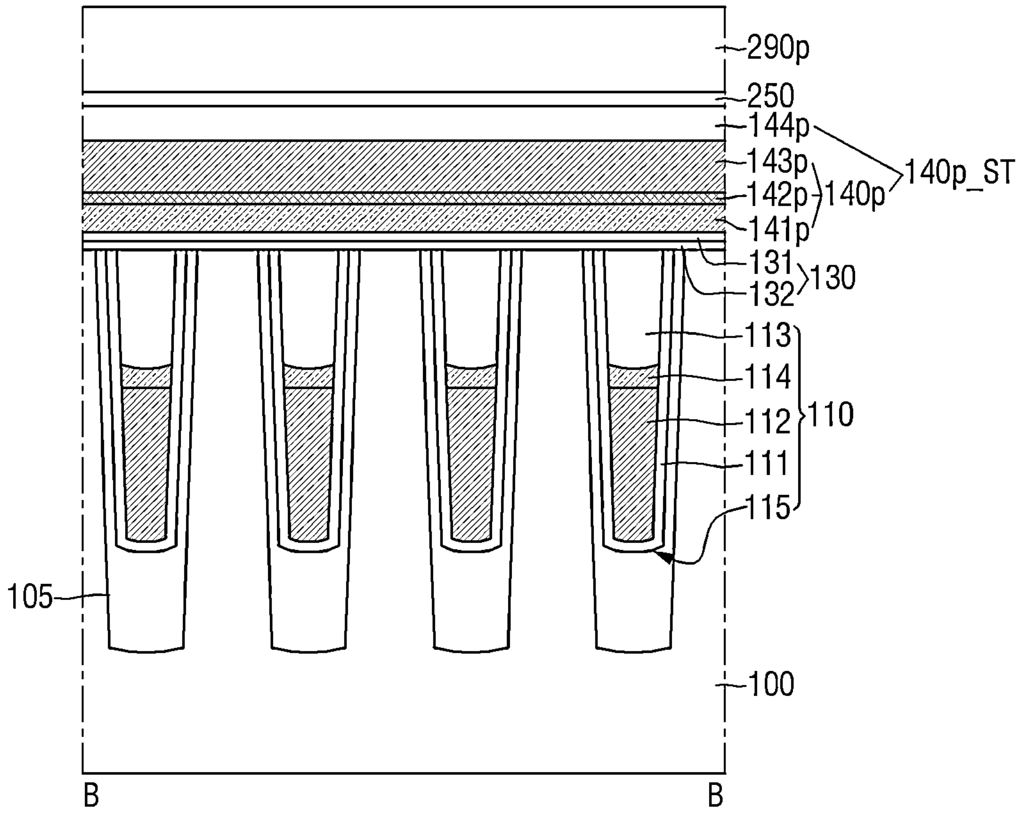
Figure 23C:
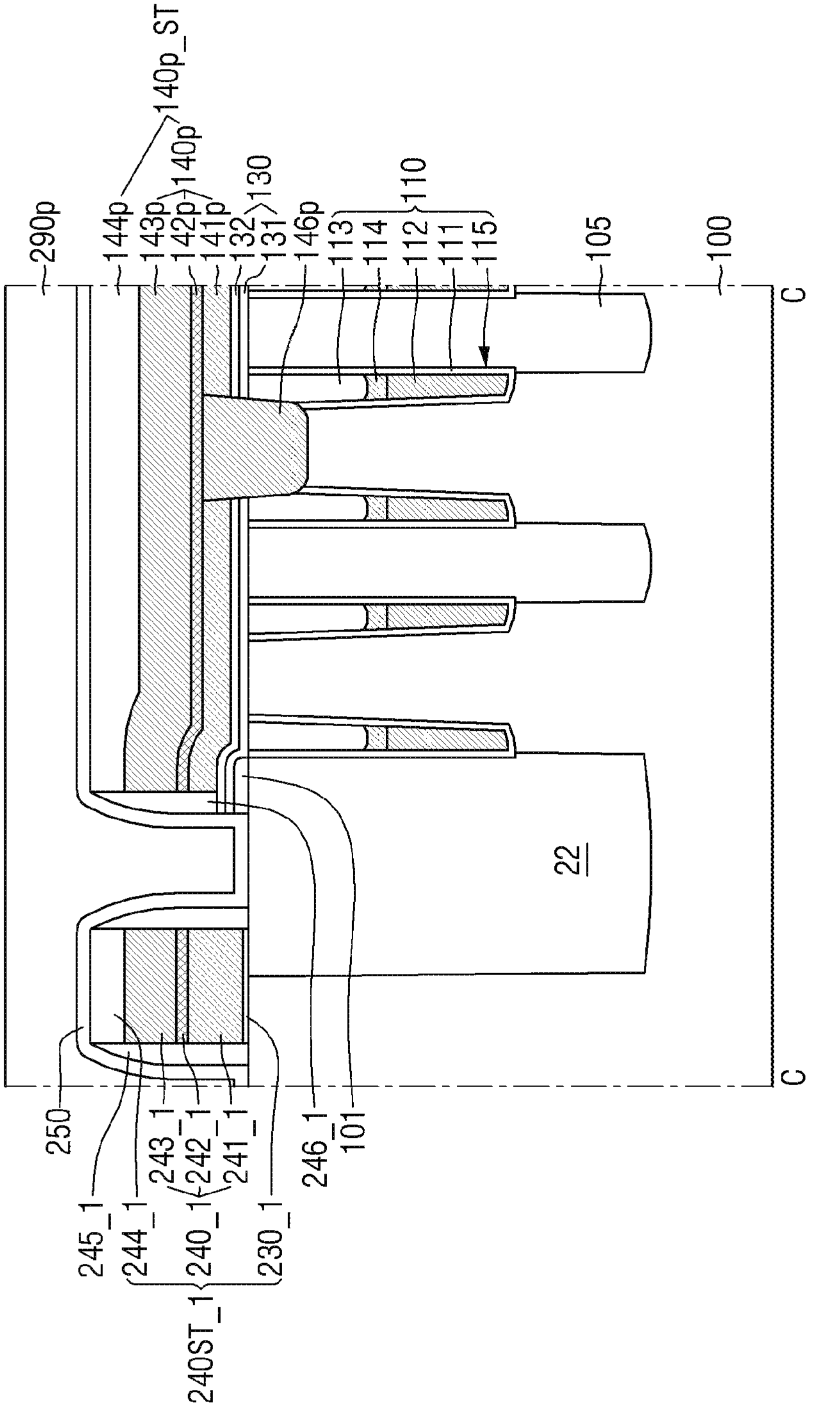
Figure 23D:
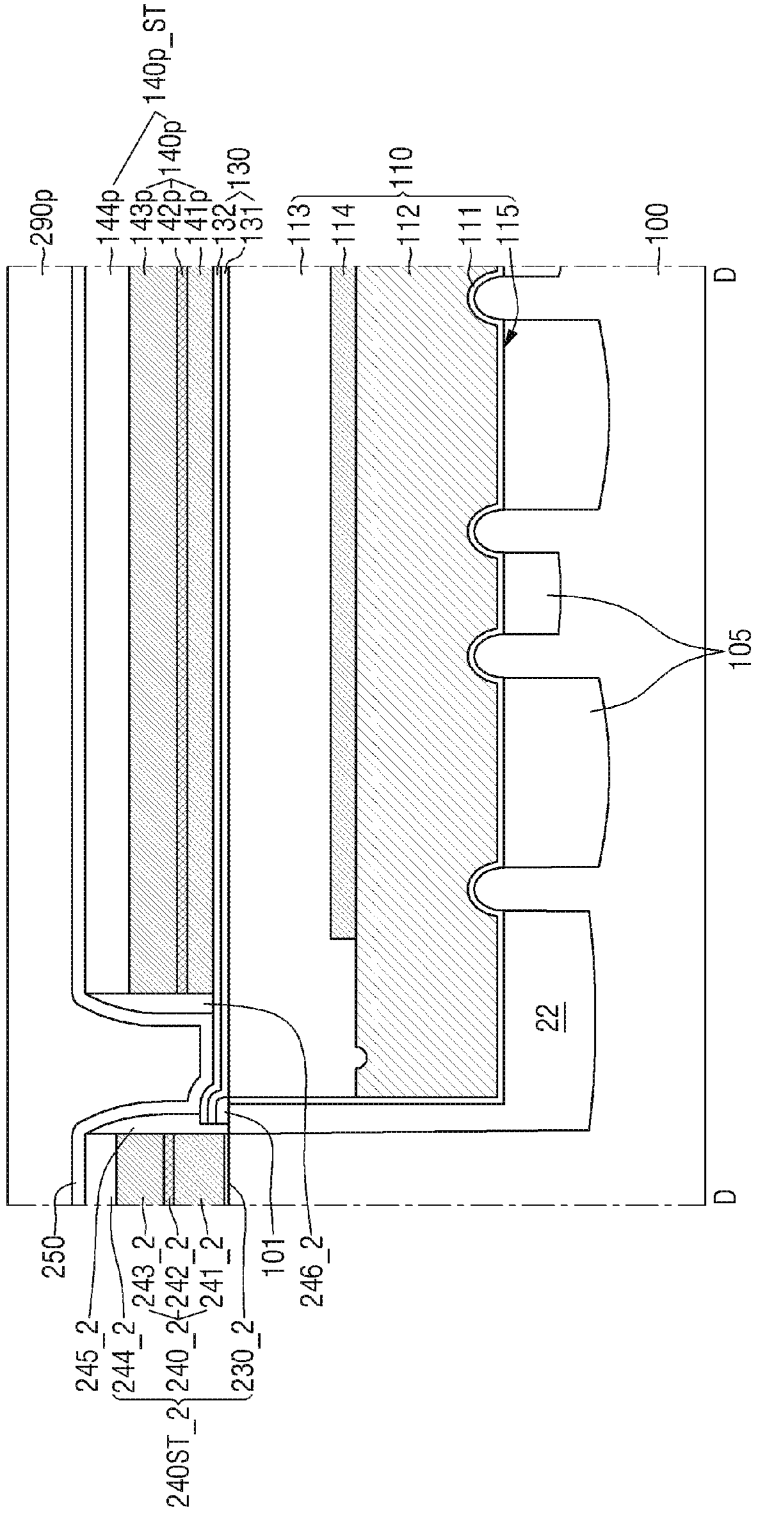
Figure 23E:
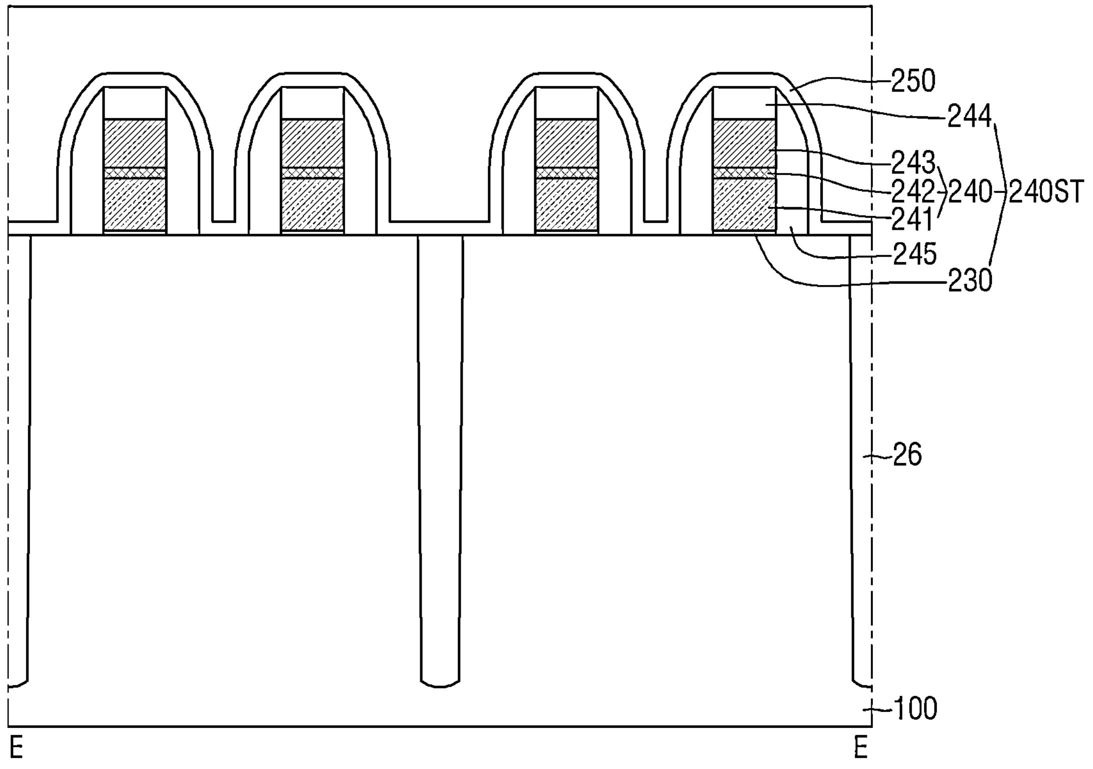
Figure 24A:
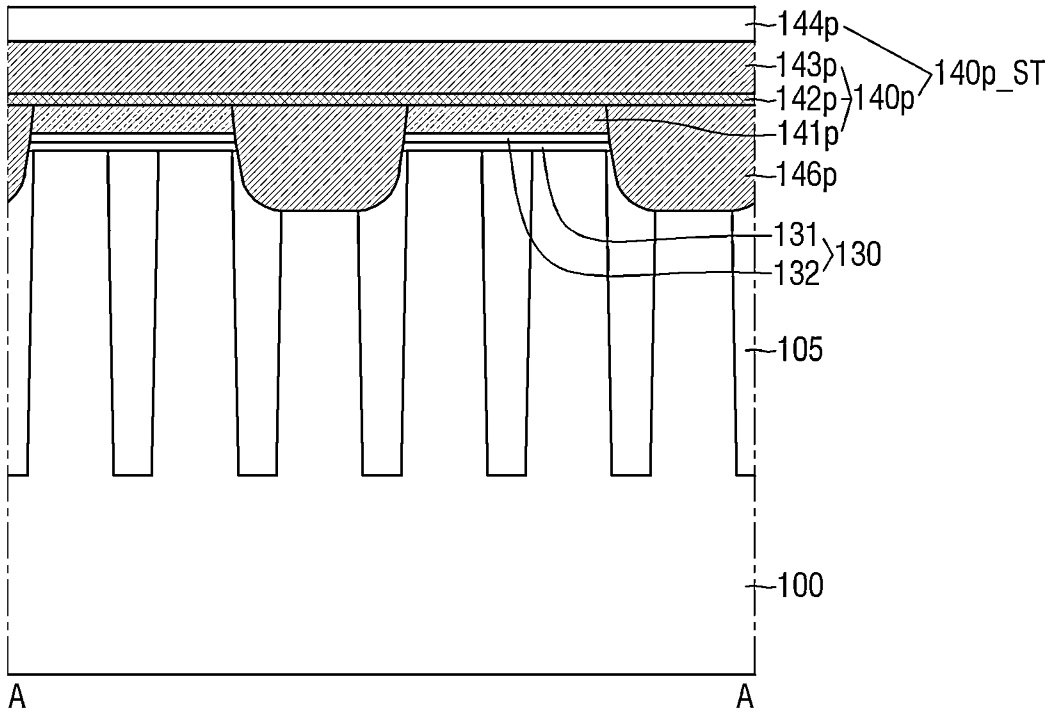
Figure 24B:
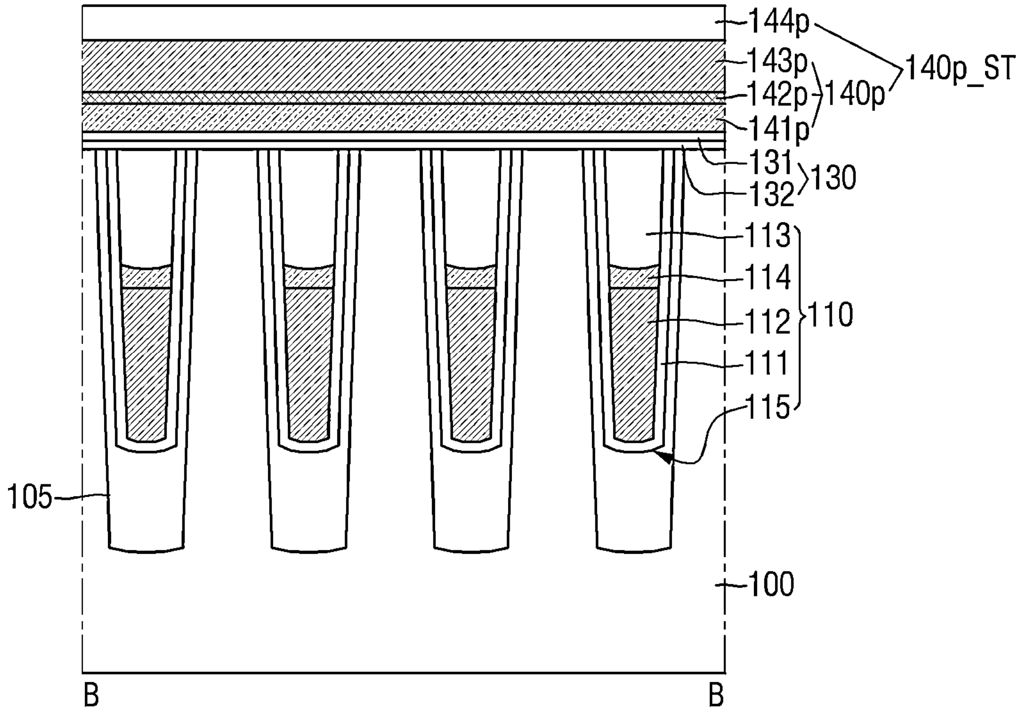
Figure 24C:
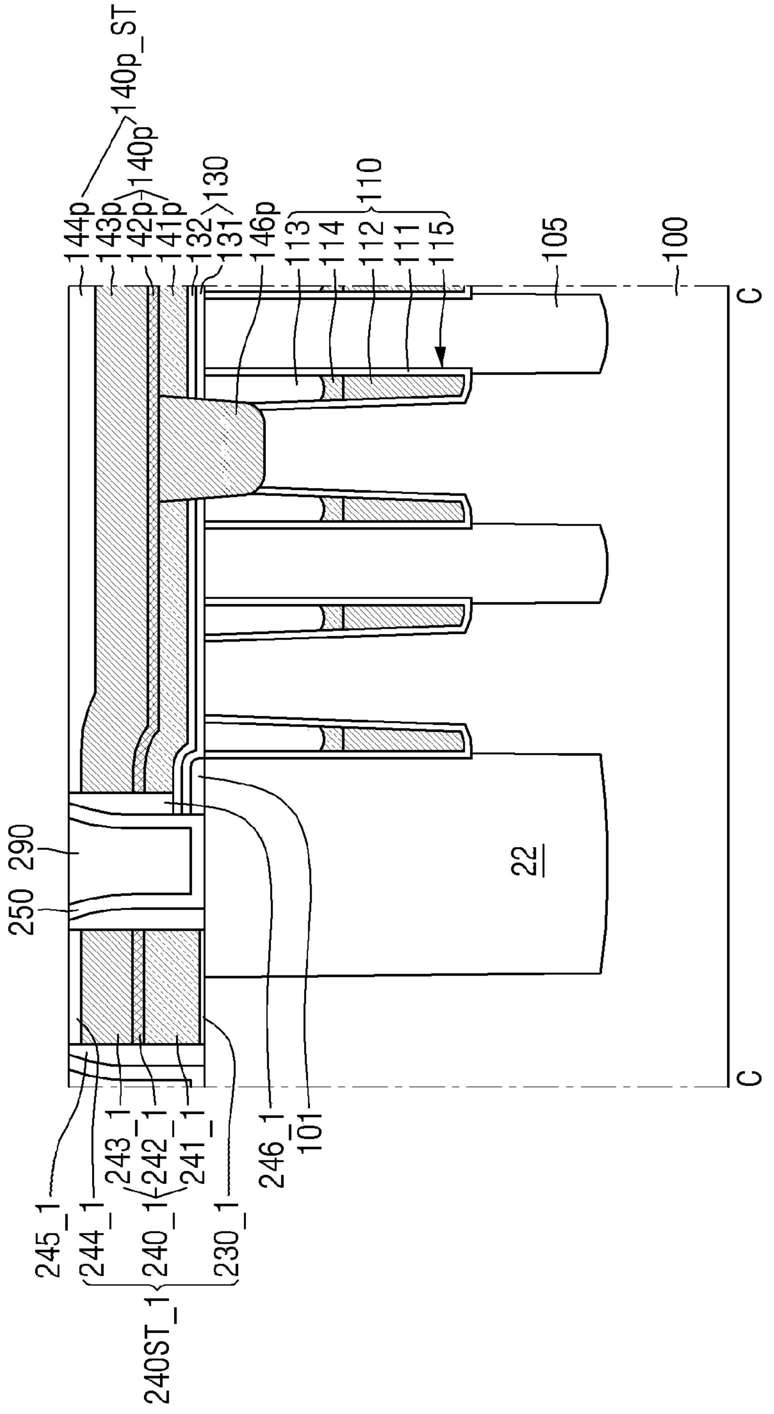
Figure 24D:
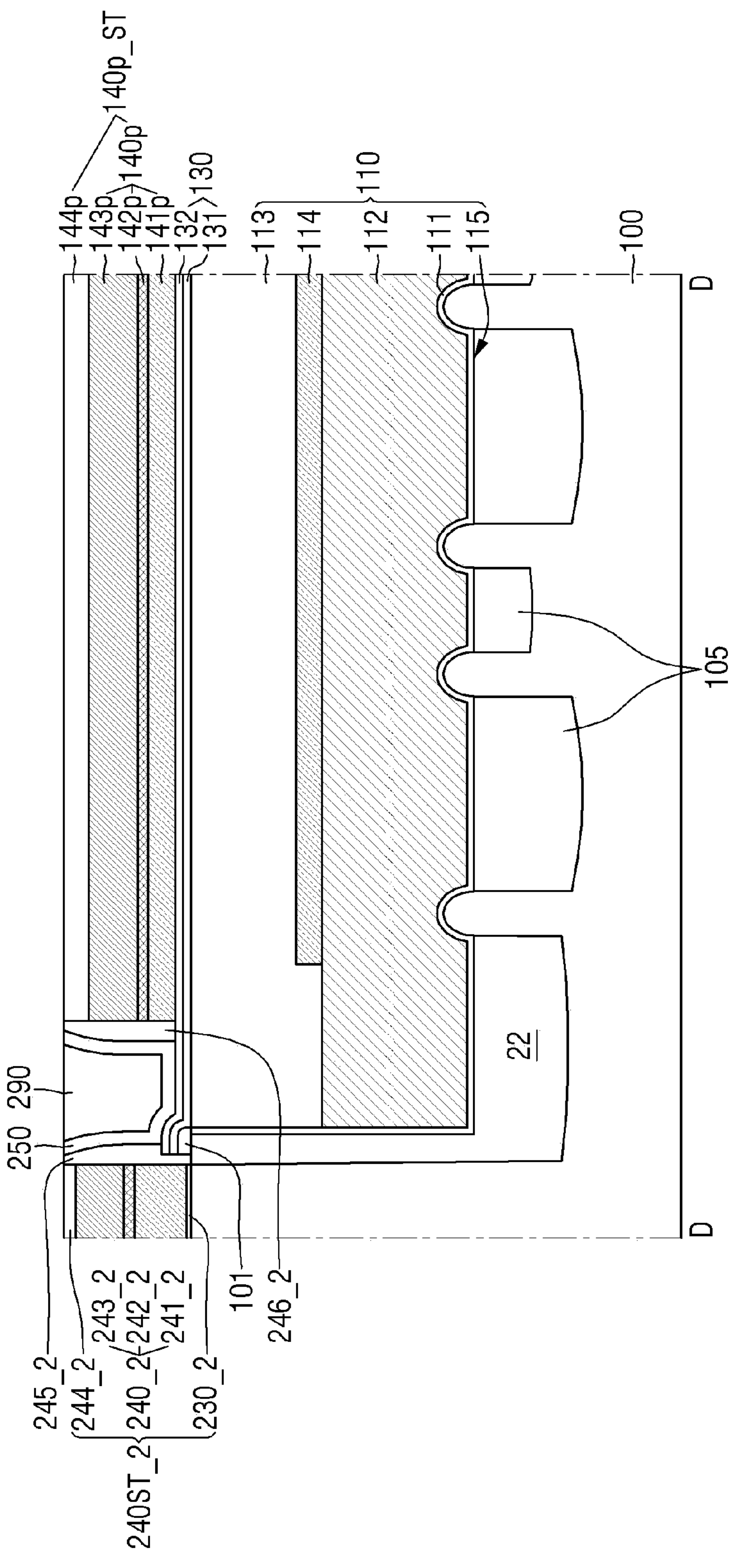
Figure 24E:
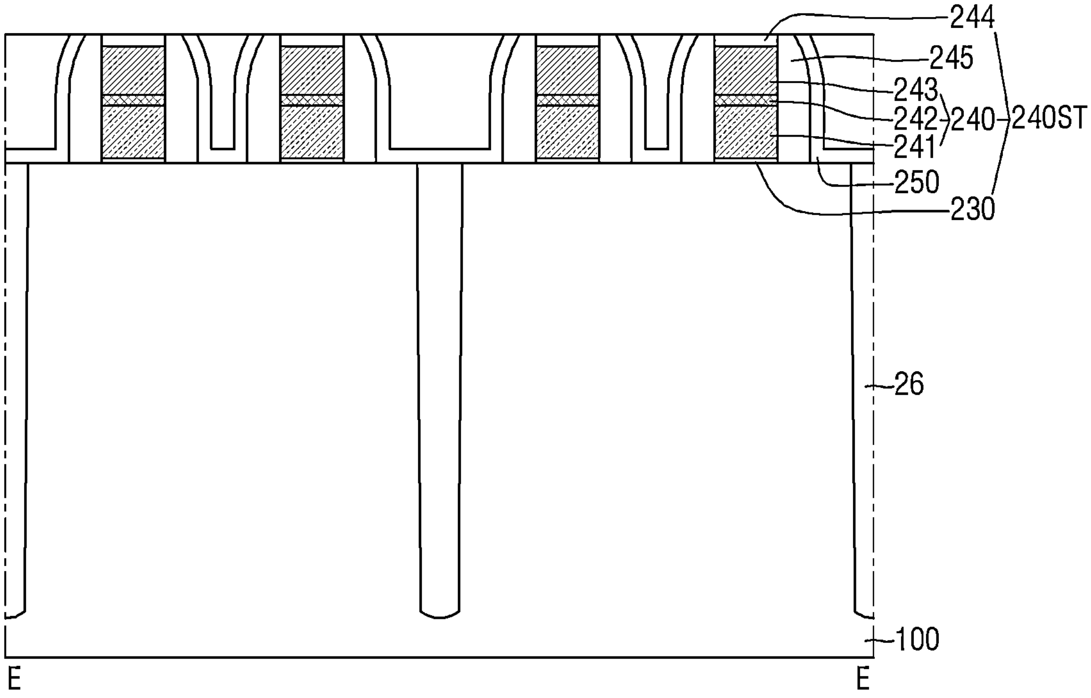
Figure 25A:
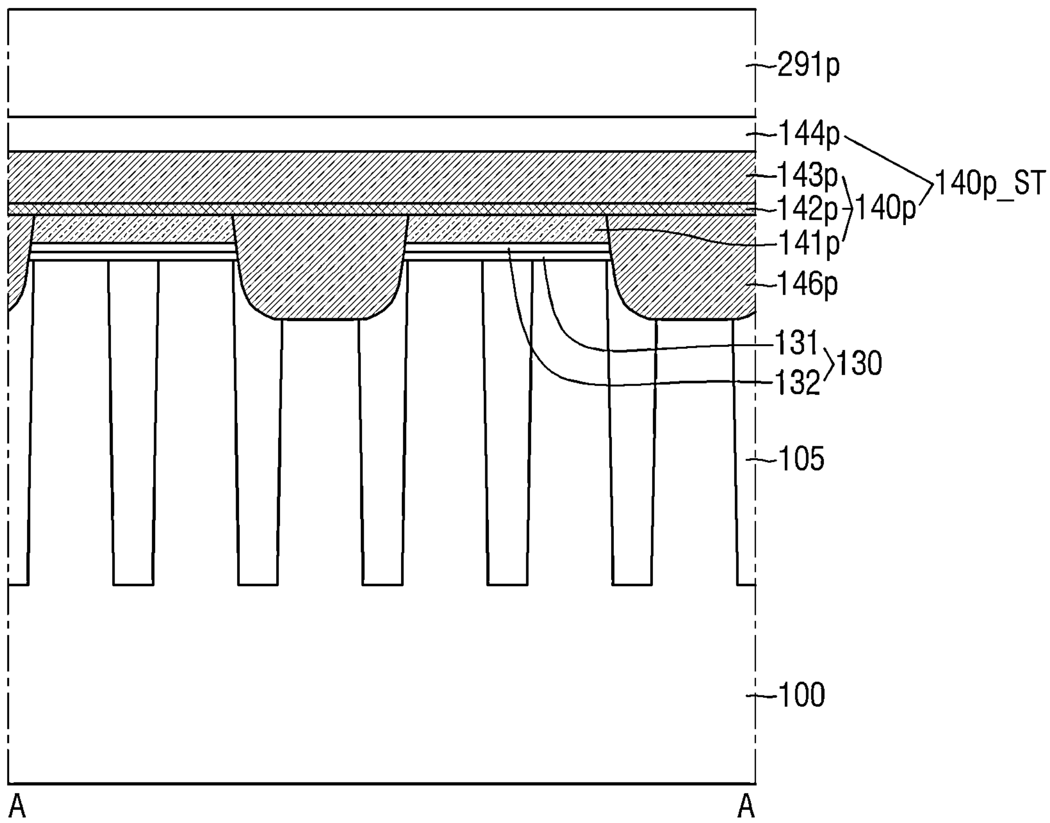
Figure 25B:
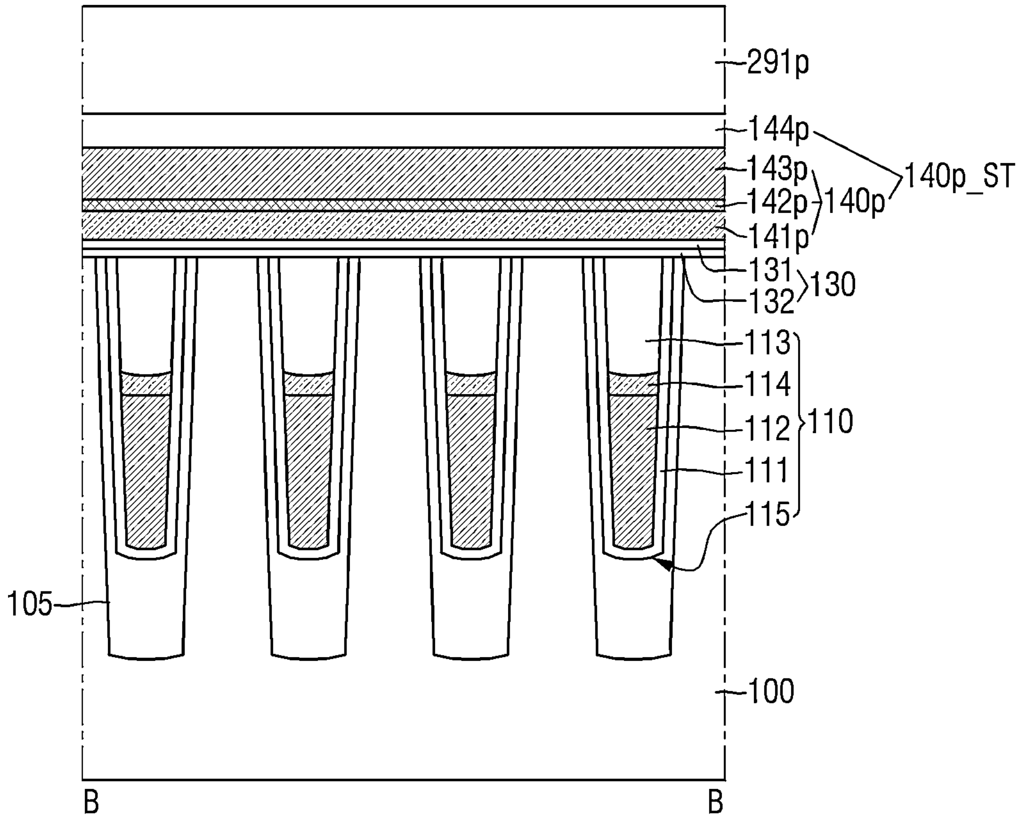
Figure 25C:
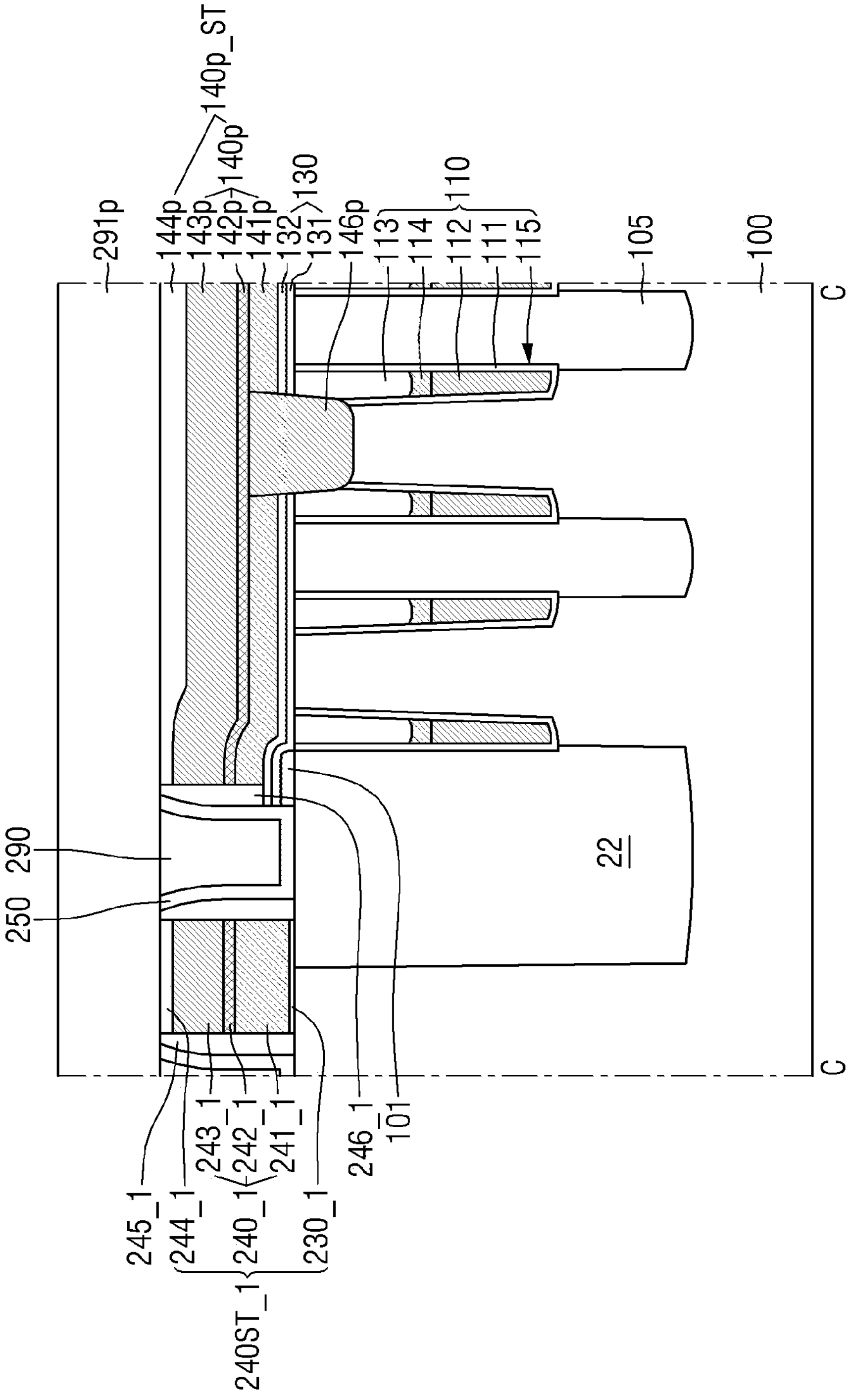
Figure 25D:
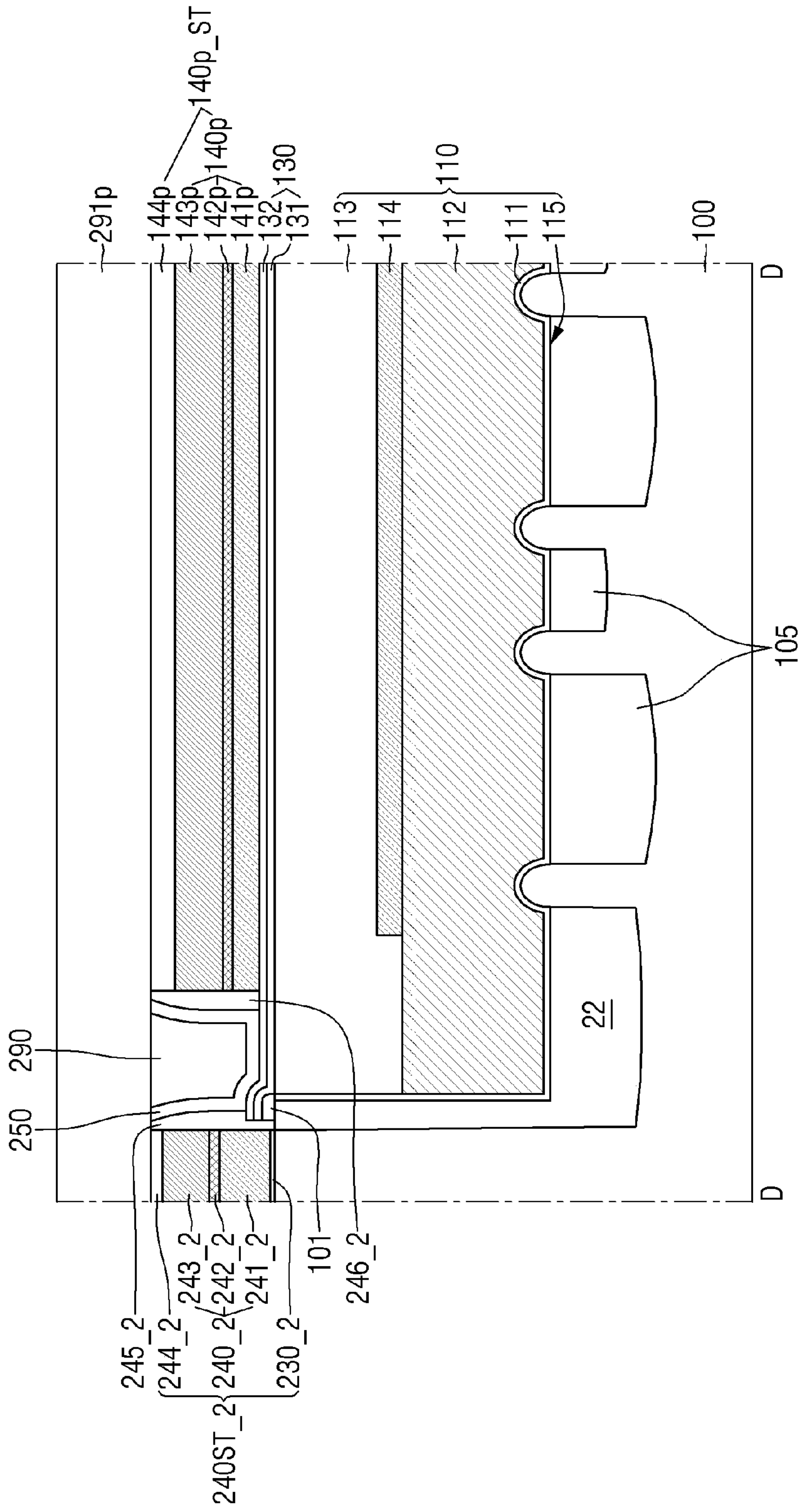
Figure 25E:
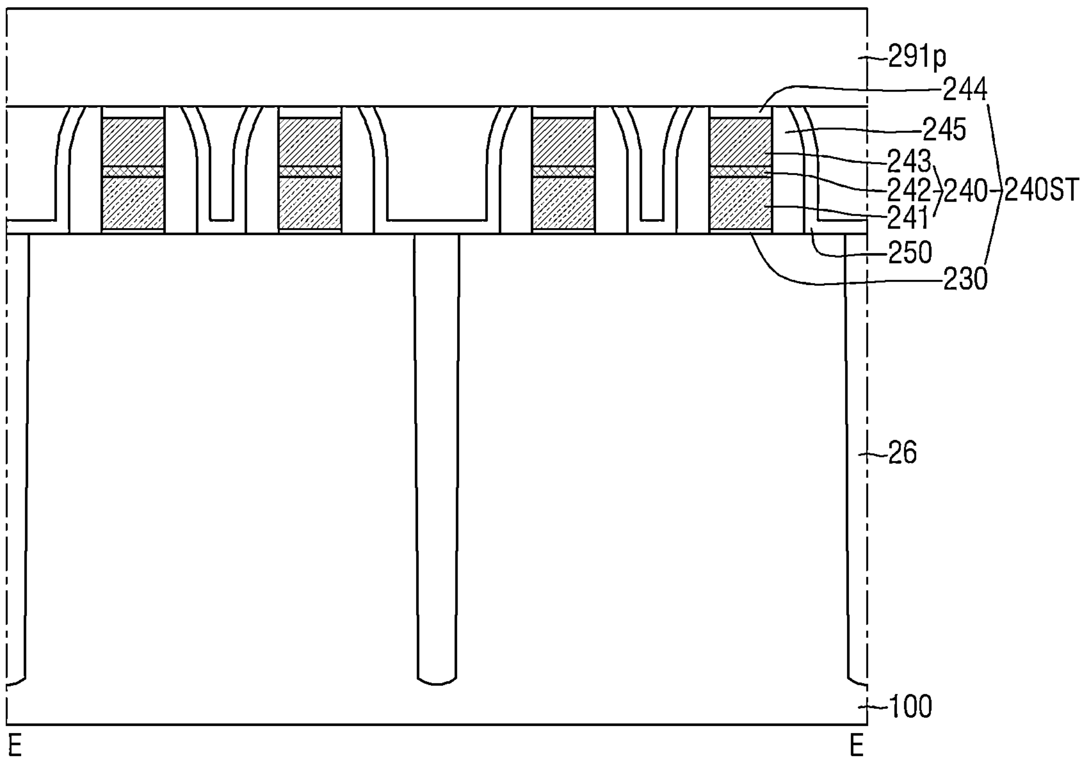
Figure 26A:
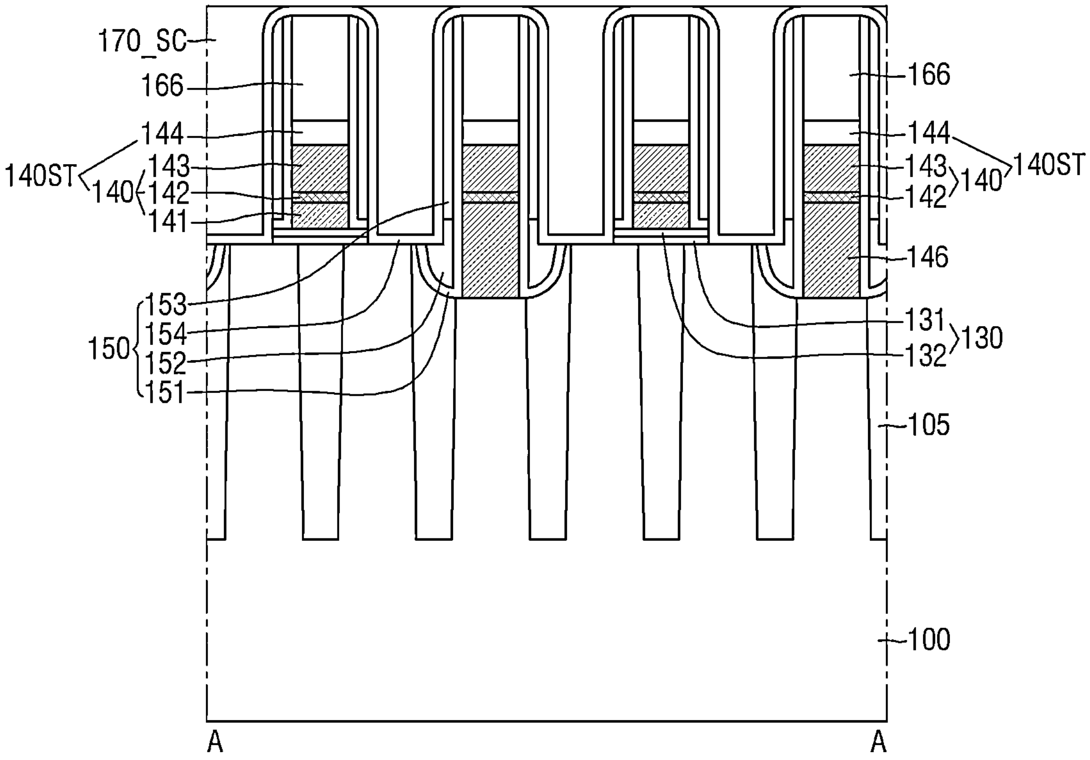
Figure 26B:
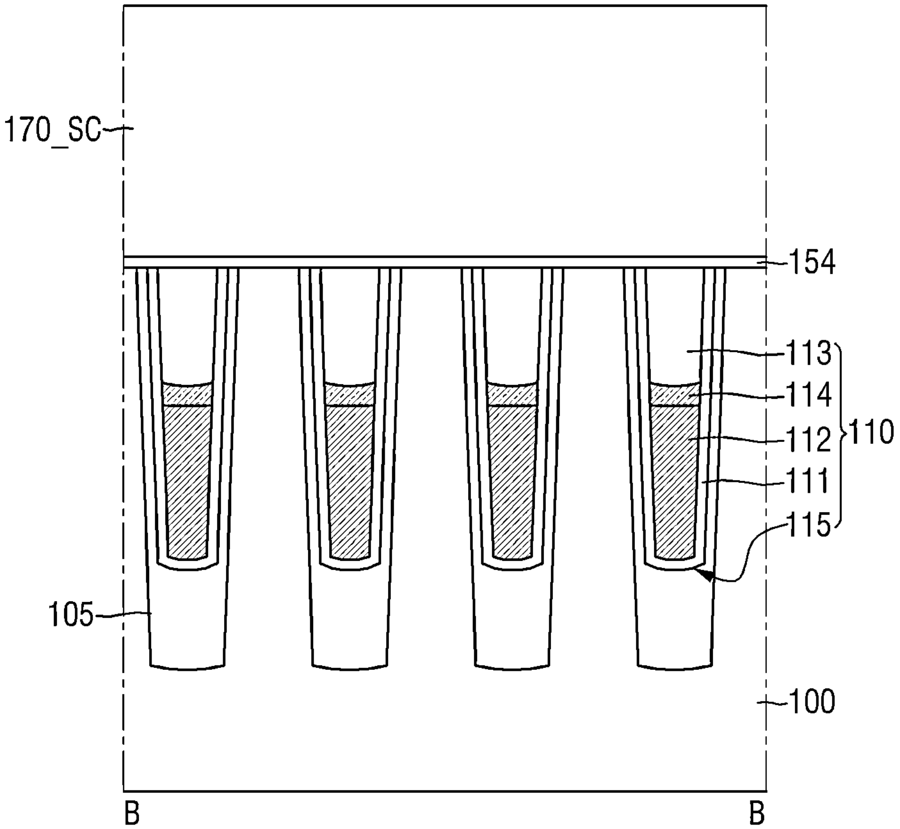
Figure 26C:
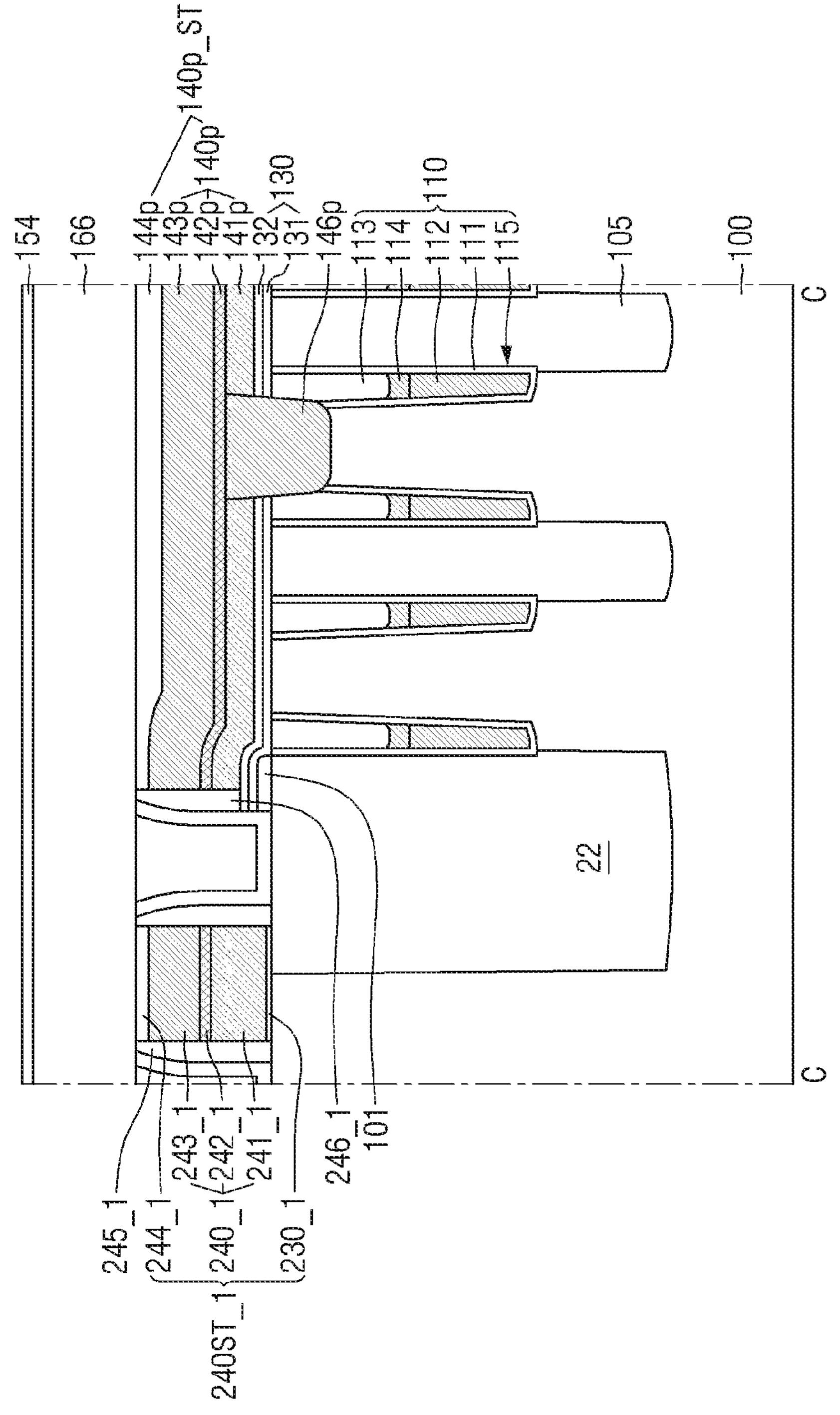
Figure 26D:
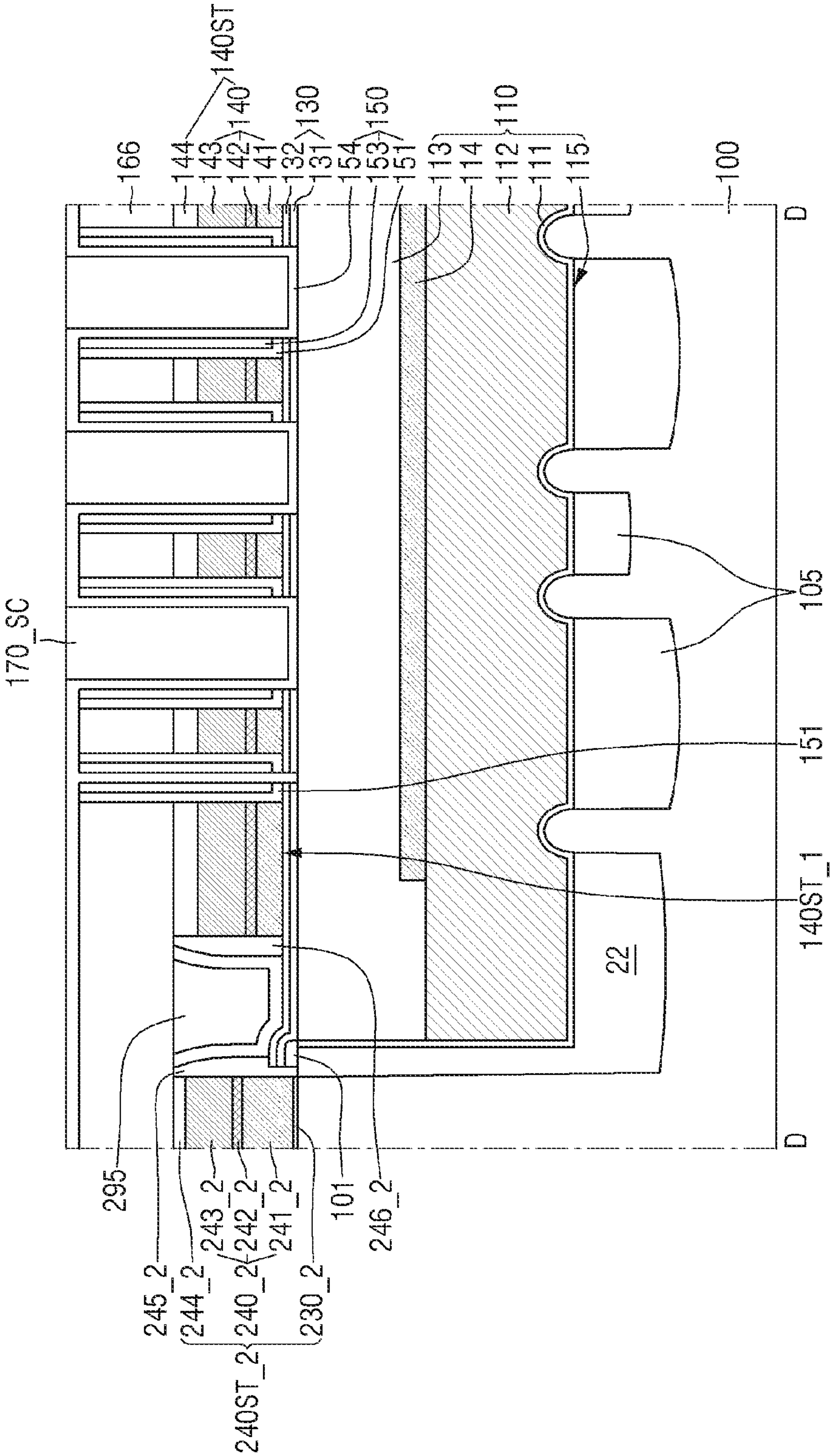
Figure 26E:
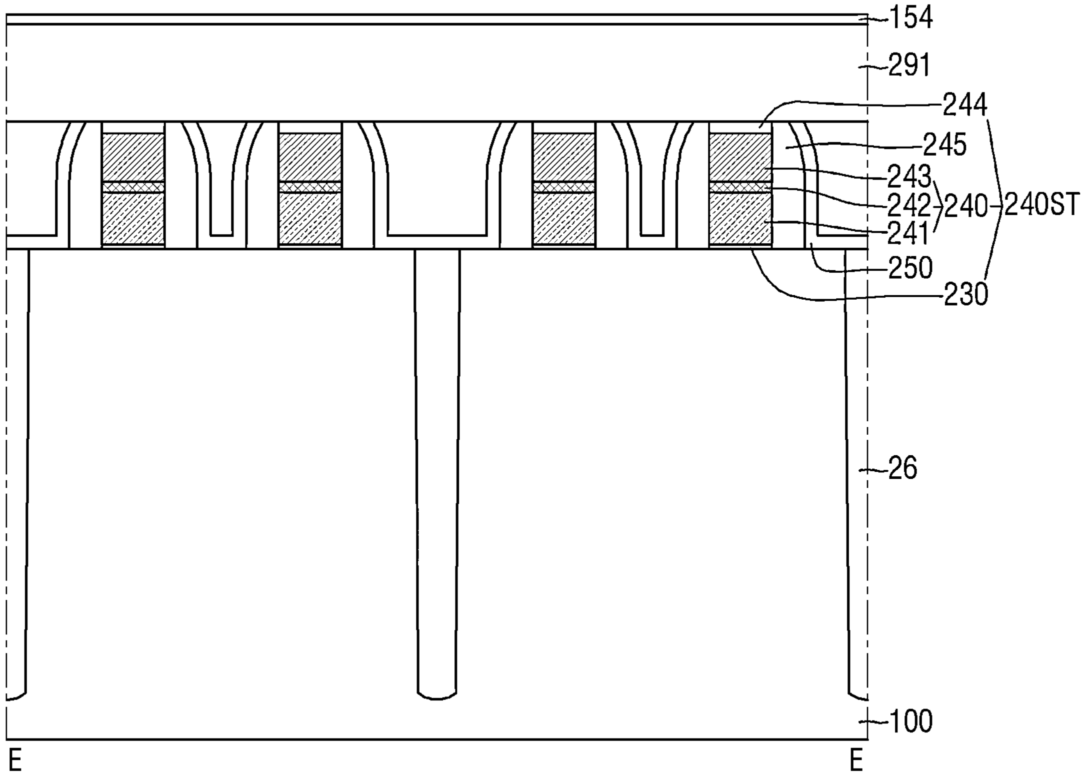

In another example embodiment, the first insulating film 165 may include silicon nitride. The first insulating film 165 may include the same material as that of the second etch stop film 250. In this case, the first insulating film 165 may be a portion remaining after a planarization process is performed on the second etch stop film 250 (refer to FIG. 23*a*).

Referring to FIG. 11, the semiconductor memory device may further include a second insulating film 275 disposed on the peripheral area 24. The second insulating film 275 may be disposed between the peripheral interlayer insulating film 291 and each of the peripheral capping film 244, the peripheral spacer 245, the second etch stop film 250, and the first peripheral insulating film 290. The second insulating film 275 may include silicon oxide.

In some example embodiments, a boundary between the second insulating film 275 and the peripheral interlayer insulating film 291 may be defined. When the second insulating film 275 may include silicon oxide, a boundary between the second insulating film 275 and the peripheral spacer 245 and a boundary between the second insulating film 275 and the first peripheral insulating film 290 may not be defined. In some other example embodiments, a boundary between the second insulating film 275 and the second etch stop film 250 and a boundary between the second insulating film 275 and the peripheral capping film 244 may be defined.

FIG. 12 to FIG. 16 are diagrams for illustrating a semiconductor memory device according to some example embodiments. For the convenience of description, following descriptions are based on differences thereof from the descriptions as set forth above with reference to FIG. 1 to FIG. 8.

Figure 12:
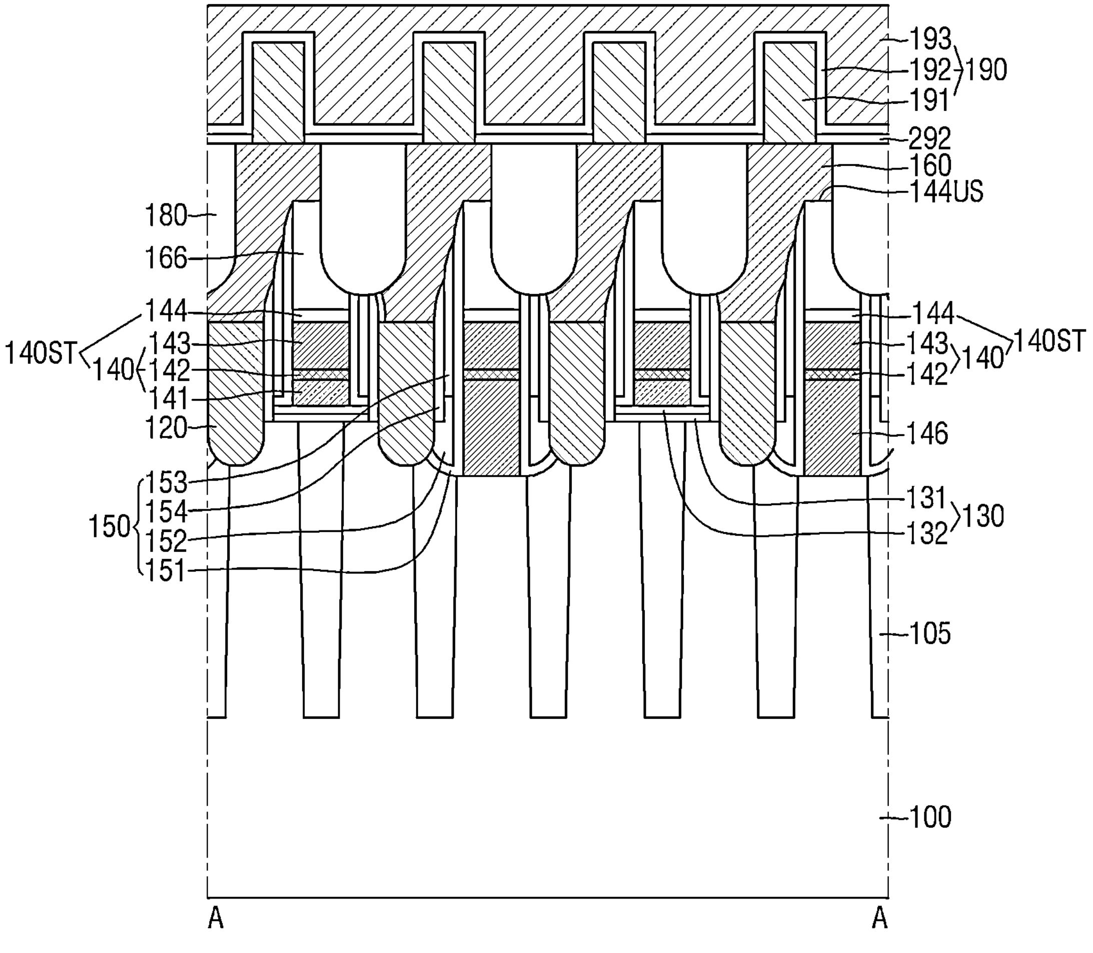
FIG. 12 to FIG. 16 are diagrams for illustrating a semiconductor memory device according to some example embodiments.
Figure 13:
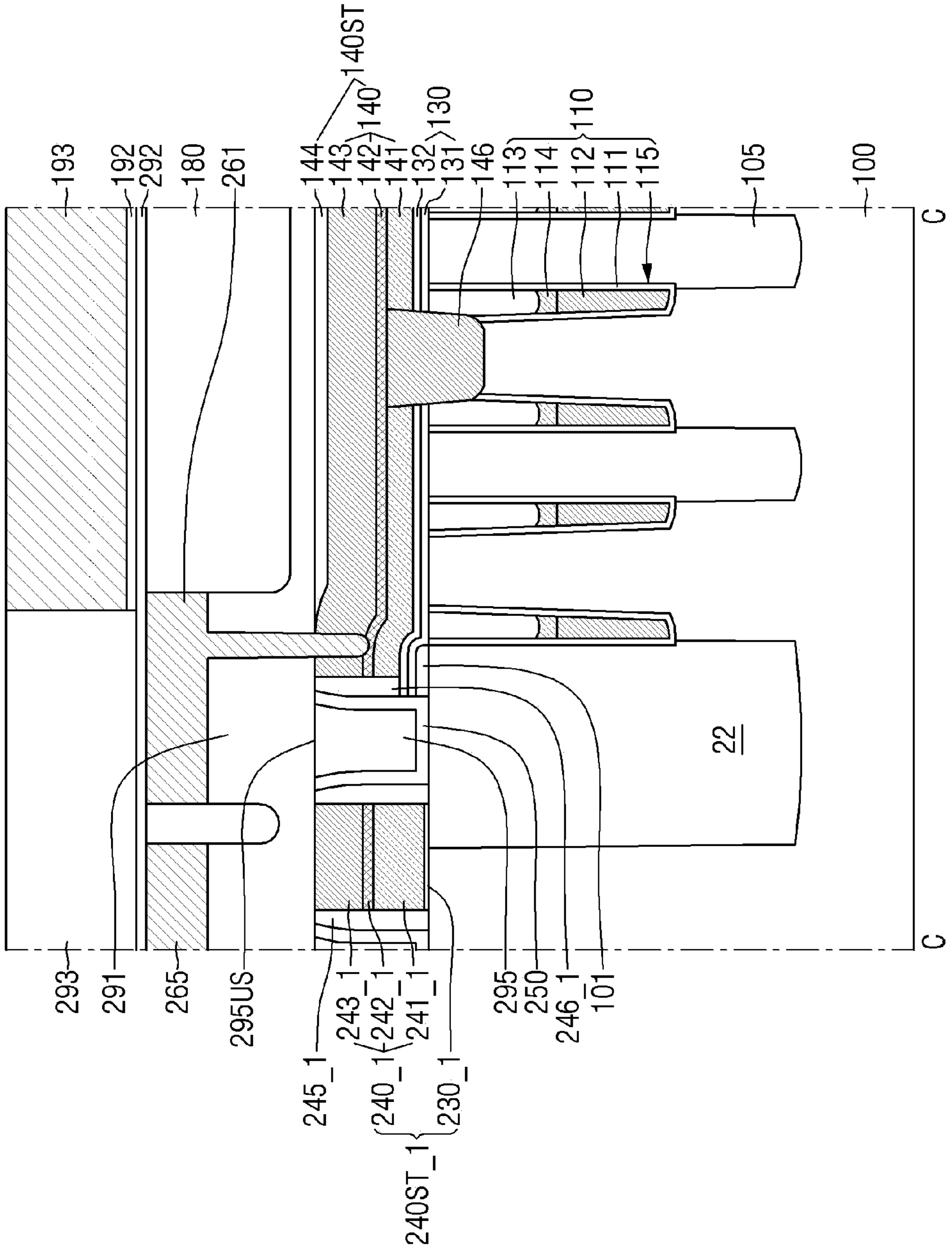
Figure 14:
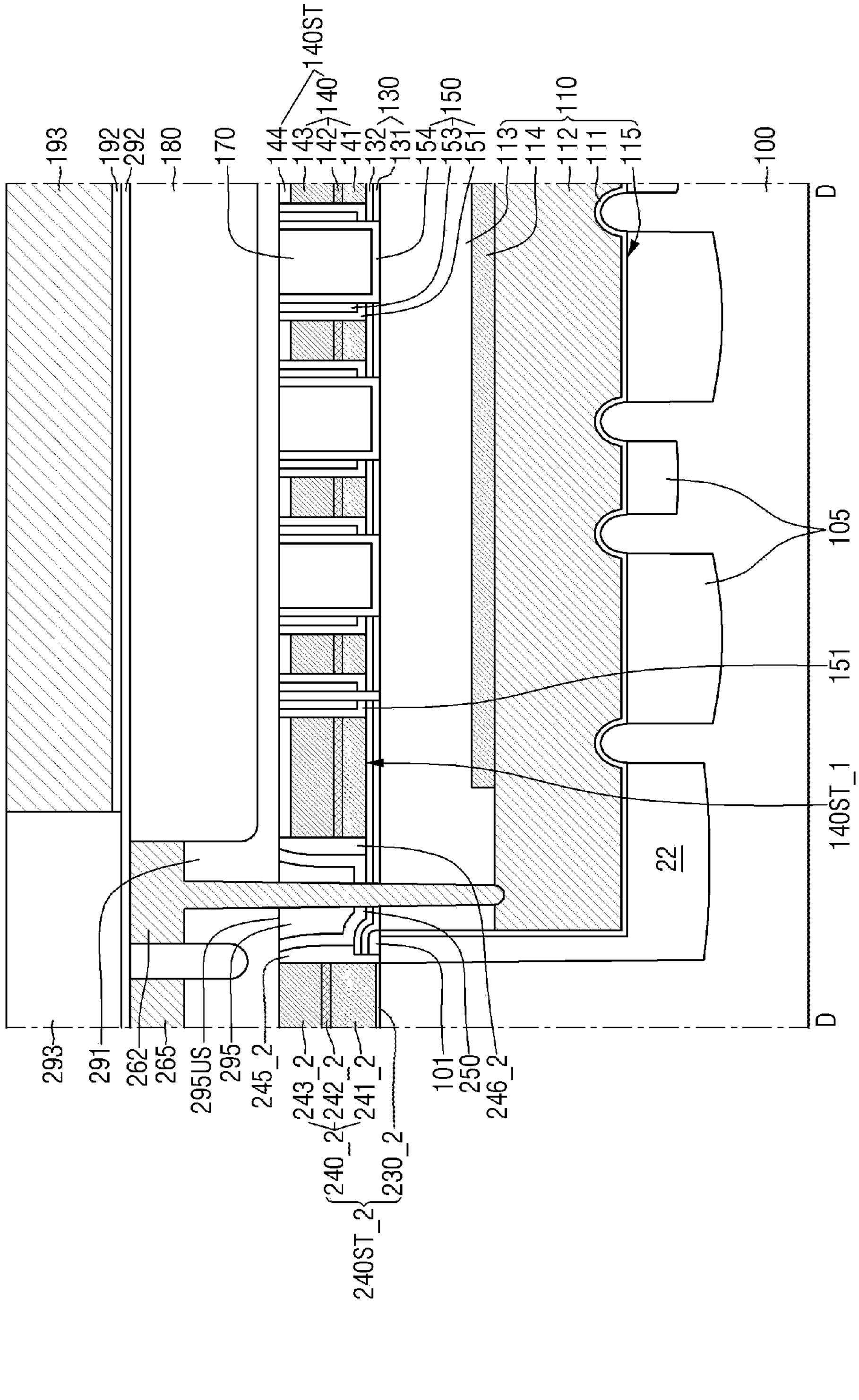
Figure 15:
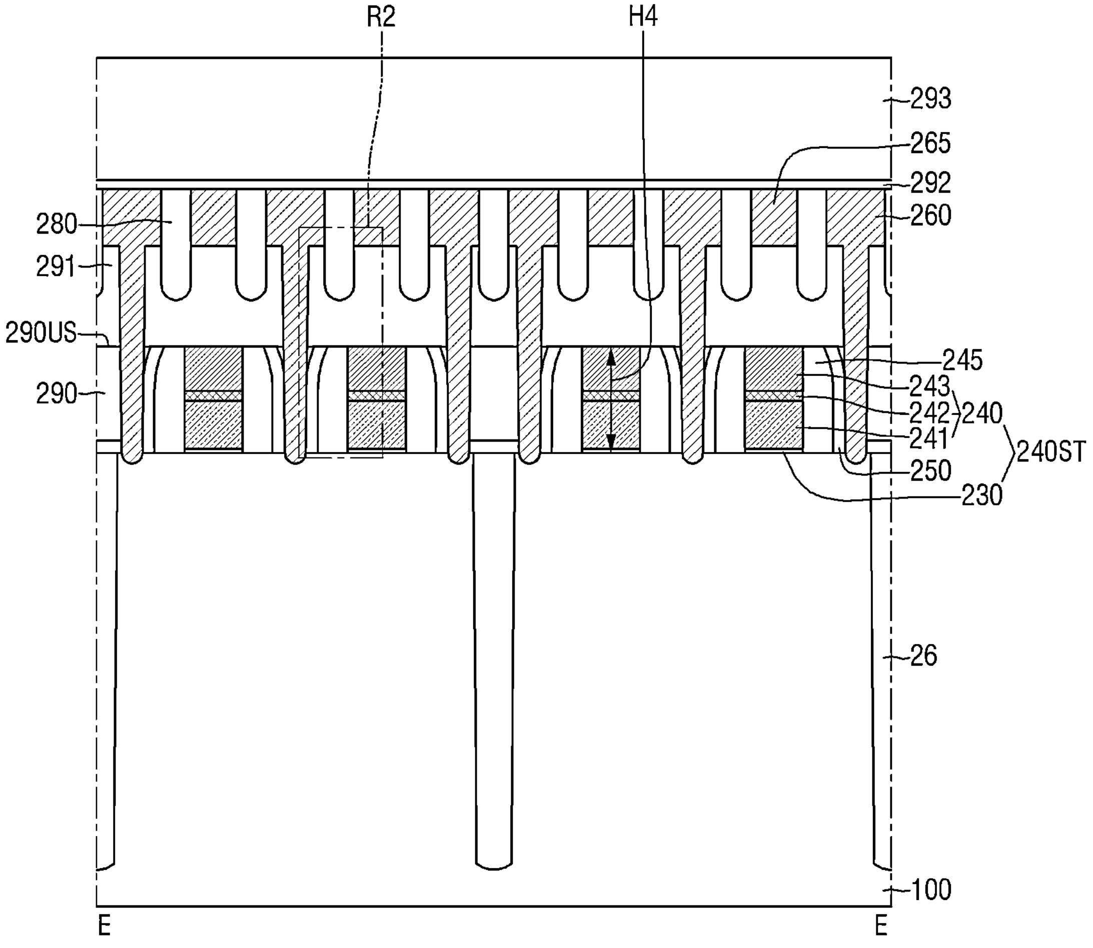
Figure 16:
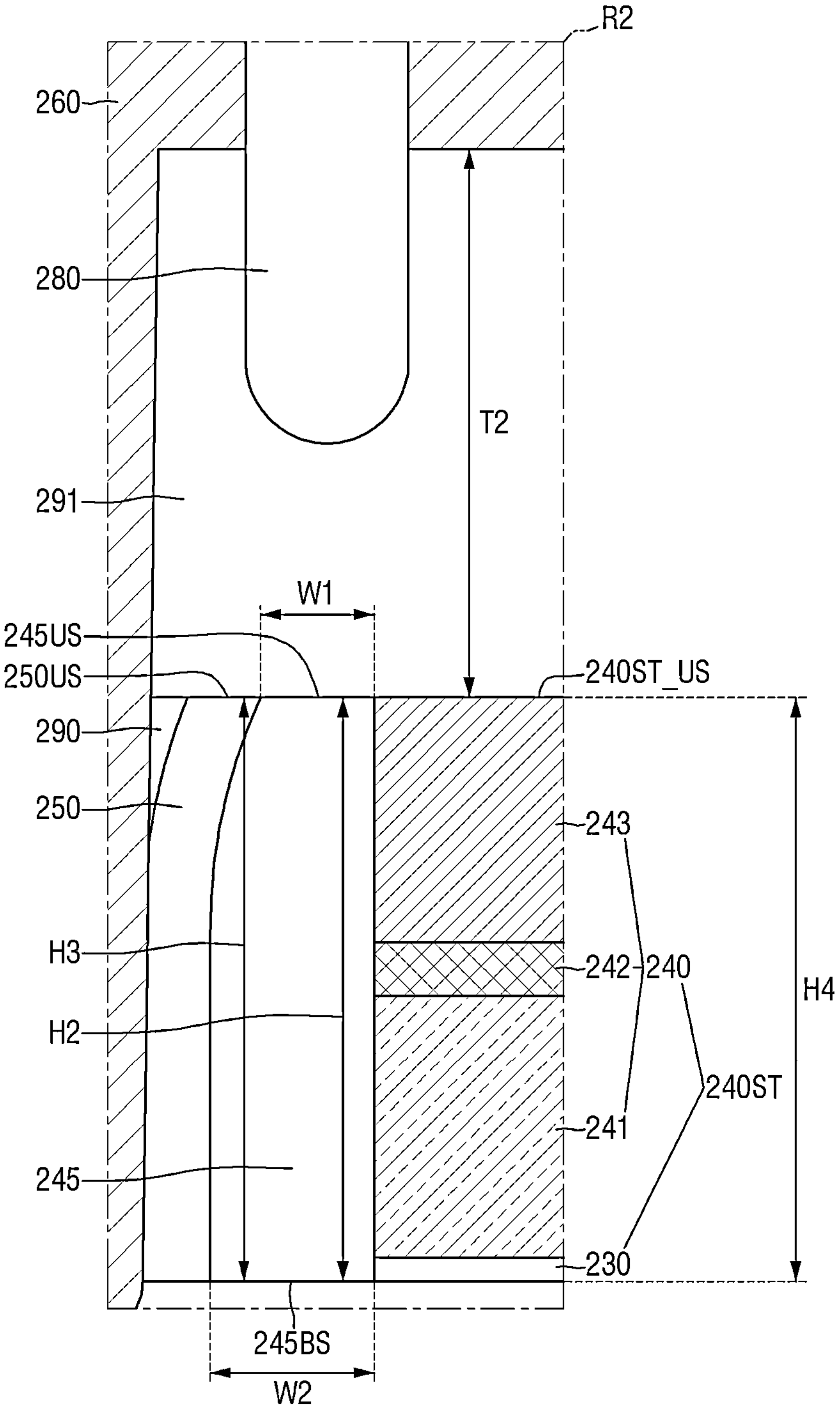

For reference, FIG. 12 is a cross-sectional view taken along A-A of FIG. 1, and FIG. 13 to FIG. 15 are cross-sectional views taken along C-C, D-D, and E-E of FIG. 2, respectively. FIG. 16 is an enlarged view for illustrating a R1 area in FIG. 15.

Referring to FIG. 12 to FIG. 16, the semiconductor memory device may not include the peripheral capping film 244 of FIG. 8.

The upper surface 245US of the peripheral spacer 245 may have the first width W1. The bottom surface 245BS of the peripheral spacer 245 may have the second width W2. Each of the first width W1 and the second width W2 may be a dimension in the first direction D1. In some example embodiments, the second width W2 may be greater than the first width W1. The first width W1 of the upper surface 245US of the peripheral spacer 245 in FIG. 16 may be larger than the first width W1 in FIG. 9, while the second width W2 of the bottom surface 245BS of the peripheral spacer 245 in FIG. 16 may be equal to the second width W2 in FIG. 9.

In some example embodiments, the width of the peripheral spacer 245 may decrease as the peripheral spacer 245 extends toward the upper surface 245US of the peripheral spacer 245. In some example embodiments, a width of a middle portion of the peripheral spacer 245 may be equal to a width of a bottom portion of the peripheral spacer 245. In this case, the width of the peripheral spacer 245 may decrease as the peripheral spacer 245 extends from the middle to a top portion. In this regard, the top portion of the peripheral spacer 245 may be a portion including the upper surface 245US of the peripheral spacer 245.

The peripheral gate structure 240ST may contact the peripheral interlayer insulating film 291. In one example embodiment, an upper surface of the third peripheral conductive film 243 may contact the peripheral interlayer insulating film 291. In another example embodiment, a metal oxide layer may be disposed between the third peripheral conductive film 243 and the peripheral interlayer insulating film 291.

A height from the upper surface of the substrate 100 to the upper surface 240ST_US of the peripheral gate structure 240ST may be a fourth height H4. The upper surface 240ST_US of the peripheral gate structure 240ST may be an upper surface of the third peripheral conductive film 243. That is, the third peripheral conductive film 243 may constitute a top portion of the peripheral gate structure 240ST. The height from the upper surface of the substrate 100 to the upper surface 245US of the peripheral spacer 245 may be the second height H2. The height from the upper surface of the substrate 100 to the topmost level of the second etch stop film 250 may be a third height H3. The second height H2, the third height H3, and the fourth height H4 may be equal to each other.

In some example embodiments, the upper surface 240ST_US of the peripheral gate structure 240ST may be coplanar with the upper surface 245US of the peripheral spacer 245. The upper surface 245US of the peripheral spacer 245 may be coplanar with the upper surface 250US of the second etch stop film 250. The upper surface 250US of the second etch stop film 250 may be coplanar with the upper surface 240ST_US of the peripheral gate structure 240ST. That is, the upper surface 240ST_US of the peripheral gate structure 240ST, the upper surface 245US of the peripheral spacer 245, and the upper surface 250US of the second etch stop film 250 may be coplanar with each other. The upper surface 240ST_US of the peripheral gate structure 240ST, the upper surface 245US of the peripheral spacer 245, and the upper surface 250US of the second etch stop film 250 may be formed at the same level.

Figure 17:
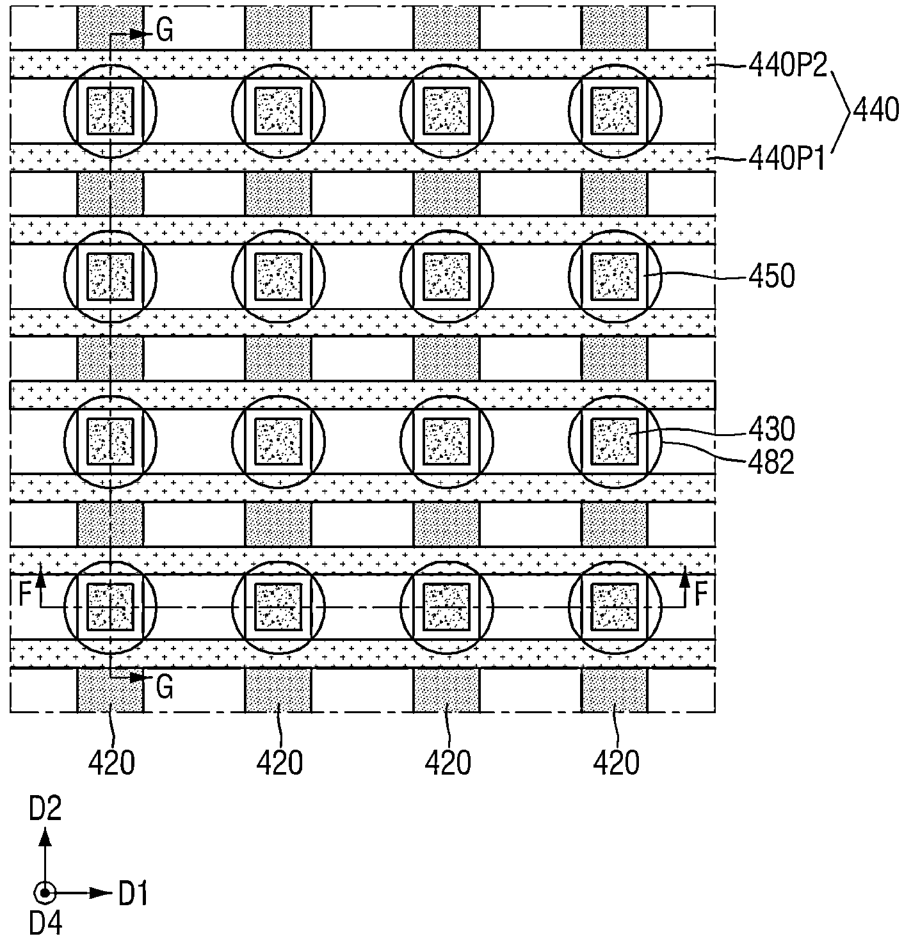
FIG. 17 is a layout diagram for illustrating a semiconductor memory device according to an example embodiment.
Figure 18:
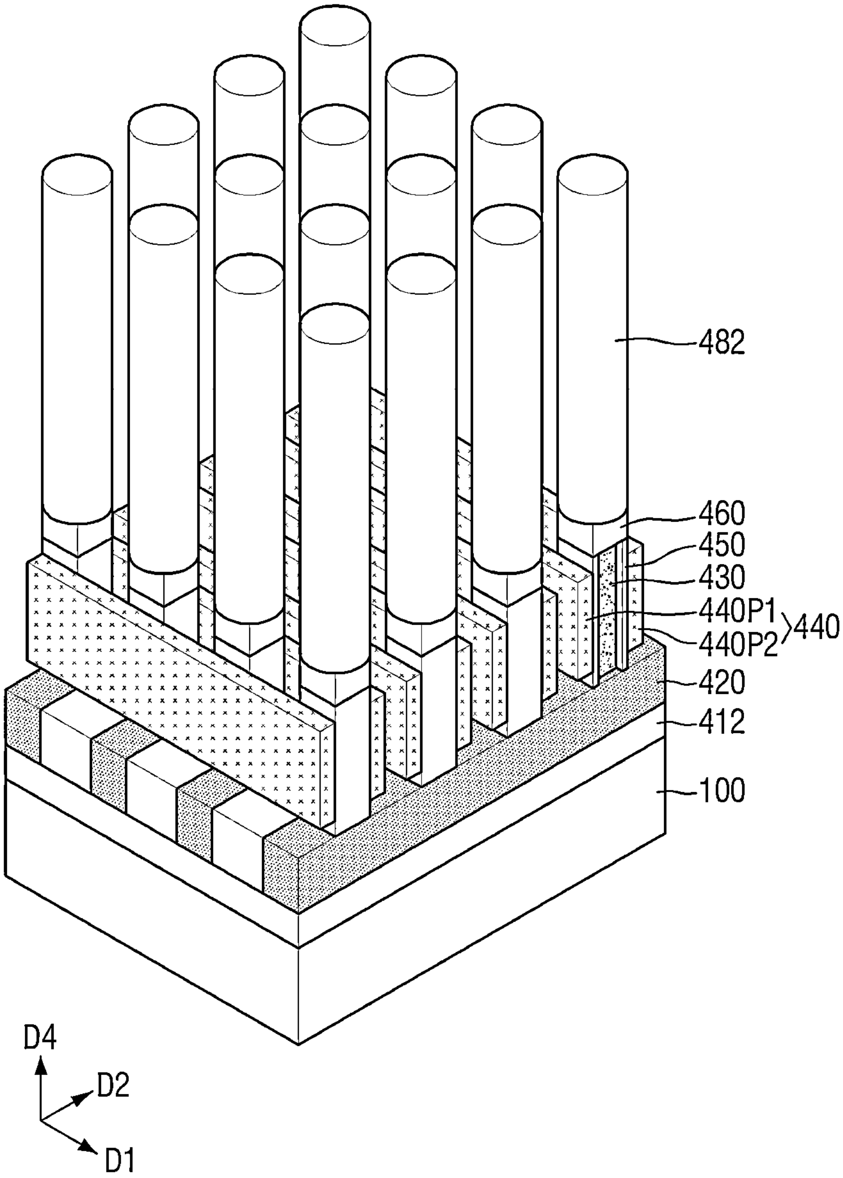
FIG. 18 is a perspective view for illustrating a semiconductor memory device according to an example embodiment.
Figure 19:
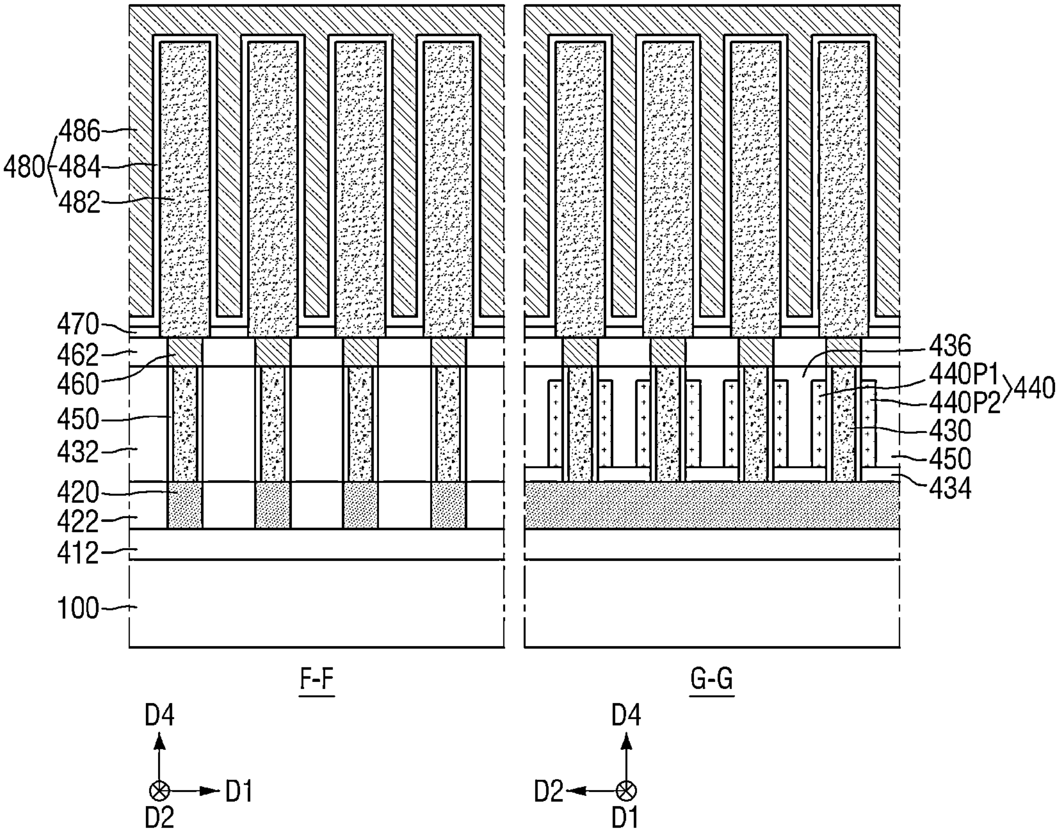
FIG. 19 is a cross-sectional view taken along F-F and G-G in FIG. 17.

FIG. 17 is a layout diagram for illustrating a semiconductor memory device according to an example embodiment. FIG. 18 is a perspective view for illustrating a semiconductor memory device according to an example embodiment. FIG. 19 is a cross-sectional view taken along F-F and G-G in FIG. 17. For reference, FIG. 17 may be an enlarged view of the cell area 20 in FIG. 2. Further, in the semiconductor memory device to which the cell area of FIG. 17 is applied, a cross-section (e.g., a cross-section taken along line C-C or line D-D in FIG. 2) of a boundary portion of the cell area is different from that of each of FIG. 6 and FIG. 7.

Referring to FIG. 17 to FIG. 19, the semiconductor memory device according to an example embodiment may include the substrate 100, a plurality of first conductive lines 420, a channel layer 430, a gate electrode 440, a gate insulating film 450, and a capacitor 480. The semiconductor memory device according to this example embodiment may be a memory device including a vertical channel transistor (VCT). The vertical channel transistor may refer to a structure in which a channel length of the channel layer 430 extends along a vertical direction from the substrate 100.

A lower insulating layer 412 may be disposed on the substrate 100. The plurality of first conductive lines 420 disposed on the lower insulating layer 412 may be spaced apart from each other in the first direction D1 and may extend in the second direction D2. Each of a plurality of first insulating patterns 422 may be disposed on the lower insulating layer 412 so as to fill a space between adjacent ones of the plurality of first conductive lines 420. The plurality of first insulation patterns 422 may extend in the second direction D2. An upper surface of each of the plurality of first insulating patterns 422 may be disposed at the same level as that of a upper surface of each of the plurality of first conductive lines 420. Each of the plurality of first conductive lines 420 may function as a bit-line.

Each of the plurality of first conductive lines 420 may include a doped semiconductor material, a metal, a conductive metal nitride, a conductive metal silicide, a conductive metal oxide, or a combination thereof. For example, each of the plurality of first conductive lines 420 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, example embodiments of the present disclosure are not limited thereto. Each of the plurality of first conductive lines 420 may include a single layer or a stack of multiple layers made of the aforementioned materials. In some example embodiments, each of the plurality of first conductive lines 420 may include graphene, carbon nanotube, or a combination thereof.

The channel layers 430 may be arranged in a matrix form and may be spaced apart from each other in the first direction D1 and the second direction D2 and may be disposed on the plurality of first conductive lines 420. The channel layer 430 may have a first width along the first direction D1 and a first height along a fourth direction D4. The first height may be larger than the first width. For example, the first height may be about 2 to 10 times the first width. However, example embodiments of the present disclosure are not limited thereto. In this regard, the fourth direction D4 intersects the first direction D1 and the second direction D2, and may be, for example, a direction perpendicular to the upper surface of the substrate 100. A bottom portion of the channel layer 430 may function as a first source/drain area (not shown), and a top portion of the channel layer 430 may function as a second source/drain area (not shown), and a portion of the channel layer 430 between the first and second source/drain areas may function as a channel area (not shown).

In some example embodiments, the channel layer 430 may include an oxide semiconductor. For example, the oxide semiconductor may include $In_xGa_yZn_2O$, $In_xGa_ySi_zO$, $In_xSn_yZn_2O$, $In_xZn_yO$, $Zn_xO$, $Zn_xSn_yO$, $Zn_xO_yN$, $Zr_xZn_ySn_2O$, $Sn_xO$, $Hf_xIn_yZn_2O$, $Ga_xZn_ySn_zO$, $Al_xZn_ySn_2O$, $Yb_xGa_yZn_2O$, $In_xGa_yO$ or combinations thereof. The channel layer 430 may include a single layer or multiple layers made of the oxide semiconductor. In some example embodiments, the channel layer 430 may have a bandgap energy greater than that of silicon. For example, the channel layer 430 may have a bandgap energy of about 1.5 eV to about 5.6 eV. For example, the channel layer 430 may have optimal (or alternatively, desirable) channel performance when it has a bandgap energy of about 2.0 eV to 4.0 eV. For example, the channel layer 430 may be made of polycrystalline or amorphous material. However, example embodiments of the present disclosure are not limited thereto. In some example embodiments, the channel layer 430 may include a two-dimensional (2D) semiconductor material. For example, the 2D semiconductor material may include graphene, carbon nanotubes, or a combination thereof.

The gate electrode 440 may extend in the first direction D1 and may be disposed on each of both opposing sidewalls of the channel layer 430. The gate electrode 440 may include a first sub-gate electrode 440P1 facing a first sidewall of the channel layer 430 and a second sub-gate electrode 440P2 facing a second sidewall opposite to the first sidewall of the channel layer 430. As one channel layer 430 is disposed between the first sub-gate electrode 440P1 and the second sub-gate electrode 440P2, the semiconductor device may have a dual gate transistor structure. However, example embodiments of the present disclosure are not limited thereto, and the second sub-gate electrode 440P2 may be omitted and only the first sub-gate electrode 440P1 facing the first sidewall of the channel layer 430 may be formed to achieve a single gate transistor structure. A material of the gate electrode 440 may be the same as that of the cell gate electrode 112.

The gate insulating film 450 surrounds a sidewall of the channel layer 430 and may be interposed between the channel layer 430 and the gate electrode 440. For example, as shown in FIG. 17, an entirety of the sidewall of the channel layer 430 may be surrounded with the gate insulating film 450, or a portion of the sidewall of the gate electrode 440 may be in contact with the gate insulating film 450. In some example embodiments, the gate insulating film 450 may extend in an extension direction of the gate electrode 440, that is, the first direction D1, and only two sidewalls facing the gate electrode 440 among the sidewalls of the channel layer 430 may be in contact with the gate insulating layer 450. In some example embodiments, the gate insulating film 450 may include at least one of a silicon oxide film, a silicon oxynitride film, a film made of a high-k material having a higher dielectric constant than that of silicon oxide, or combinations thereof.

A plurality of second insulating patterns 432 may be disposed on the plurality of first insulating patterns 422, respectively, and may extend along the second direction D2. The channel layer 430 may be disposed between two adjacent second insulating patterns 432 among the plurality of second insulating patterns 432. Further, a first buried layer 434 and a second buried layer 436 may be disposed between two adjacent second insulating patterns 432 and in a space between two adjacent channel layers 430. The first buried layer 434 may be disposed at a bottom portion of the space between two adjacent channel layers 430, and the second buried layer 436 may be formed on the first buried layer 434 so as to fill the remainder of the space between two adjacent channel layers 430. An upper surface of the second buried layer 436 may be coplanar with a upper surface of the channel layer 430, and the second buried layer 436 may cover a upper surface of the gate electrode 440. In some example embodiments, the plurality of second insulating patterns 432 may be continuous and monolithic with the plurality of first insulating patterns 422, respectively, or the second buried layer 436 may be continuous and monolithic with the first buried layer 434.

A capacitor contact 460 may be disposed on the channel layer 430. The capacitor contact 460 may vertically overlap the channel layer 430. The capacitor contacts 460 may be arranged in a matrix form and may be spaced apart from each other in the first direction D1 and the second direction D2. The capacitor contact 460 may be made of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. However, example embodiments of the present disclosure are not limited thereto. An upper insulating layer 462 may surround a sidewall of the capacitor contact 460 and may be disposed on the plurality of second insulating patterns 432 and the second buried layer 436.

A third etch stop film 470 may be disposed on the upper insulating layer 462. The capacitor 480 may be disposed on the third etch stop film 470. The capacitor 480 may include a second lower electrode 482, a second capacitor dielectric film 484 and a second upper electrode 486. The second lower electrode 482 may extend through the etch stop film 470 so as to be electrically connected to an upper surface of the capacitor contact 460. The second lower electrode 482 may be formed in a pillar type extending in the fourth direction D4. However, example embodiments of the present disclosure are not limited thereto. In some example embodiments, the second lower electrode 482 may vertically overlap the capacitor contact 460. The second lower electrodes 482 may be arranged in a matrix form and may be spaced apart from each other in the first direction D1 and the second direction D2. In some example embodiments, a landing pad (not shown) may be further disposed between the capacitor contact 460 and the second lower electrode 482 so that the second lower electrodes 482 may be arranged in a hexagonal shape.

Figure 20:
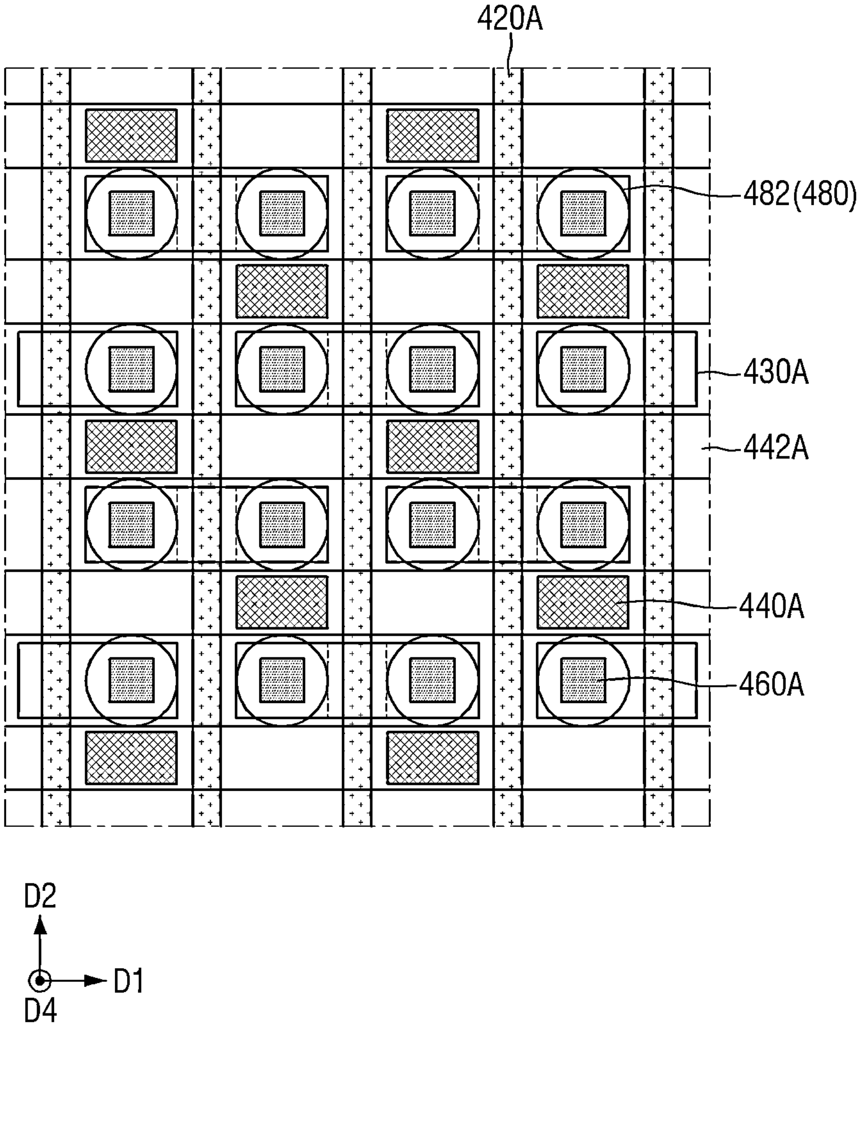
FIG. 20 is a layout diagram for illustrating a semiconductor memory device according to an example embodiment.
Figure 21:
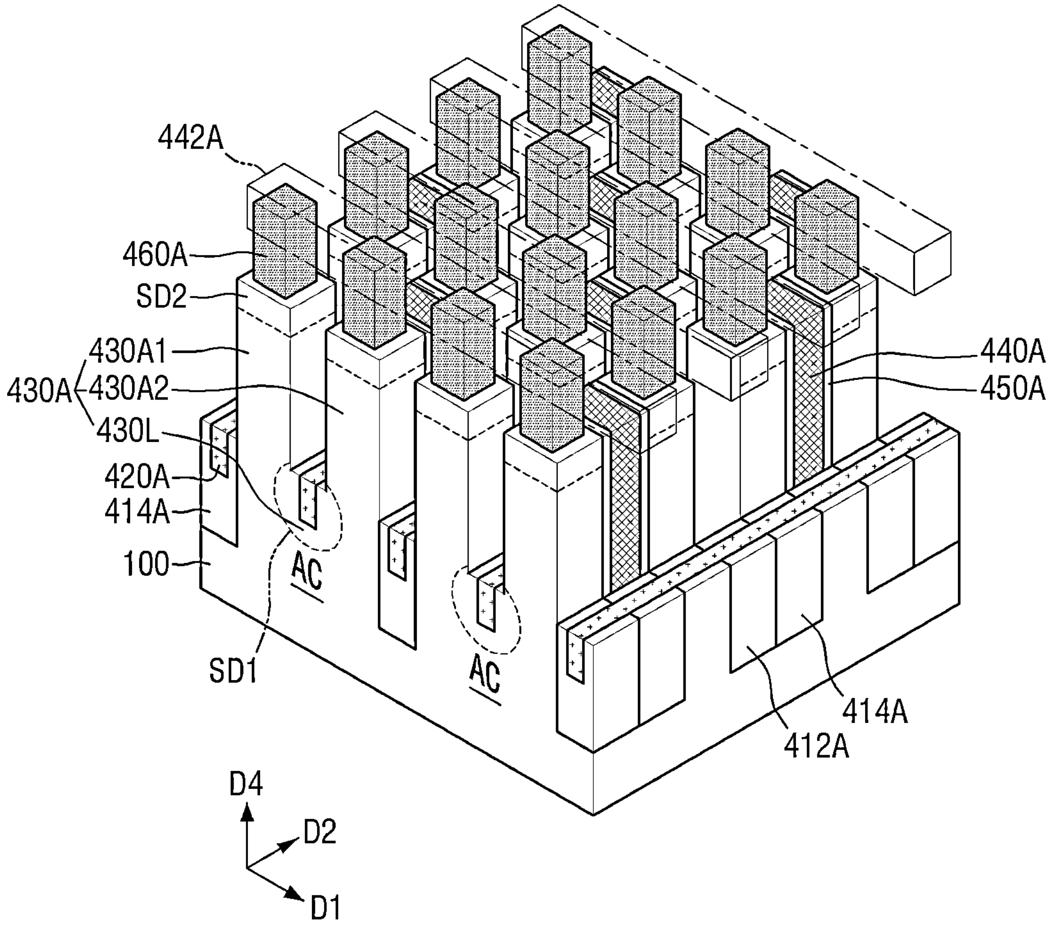
FIG. 21 is a perspective view for illustrating a semiconductor memory device according to an example embodiment.
Figure 22:
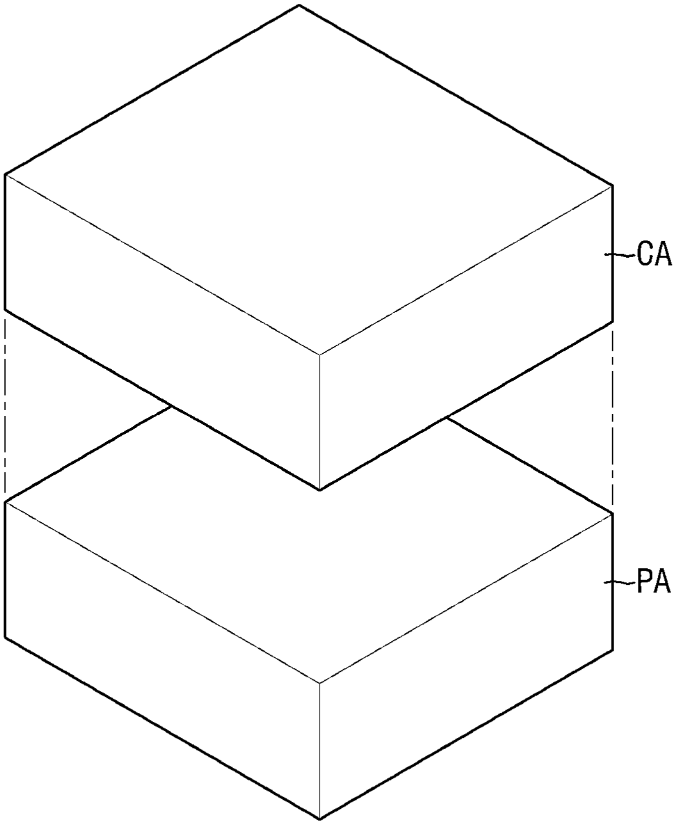
FIG. 22 is a diagram for illustrating a semiconductor memory device according to an example embodiment.

FIG. 20 is a layout diagram for illustrating a semiconductor memory device according to an example embodiment. FIG. 21 is a perspective view for illustrating a semiconductor memory device according to an example embodiment. FIG. 22 is a diagram for illustrating a semiconductor memory device according to an example embodiment.

Referring to FIG. 20 and FIG. 21, the semiconductor memory device according to some example embodiments may include the substrate 100, a plurality of first conductive lines 420A, a channel structure 430A, a contact gate electrode 440A, a plurality of second conductive lines 442A, and the capacitor 480. The semiconductor memory device according to some example embodiments may be a memory device including a vertical channel transistor (VCT).

A plurality of second active areas AC may be defined by a first element isolation pattern 412A and a second element isolation pattern 414A in the substrate 100. The channel structure 430A may be disposed in each second active area AC. The channel structure 430A may include a first active pillar 430A1 and a second active pillar 430A2 extending in a vertical direction, and a connective portion 430L connected to a bottom portion of the first active pillar 430A1 and a bottom portion of the second active pillar 430A2. A first source/drain area SD1 may be disposed in the connective portion 430L. A second source/drain area SD2 may be disposed at a top portion of each of the first and second active pillars 430A1 and 430A2. Each of the first active pillar 430A1 and the second active pillar 430A2 may constitute an independent unit memory cell.

The plurality of first conductive lines 420A may extend so as to intersect the plurality of second active areas AC. For example, the plurality of first conductive lines 420A may extend in the second direction D2. One first conductive line 420A of the plurality of first conductive lines 420A may be disposed on the connective portion 430L and between the first active pillar 430A1 and the second active pillar 430A2, and may be disposed on the first source/drain area SD1. Another first conductive line 420A adjacent to said one first conductive line 420A may be disposed between two channel structures 430A. One first conductive line 420A among the plurality of first conductive lines 420A may function as a common bit-line of two unit memory cells including the first active pillar 430A1 and the second active pillar 430A2, respectively, and disposed on both opposing sides of said one first conductive line 420A.

One contact gate electrode 440A may be disposed between two channel structures 430A adjacent to each other in the second direction D2. For example, the contact gate electrode 440A may be disposed between the first active pillar 430A1 included in one channel structure 430A and the second active pillar 430A2 of another channel structure 430A adjacent thereto. One contact gate electrode 440 may be shared by the first active pillar 430A1 and the second active pillar 430A2 disposed on both sidewalls thereof, respectively. A gate insulating layer 450A may be disposed between the contact gate electrode 440A and the first active pillar 430A1 and between the contact gate electrode 440A and the second active pillar 430A2. The plurality of second conductive lines 442A may extend in the first direction D1 and may be disposed on an upper surface of the contact gate electrode 440A. Each of the plurality of second conductive lines 442A may function as a word-line of the semiconductor device.

A capacitor contact 460A may be disposed on the channel structure 430A. The capacitor contact 460A may be disposed on the second source/drain area SD2. The capacitor structure 400 may be disposed on the capacitor contact 460A.

Referring to FIG. 22, the semiconductor memory device according to an example embodiment may have a COP (Cell on Peri) structure in which a cell array area CA is disposed on a peripheral structure area PA. The peripheral structure area PA may correspond to the peripheral area 24 of FIG. 1 to FIG. 8. The cell array area CA may include the vertical channel transistor (VCT) of FIG. 17 to FIG. 21.

FIG. 23*a* to FIG. 27*b* are diagrams of intermediate structures corresponding to intermediate steps for illustrating a method for manufacturing a semiconductor memory device according to an example embodiment. In the description of the manufacturing method, duplicate descriptions with those as set forth above using FIG. 1 to FIG. 9 are briefly set forth or omitted.

Referring to FIG. 1, FIG. 2, and FIG. 23*a* to FIG. 23*e*, the substrate 100 including the cell area 20, the peripheral area 24, and the cell area isolation film 22 is provided.

The cell gate structure 110 may be formed in the substrate 100 and in the cell area 20. The cell gate structure 110 may extend in an elongate manner in the first direction D1. The cell gate structure 110 may include the cell gate insulating film 111, the cell gate electrode 112, the cell gate capping pattern 113, and the cell gate capping conductive film 114 in the cell gate trench 115.

Subsequently, the cell insulating film 130 may be formed on the cell area 20. The cell insulating film 130 may expose a portion the substrate 100 disposed in the peripheral area 24. Subsequently, a cell conductive film structure 140*p*_ST may be formed on the substrate 100 and in the cell area 20. The cell conductive film structure 140*p*_ST may be formed on the cell insulating film 130. Further, a pre-bit-line contact 146*p* may be formed between the cell conductive film structure 140*p*_ST and the substrate 100. The pre-bit-line contact 146*p* may connect the cell conductive film structure 140*p*_ST and the substrate 100 to each other.

The cell conductive film structure 140*p*_ST may include a pre-cell conductive film 140*p* and a pre-cell line capping film 144*p* which are sequentially stacked on the cell insulating film 130. The first cell boundary spacer 246_1 and the second cell boundary spacer 246_2 may be formed on a sidewall of the cell conductive film structure 140*p*_ST.

The peripheral gate structure 240ST may be formed on the substrate 100 and in the peripheral area 24. The peripheral gate structure 240ST may include the peripheral gate insulating film 230, the peripheral gate conductive film 240, and the peripheral capping film 244. The peripheral spacer 245 may be formed on the sidewall of the peripheral gate structure 240ST.

Further, the first block conductive structure 240ST_1 and the second block conductive structure 240ST_2 may be formed on the substrate 100.

The cell conductive film structure 140*p*_ST may be formed simultaneously with formation of the peripheral gate structure 240ST. For example, the cell conductive film structure 140*p*_ST may be formed simultaneously with formation of the peripheral gate insulating film 230, the peripheral gate conductive film 240, and the peripheral capping film 244. The first cell boundary spacer 246_1 and the second cell boundary spacer 246_2 may be formed simultaneously with formation of the peripheral spacer 245.

Then, the second etch stop film 250 may be formed on the substrate 100. The second etch stop film 250 may be formed on the cell conductive film structure 140*p*_ST, the peripheral gate structure 240ST, the first block conductive structure 240ST_1, and the second block conductive structure 240ST_2. The second etch stop film 250 may extend along a profile of the cell conductive film structure 140*p*_ST, a profile of the peripheral gate structure 240ST, a profile of the first block conductive structure 240ST_1, and a profile of the second block conductive structure 240ST_2.

Subsequently, a first peripheral insulating film 290*p* may be formed on the second etch stop film 250. The first peripheral insulating film 290*p* may entirely cover the second etch stop film 250. The first peripheral insulating film 290*p* may include, for example, an oxide-based insulating material.

Referring to FIG. 24*a* to FIG. 24*e*, an upper surface of the cell conductive film structure 140*p*_ST, a portion of each of the first peripheral insulating film 290*p* and the second etch stop film 250 disposed on an upper surface of the peripheral gate structure 240ST, a portion of the peripheral spacer 245, and a portion of the first pre-cell line capping film 144*p* may be removed.

For example, the first peripheral insulating film 290*p* may be removed using a planarization process. The planarization process may be, for example, a chemical mechanical polishing process (CMP). The first peripheral insulating film 290*p* may be removed using a planarization process, such that the cell conductive film structure 140*p*_ST on the cell area 20 may be exposed. Further, the second etch stop film 250 on the cell area isolation film 22 may be exposed, and the first peripheral insulating film 290 may be formed.

Further, the peripheral gate structure 240ST may be formed by removing a portion of the second etch stop film 250 and a portion of the peripheral spacer 245 on the peripheral area 24 using a planarization process. The peripheral capping film 244, the peripheral spacer 245, and the second etch stop film 250 on the peripheral area 24 may be exposed. In other words, the upper surface of the peripheral capping film 244, the upper surface 245US of the peripheral spacer 245, and the upper surface 250US of the second etch stop film 250 may be formed using a chemical mechanical polishing process. The upper surface of the peripheral capping film 244 may be the upper surface 240ST_US of the peripheral gate structure 240ST. Vertical levels of the upper surface 240ST_US of the peripheral gate structure 240ST, the upper surface 245US of the peripheral spacer 245, and the upper surface 250US of the second etch stop film 250 based on the upper surface of the substrate 100 may be the same.

As the portion of the second etch stop film 250 on the peripheral area 24 is removed, the second etch stop film 250 may not be disposed on the upper surface 244US of the peripheral capping film 244. In other words, the second etch stop film 250 may not overlap the peripheral capping film 244 in a direction perpendicular to the upper surface of the substrate 100.

In some example embodiments, depending on a depth of the planarization process, the second etch stop film 250 on the cell area 20 may not be entirely removed. In this case, a portion of the second etch stop film 250 on the cell area 20 may be removed to form the first insulating film 165 of FIG. 10.

Unlike what is shown, in some example embodiments, depending on the depth of the planarization process, the first pre-cell line capping film 144*p* on the peripheral area 24 may be entirely removed so that the peripheral capping film 244 may not be formed. In this case, the semiconductor memory device may be the same as shown in FIG. 12 to FIG. 16.

Referring to FIG. 25*a* to FIG. 25*e*, a pre-interlayer insulating film 291*p* may be formed on the pre-cell line capping film 144*p* on the cell area 20 and on the peripheral capping film 244 on the peripheral area 24. The pre-interlayer insulating film 291*p* may cover the peripheral spacer 245, the second etch stop film 250, and the first peripheral insulating film 290.

Referring to FIG. 26*a* to FIG. 26*e*, the cell conductive film structure 140*p*_ST, a portion of the pre-interlayer insulating film 291*p* on the cell area 20, and the second etch stop film 250 may be patterned such that the bit-line structure 140ST extending in an elongate manner in the second direction D2 may be formed.

A portion of the pre-interlayer insulating film 291*p* on the cell area 20 may be patterned to form the cell interlayer insulating film 166. The cell interlayer insulating film 166 may be disposed on the bit-line structure 140ST.

While the bit-line structure 140ST is being formed, the bit-line contact 146 may be formed.

Subsequently, the cell line spacer 150 may be formed. The fourth cell line spacer 154 of the cell line spacer 150 may be formed on an upper surface of the bit-line structure 140ST and on a portion of the peripheral interlayer insulating film 291 on the peripheral area 24.

Subsequently, a fence sacrificial insulating film 170_SC may be formed between bit-line structures 140ST adjacent to each other in the first direction D1. The fence sacrificial insulating film 170_SC may be formed on the fourth cell line spacer 154.

Figure 27A:
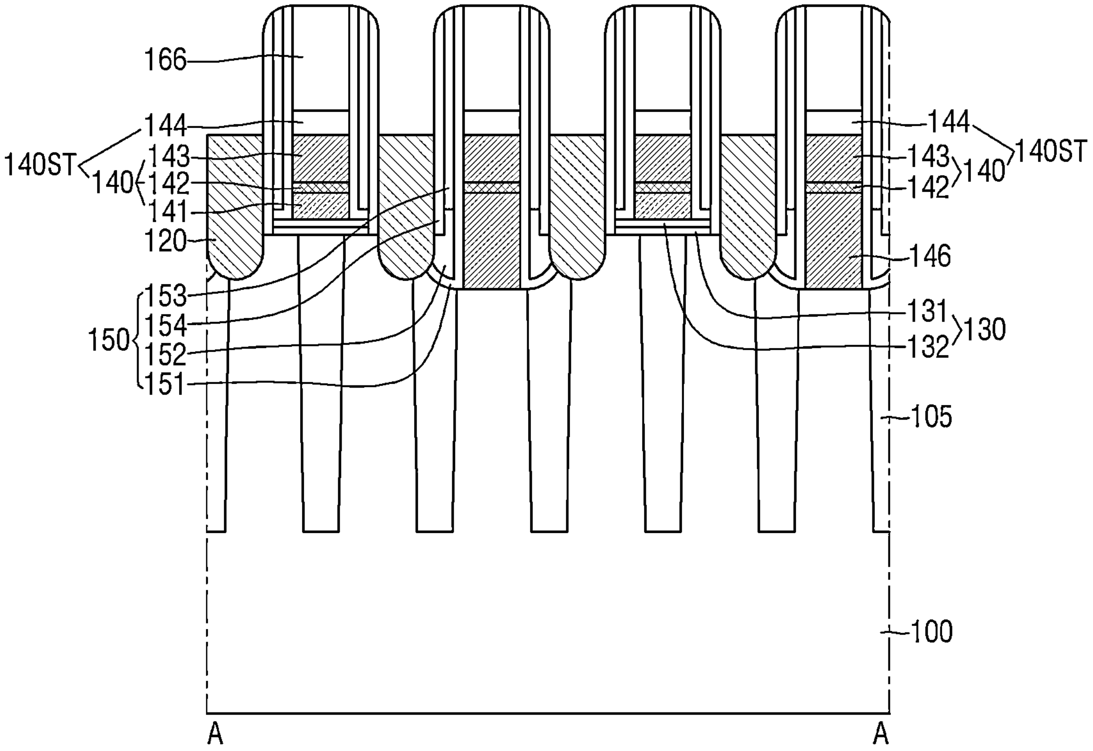
Figure 27B:
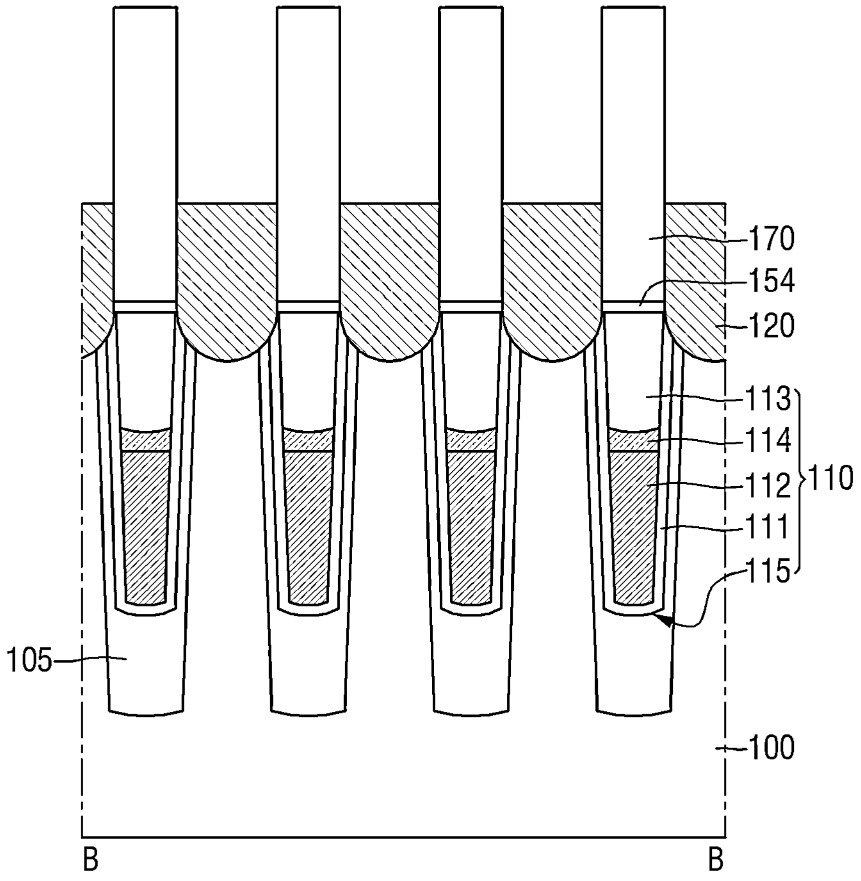

Referring to FIG. 27*a* and FIG. 27*b*, the fence sacrificial insulating film 170_SC may be patterned such that the fence pattern 170 may be formed on the cell gate structure 110.

After the fence pattern 170 has been formed, the storage contact 120 may be formed between adjacent cell conductive lines 140 and between fence patterns 170 adjacent to each other in the second direction D2.

In FIG. 4 to FIG. 8, after the storage contact 120 has been formed, the storage pad 160, the peripheral contact plug 260, the peripheral wiring line 265, the bit-line contact plug 261, and the cell gate contact plug 262 may be formed.

Subsequently, the first etch stop film 292 may be formed. Further, the information storage 190 may be formed.

Although some example embodiments of the present disclosure have been described with reference to the accompanying drawings, the present disclosure is not limited to the above example embodiments, but may be implemented in various different forms. A person skilled in the art may appreciate that the present disclosure may be practiced in other concrete forms without changing the technical spirit or essential characteristics of the present disclosure. Therefore, it should be appreciated that the example embodiments as described above is not restrictive but illustrative in all respects.

What is claimed is:

1. A semiconductor memory device comprising:

a substrate including a cell area and a peripheral area around the cell area;

a cell area isolation film in the substrate and defining the cell area;

a bit-line structure in the cell area;

a peripheral gate structure in the peripheral area of the substrate, the peripheral gate structure including a peripheral gate conductive film;

a peripheral spacer on a sidewall of the peripheral gate structure;

an etch stop film on the peripheral spacer and spaced apart from the peripheral gate structure;

a first peripheral insulating film around the peripheral gate structure on the substrate; and a peripheral interlayer insulating film covering the peripheral gate structure, the first peripheral insulating film, and the peripheral spacer, the peripheral interlayer insulating film including a material different from a material of the first peripheral insulating film, wherein the etch stop film does not overlap the peripheral gate structure in a direction perpendicular to an upper surface of the substrate, wherein the peripheral spacer is between the etch stop film and the peripheral gate structure, wherein an upper surface of the peripheral spacer is in contact with the peripheral interlayer insulating film, wherein an uppermost portion of the peripheral gate structure is the peripheral gate conductive film, and wherein an upper surface of the peripheral gate structure is in contact with the peripheral interlayer insulating film.

2. The semiconductor memory device of claim 1, wherein a height between the upper surface of the substrate and an uppermost level of the etch stop film is equal to a height between the upper surface of the substrate and the upper surface of the peripheral spacer.

3. The semiconductor memory device of claim 1, wherein a height between the upper surface of the substrate and the upper surface of the peripheral gate structure is equal to a height between the upper surface of the substrate and the upper surface of the peripheral spacer.

4. The semiconductor memory device of claim 1, wherein a height between the upper surface of the substrate and the upper surface of the peripheral gate structure is equal to a height between the upper surface of the substrate and an uppermost level of the etch stop film.

5. The semiconductor memory device of claim 1, wherein the bit-line structure includes a cell conductive line, and a cell line capping film on the cell conductive line, and a thickness of the peripheral gate conductive film is greater than a thickness of the cell conductive line.

6. The semiconductor memory device of claim 1, wherein a width of the upper surface of the peripheral spacer in a first direction parallel to the upper surface of the substrate is smaller than a width of a bottom surface of the peripheral spacer in the first direction.

7. A semiconductor memory device comprising:

a substrate including a cell area and a peripheral area around the cell area;

a cell area isolation film in the substrate and defining the cell area;

a bit-line structure in the cell area, the bit-line structure including a cell conductive line and a cell line capping film on the cell conductive line;

a cell interlayer insulating film on the bit-line structure;

a peripheral gate structure in the peripheral area of the substrate, the peripheral gate structure including a peripheral gate conductive film and a peripheral capping film on the peripheral gate conductive film;

a peripheral spacer on a sidewall of the peripheral gate structure;

an etch stop film on the peripheral spacer and spaced apart from the peripheral gate structure;

a first peripheral insulating film on the substrate and around the peripheral gate structure; and a peripheral interlayer insulating film covering the peripheral gate structure, the first peripheral insulating film, and the peripheral spacer, the peripheral interlayer insulating film including a material different from a material of the first peripheral insulating film, wherein the etch stop film does not overlap the peripheral gate structure in a direction perpendicular to an upper surface of the substrate, wherein the peripheral spacer is between the etch stop film and the peripheral gate structure, wherein each of an upper surface of the peripheral spacer and an upper surface of the peripheral capping film is in contact with the peripheral interlayer insulating film, wherein the upper surface of the peripheral capping film is coplanar with an upper surface of the cell line capping film, and wherein a width of the cell line capping film is greater than a width of the peripheral capping film.

8. The semiconductor memory device of claim 7, wherein a thickness of the cell line capping film is greater than a thickness of the peripheral capping film.

9. The semiconductor memory device of claim 7, further comprising:

a first oxide film between the cell interlayer insulating film and the cell line capping film.

10. The semiconductor memory device of claim 7, further comprising:

a second etch stop film between the cell interlayer insulating film and the cell line capping film.

11. The semiconductor memory device of claim 7, further comprising:

a second oxide film between the peripheral capping film and the peripheral interlayer insulating film.

12. The semiconductor memory device of claim 7, wherein a thickness of the cell interlayer insulating film is greater than a thickness of the cell line capping film.

13. The semiconductor memory device of claim 7, wherein a width of the peripheral spacer decreases as the peripheral spacer extends toward the upper surface of the peripheral spacer.

14. The semiconductor memory device of claim 7, wherein each of the peripheral capping film and the peripheral interlayer insulating film includes silicon nitride, and the first peripheral insulating film includes a silicon oxide-based insulating material.

15. A semiconductor memory device comprising:

a substrate including a cell area and a peripheral area around the cell area;

a cell area isolation film in the substrate and defining the cell area;

a bit-line structure in the cell area of the substrate, the bit-line structure including a cell conductive line extending in one direction and a cell line capping film on the cell conductive line;

a cell gate electrode in the cell area of the substrate and intersecting the cell conductive line;

information storage in the cell area of the substrate;

a peripheral gate structure in the peripheral area of the substrate, the peripheral gate structure including a peripheral gate conductive film and a peripheral capping film on the peripheral gate conductive film;

a peripheral spacer on a sidewall of the peripheral gate structure;

an etch stop film on the peripheral spacer and spaced apart from the peripheral gate structure;

a first peripheral insulating film on the substrate and around the peripheral gate structure; and a peripheral interlayer insulating film covering the peripheral gate structure, the first peripheral insulating film, and the peripheral spacer, the peripheral interlayer insulating film including a material different from a material of the first peripheral insulating film, wherein the etch stop film does not overlap the peripheral gate structure in a direction perpendicular to an upper surface of the substrate, wherein the peripheral spacer is between the etch stop film and the peripheral gate structure, wherein each of an upper surface of the peripheral spacer and an upper surface of the peripheral gate structure is in contact with the peripheral interlayer insulating film, wherein the upper surface of the peripheral capping film is coplanar with an upper surface of the cell line camping film, and wherein a width of the cell line capping film is greater than a width of the peripheral capping film.

* * * * *